(12) United States Patent
Moriwaka

(10) Patent No.: US 7,972,943 B2
(45) Date of Patent: Jul. 5, 2011

(54) MANUFACTURING METHOD OF SEMICONDUCTOR DEVICE

(75) Inventor: Tomoaki Moriwaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 475 days.

(21) Appl. No.: 12/034,677

(22) Filed: Feb. 21, 2008

(65) Prior Publication Data
US 2008/0213984 A1    Sep. 4, 2008

(30) Foreign Application Priority Data
Mar. 2, 2007    (JP) ................. 2007-052230

(51) Int. Cl.
H01L 21/36    (2006.01)

(52) U.S. Cl. ........ 438/478; 438/487; 438/166; 257/627; 257/E21.134

(58) Field of Classification Search .................. 438/166, 438/478, 487; 257/E21.134, 627
See application file for complete search history.

(56) References Cited

U.S. PATENT DOCUMENTS

| | | | |
|---|---|---|---|
| 4,933,298 A | 6/1990 | Hasegawa | |
| 5,006,913 A * | 4/1991 | Sugahara et al. | ............... 257/67 |
| 5,306,651 A | 4/1994 | Masumo et al. | |
| 5,313,076 A | 5/1994 | Yamazaki et al. | |
| 5,403,772 A | 4/1995 | Zhang et al. | |
| 5,543,352 A | 8/1996 | Ohtani et al. | |
| 5,574,293 A | 11/1996 | Arai et al. | |
| 5,627,084 A | 5/1997 | Yamazaki et al. | |
| 5,637,515 A | 6/1997 | Takemura | |
| 5,643,826 A | 7/1997 | Ohtani et al. | |
| 5,663,077 A | 9/1997 | Adachi et al. | |
| 5,670,793 A | 9/1997 | Miura et al. | |
| 5,681,759 A | 10/1997 | Zhang | |
| 5,753,542 A | 5/1998 | Yamazaki et al. | |
| 5,837,569 A * | 11/1998 | Makita et al. | ............... 438/166 |
| 5,851,860 A | 12/1998 | Makita et al. | |
| 5,858,819 A | 1/1999 | Miyasaka | |

(Continued)

FOREIGN PATENT DOCUMENTS

EP    0 651 431    5/1995

(Continued)

OTHER PUBLICATIONS

Ohashi et al.,"TFTp5-4:Crystalline Orientation of Large-Grain Poly-Si Thin Films Observed by Raman Spectroscopy", AM-LCD '04 : International Workshop Active-Matrix Liquid-Cryatal Displays, pp. 269-272, Aug. 25, 2004.

(Continued)

*Primary Examiner* — N Drew Richards
*Assistant Examiner* — Ankush K Singal
(74) *Attorney, Agent, or Firm* — Nixon Peabody LLP; Jeffrey L. Costellia

(57) ABSTRACT

A cap film is formed over semiconductor films formed over an insulating substrate; the semiconductor films are irradiated with a laser beam which is capable of completely melting the semiconductor film in a film-thickness direction to completely melt the semiconductor film. By controlling the laser beam, a crystalline semiconductor films are formed over the substrate, in each of which orientations of crystal planes are controlled. In addition, an n-channel thin film transistor is formed using a crystalline region in which crystal planes are oriented along {001} and a p-channel thin film transistor is formed using a crystalline region in which crystal planes are oriented along {211} or {101}.

25 Claims, 35 Drawing Sheets

U.S. PATENT DOCUMENTS

| | | | |
|---|---|---|---|
| 5,891,764 A | 4/1999 | Ishihara et al. | |
| 5,899,547 A | 5/1999 | Yamazaki et al. | |
| 5,899,709 A | 5/1999 | Yamazaki et al. | |
| 5,959,314 A * | 9/1999 | Voutsas | 257/65 |
| 5,962,869 A | 10/1999 | Yamazaki et al. | |
| 5,994,172 A | 11/1999 | Ohtani et al. | |
| 6,015,720 A | 1/2000 | Minegishi et al. | |
| 6,071,764 A | 6/2000 | Zhang et al. | |
| 6,168,980 B1 | 1/2001 | Yamazaki et al. | |
| 6,172,380 B1 * | 1/2001 | Noguchi et al. | 257/64 |
| 6,221,701 B1 | 4/2001 | Yamazaki | |
| 6,239,451 B1 * | 5/2001 | Fonash et al. | 257/53 |
| 6,255,148 B1 | 7/2001 | Hara et al. | |
| 6,261,856 B1 * | 7/2001 | Shinohara et al. | 438/30 |
| 6,322,625 B2 | 11/2001 | Im | |
| 6,358,766 B1 | 3/2002 | Kasahara | |
| 6,423,586 B1 | 7/2002 | Yamazaki et al. | |
| 6,489,222 B2 | 12/2002 | Yoshimoto | |
| 6,535,535 B1 | 3/2003 | Yamazaki et al. | |
| 6,545,320 B2 | 4/2003 | Ohtani et al. | |
| 6,548,370 B1 | 4/2003 | Kasahara et al. | |
| 6,602,744 B1 | 8/2003 | Ino et al. | |
| 6,602,765 B2 * | 8/2003 | Jiroku et al. | 438/487 |
| 6,703,265 B2 * | 3/2004 | Asami et al. | 438/150 |
| 6,703,267 B2 | 3/2004 | Tanabe et al. | |
| 6,787,807 B2 | 9/2004 | Yamazaki et al. | |
| 6,797,550 B2 | 9/2004 | Kokubo et al. | |
| 6,861,299 B2 | 3/2005 | Horikoshi et al. | |
| 6,875,674 B2 * | 4/2005 | Asami et al. | 438/482 |
| 6,881,615 B2 | 4/2005 | Yamazaki et al. | |
| 6,908,797 B2 * | 6/2005 | Takano | 438/149 |
| 6,919,235 B1 | 7/2005 | Yamazaki et al. | |
| 6,953,714 B2 | 10/2005 | Kimura et al. | |
| 7,022,183 B2 | 4/2006 | Takeda et al. | |
| 7,045,444 B2 | 5/2006 | Yamazaki et al. | |
| 7,052,944 B2 | 5/2006 | Tanabe | |
| 7,078,321 B2 | 7/2006 | Yoshimoto | |
| 7,112,517 B2 | 9/2006 | Tanaka et al. | |
| 7,113,527 B2 | 9/2006 | Tanaka | |
| 7,125,761 B2 | 10/2006 | Tanaka | |
| 7,132,375 B2 * | 11/2006 | Yamazaki | 438/795 |
| 7,217,605 B2 | 5/2007 | Kawasaki et al. | |
| 7,220,627 B2 | 5/2007 | Yamazaki et al. | |
| 7,306,981 B2 | 12/2007 | Kuwabara et al. | |
| 7,319,055 B2 | 1/2008 | Kokubo et al. | |
| 7,323,368 B2 | 1/2008 | Takayama et al. | |
| 7,709,309 B2 * | 5/2010 | Moriwaka | 438/166 |
| 7,724,319 B2 * | 5/2010 | Abbott et al. | 349/58 |
| 2003/0000455 A1 * | 1/2003 | Voutsas | 117/47 |
| 2003/0085720 A1 | 5/2003 | Yamazaki et al. | |
| 2003/0096489 A1 * | 5/2003 | Im et al. | 438/487 |
| 2003/0100169 A1 | 5/2003 | Tanaka et al. | |
| 2003/0166315 A1 * | 9/2003 | Tanada et al. | 438/166 |
| 2004/0009632 A1 | 1/2004 | Tanabe et al. | |
| 2004/0038465 A1 | 2/2004 | Shimomura et al. | |
| 2004/0053452 A1 * | 3/2004 | Hasegawa et al. | 438/151 |
| 2004/0067624 A1 * | 4/2004 | Voutsas | 438/478 |
| 2004/0069751 A1 | 4/2004 | Yamazaki et al. | |
| 2004/0077134 A1 | 4/2004 | Takayama et al. | |
| 2004/0119955 A1 | 6/2004 | Tanaka | |
| 2004/0136416 A1 | 7/2004 | Tanaka | |
| 2004/0169023 A1 | 9/2004 | Tanaka | |
| 2004/0195222 A1 | 10/2004 | Tanaka et al. | |
| 2004/0209410 A1 | 10/2004 | Tanaka | |
| 2004/0217433 A1 | 11/2004 | Yeo et al. | |
| 2004/0253838 A1 | 12/2004 | Yamazaki et al. | |
| 2005/0036190 A1 | 2/2005 | Tanaka | |
| 2005/0037552 A1 | 2/2005 | Yamazaki et al. | |
| 2005/0037553 A1 | 2/2005 | Tanaka | |
| 2005/0115930 A1 * | 6/2005 | Tanaka et al. | 219/121.6 |
| 2005/0139786 A1 | 6/2005 | Tanaka et al. | |
| 2005/0202602 A1 | 9/2005 | Asami et al. | |
| 2006/0051943 A1 * | 3/2006 | Inoue et al. | 438/487 |
| 2006/0118036 A1 | 6/2006 | Takeda et al. | |
| 2006/0138527 A1 * | 6/2006 | Bhattacharyya | 257/316 |
| 2006/0157688 A1 * | 7/2006 | Bhattacharyya | 257/19 |
| 2006/0246693 A1 | 11/2006 | Tanaka et al. | |
| 2006/0270128 A1 | 11/2006 | Nakamura et al. | |
| 2007/0020826 A1 * | 1/2007 | Yamazaki | 438/151 |
| 2007/0070319 A1 | 3/2007 | Nakamura et al. | |
| 2007/0087488 A1 * | 4/2007 | Moriwaka | 438/149 |
| 2007/0141815 A1 | 6/2007 | Jyumonji et al. | |
| 2007/0148936 A1 | 6/2007 | Ohnuma | |
| 2007/0222038 A1 | 9/2007 | Moriwaka | |
| 2007/0264836 A1 | 11/2007 | Chen et al. | |
| 2008/0090344 A1 | 4/2008 | Kuwabara et al. | |
| 2008/0124850 A1 | 5/2008 | Takayama et al. | |
| 2008/0138944 A1 * | 6/2008 | Maekawa et al. | 438/166 |
| 2008/0171410 A1 | 7/2008 | Moriwaka et al. | |
| 2008/0210945 A1 | 9/2008 | Miyairi | |
| 2008/0233689 A1 | 9/2008 | Moriwaka et al. | |
| 2008/0318398 A1 | 12/2008 | Moriwaka et al. | |

FOREIGN PATENT DOCUMENTS

| | | |
|---|---|---|
| JP | 05-299339 | 11/1993 |
| JP | 07-135174 | 5/1995 |
| JP | 11-145056 | 5/1999 |
| JP | 2002-246606 | 8/2002 |
| JP | 2003-168646 | 5/2003 |
| JP | 2003-197521 | 7/2003 |
| JP | 2004-119919 | 4/2004 |
| JP | 2004-179195 | 6/2004 |
| JP | 2004-327677 | 11/2004 |
| JP | 2005-191546 | 7/2005 |
| JP | 2006-310445 | 11/2006 |

OTHER PUBLICATIONS

Soya et al., "Crystallization of Amorphous Si Films Using Indirect Heating by High-Power CW-YAG LASER-Zone Melting for Film (III)", Extended Abstracts from the 50$^{th}$ Meeting of the Japan Society of Applied Physics and Related Societies, No. 2, pp. 925, Mar. 27, 2003.

N. Sotani et al., "Crystallization of Amorphous Si Films Using Indirect Heating by High Power CW-YAG LASER-Zone Melting for Film (III)" Extended Abstracts (The 50$^{th}$ Spring Meeting, 2003) The Japan Society of Applied Physics and Related Societies No. 2, 27a-ZW-11, Mar. 27, 2003, p. 925, and Translation.

* cited by examiner

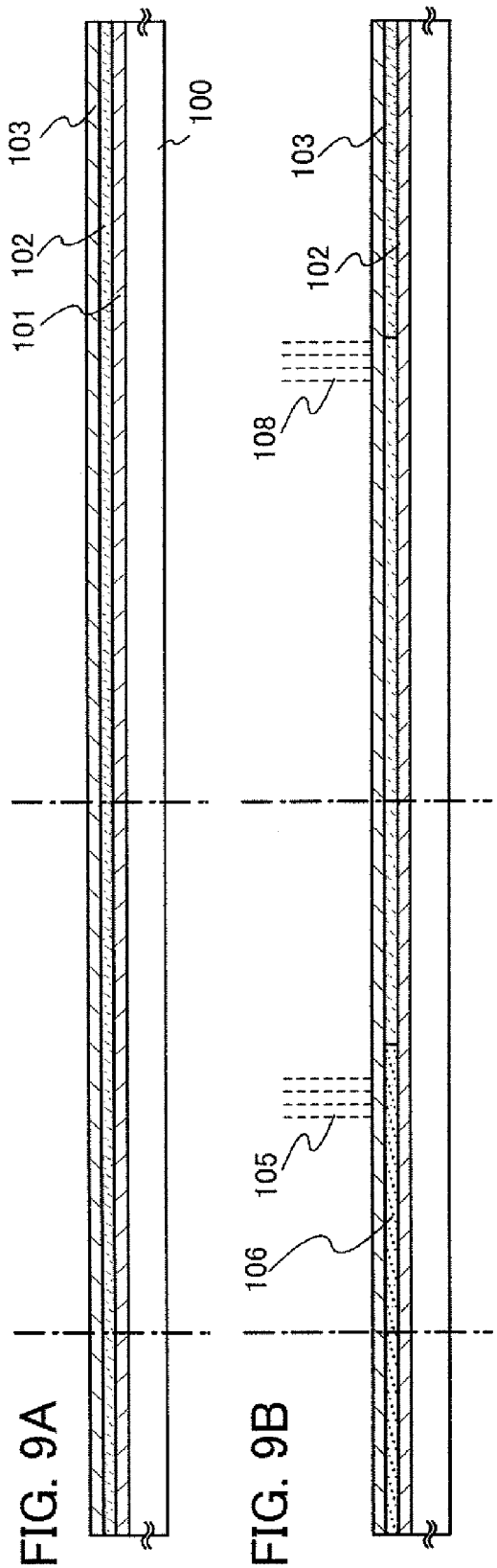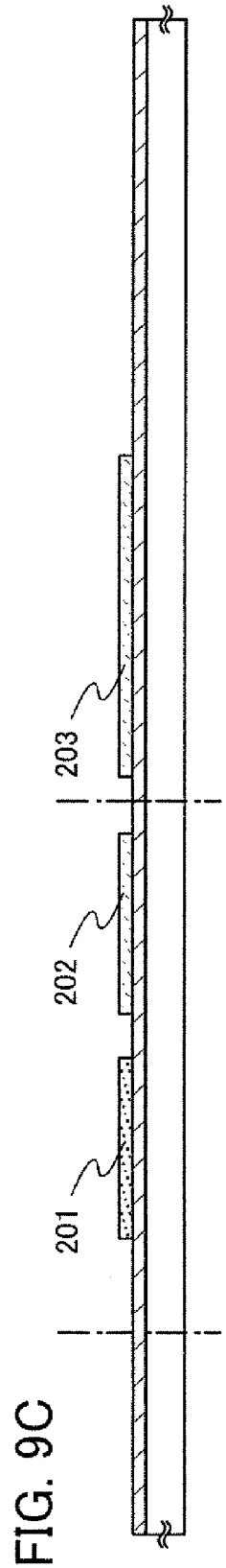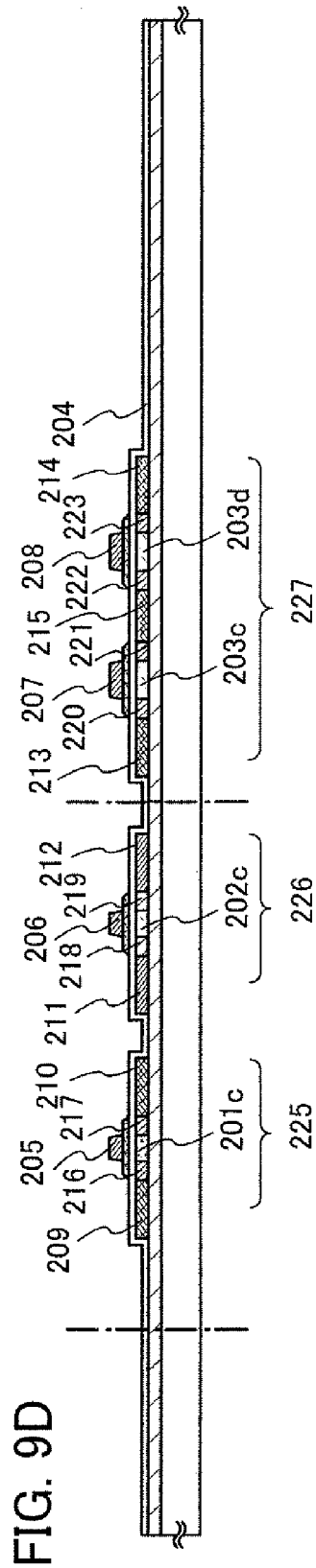

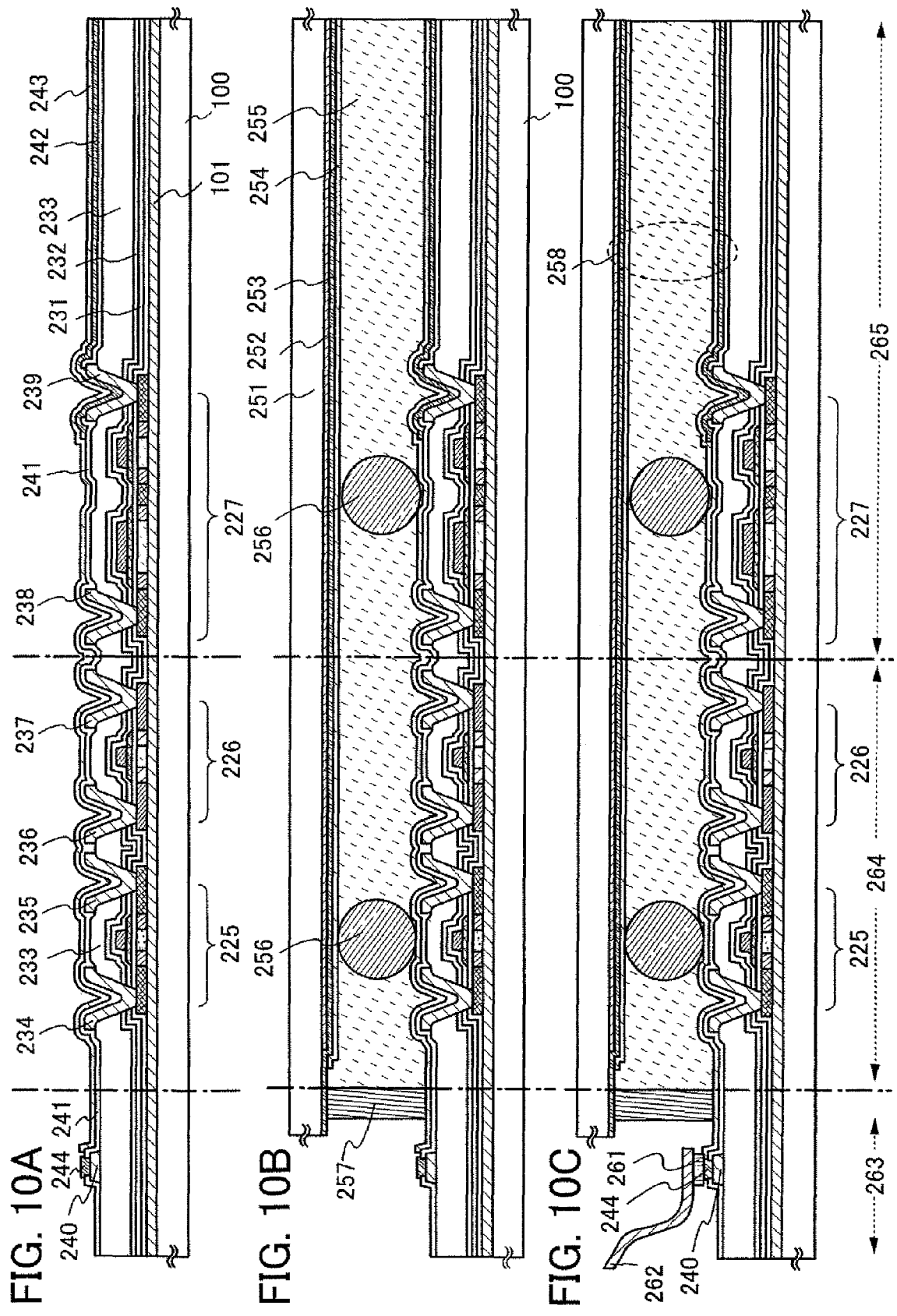

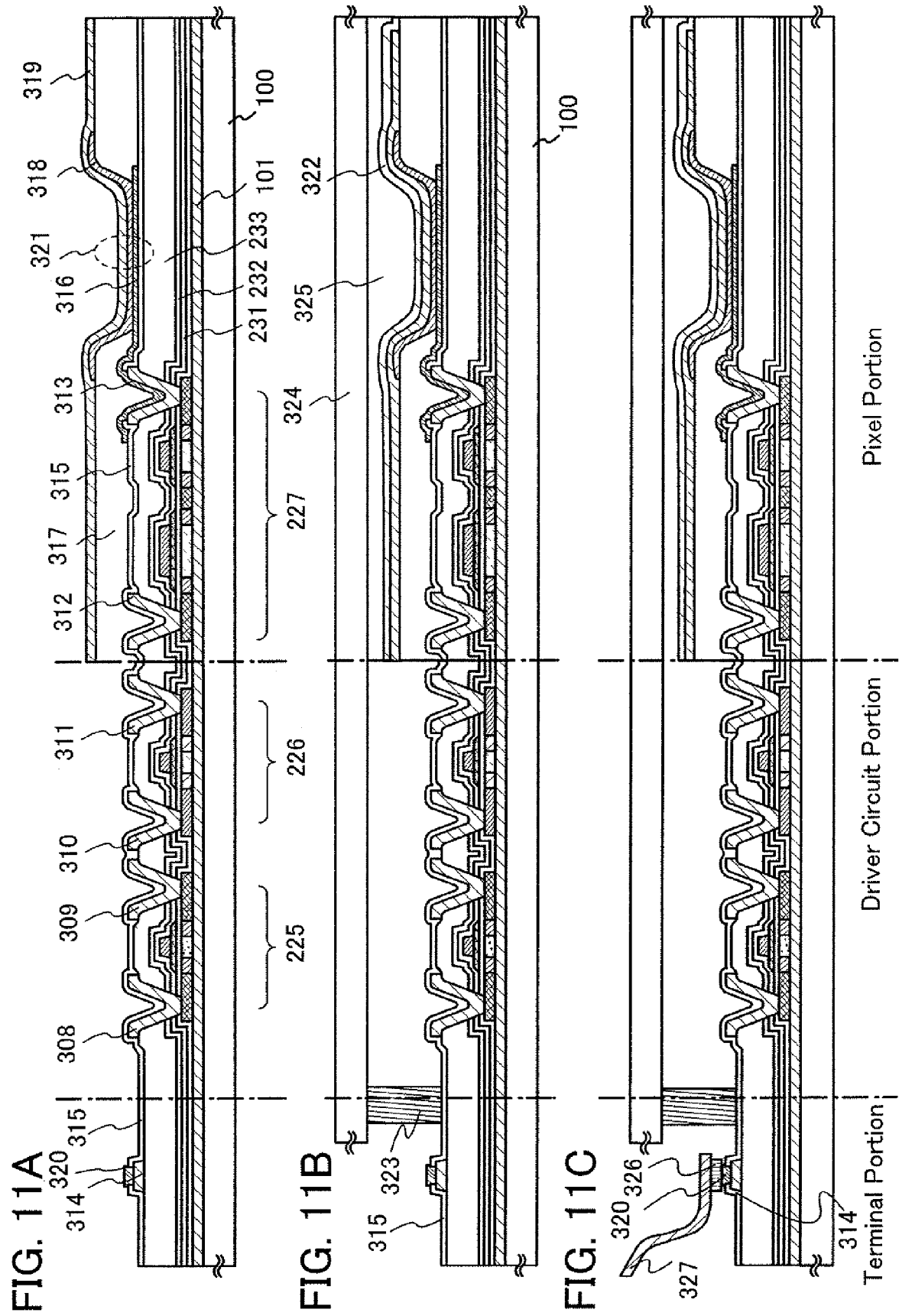

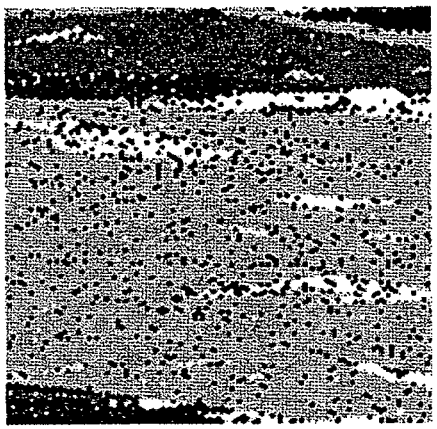

FIG. 23A
Observation Plane A

FIG. 23B
Observation Plane B

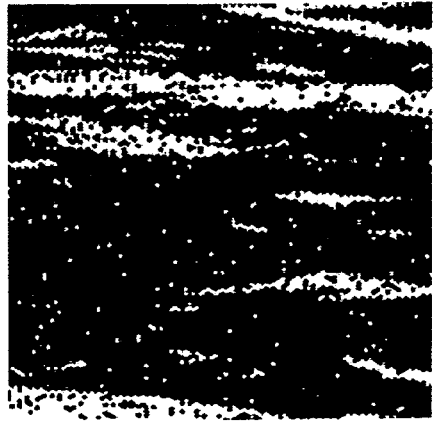

FIG. 23C
Observation Plane C

FIG. 23D
Observation Plane A
Color Coded Map Type: Crystal Direction

| Direction | Min | Max | Total Fraction | Partition Fraction |
|---|---|---|---|---|
| <0 0 1>‖[0 0 1] | 0° | 10° | 0.725 | 0.798 |

Silicon

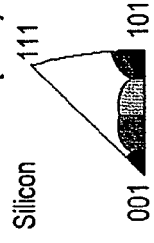

FIG. 23E
Observation Plane B
Color Coded Map Type: Crystal Direction

| Direction | Min | Max | Total Fraction | Partition Fraction |
|---|---|---|---|---|
| <0 0 1>‖[0 1 0] | 0° | 10° | 0.015 | 0.016 |
| <3 0 1>‖[0 1 0] | 0° | 10° | 0.126 | 0.138 |
| <2 0 1>‖[0 1 0] | 0° | 10° | 0.630 | 0.693 |
| <1 0 1>‖[0 1 0] | 0° | 10° | 0.006 | 0.007 |

Silicon

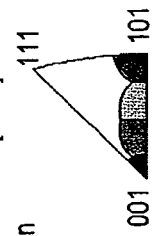

FIG. 23F
Observation Plane C
Color Coded Map Type: Crystal Direction

| Direction | Min | Max | Total Fraction | Partition Fraction |
|---|---|---|---|---|
| <0 0 1>‖[1 0 0] | 0° | 10° | 0.017 | 0.019 |
| <3 0 1>‖[1 0 0] | 0° | 10° | 0.130 | 0.143 |
| <2 0 1>‖[1 0 0] | 0° | 10° | 0.624 | 0.686 |
| <1 0 1>‖[1 0 0] | 0° | 10° | 0.048 | 0.053 |

Silicon

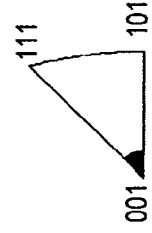

FIG. 24A
Observation Plane A

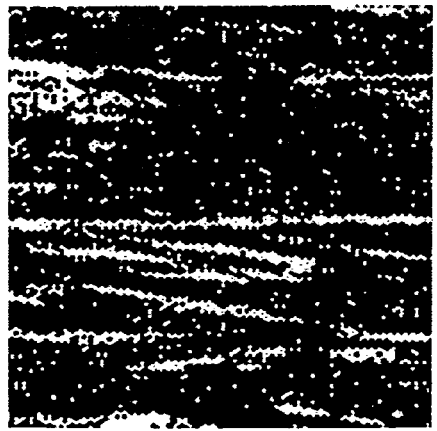

FIG. 24B
Observation Plane B

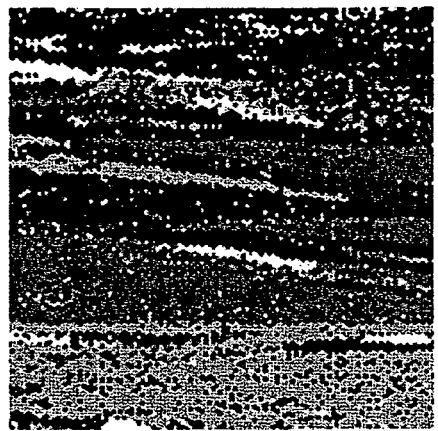

FIG. 24C
Observation Plane C

FIG. 24D
Observation Plane A
Color Coded Map Type: Crystal Direction

| Direction | Min | Max | Total Fraction | Partition Fraction |
|---|---|---|---|---|
| ■ <0 0 1>‖[0 0 1] | 0° | 10° | 0.651 | 0.794 |

Silicon

FIG. 24E
Observation Plane B
Color Coded Map Type: Crystal Direction

| Direction | Min | Max | Total Fraction | Partition Fraction |
|---|---|---|---|---|
| ■ <0 0 1>‖[0 1 0] | 0° | 10° | 0.233 | 0.284 |
| <3 0 1>‖[0 1 0] | 0° | 10° | 0.182 | 0.222 |
| <2 0 1>‖[0 1 0] | 0° | 10° | 0.217 | 0.264 |
| ■ <1 0 1>‖[0 1 0] | 0° | 10° | 0.053 | 0.065 |

Silicon

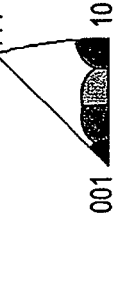

FIG. 24F
Observation Plane C
Color Coded Map Type: Crystal Direction

| Direction | Min | Max | Total Fraction | Partition Fraction |
|---|---|---|---|---|
| ■ <0 0 1>‖[1 0 0] | 0° | 10° | 0.240 | 0.292 |
| <3 0 1>‖[1 0 0] | 0° | 10° | 0.200 | 0.244 |
| <2 0 1>‖[1 0 0] | 0° | 10° | 0.222 | 0.270 |
| ■ <1 0 1>‖[1 0 0] | 0° | 10° | 0.084 | 0.102 |

Silicon

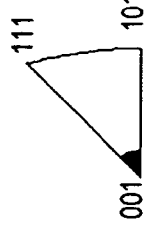

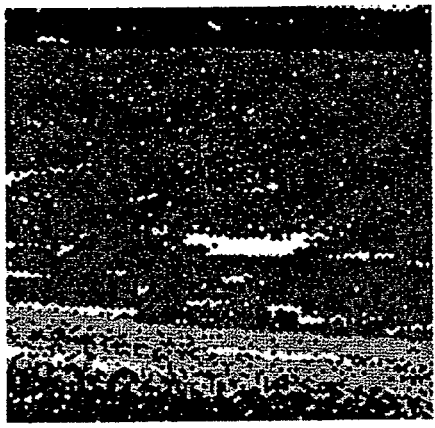
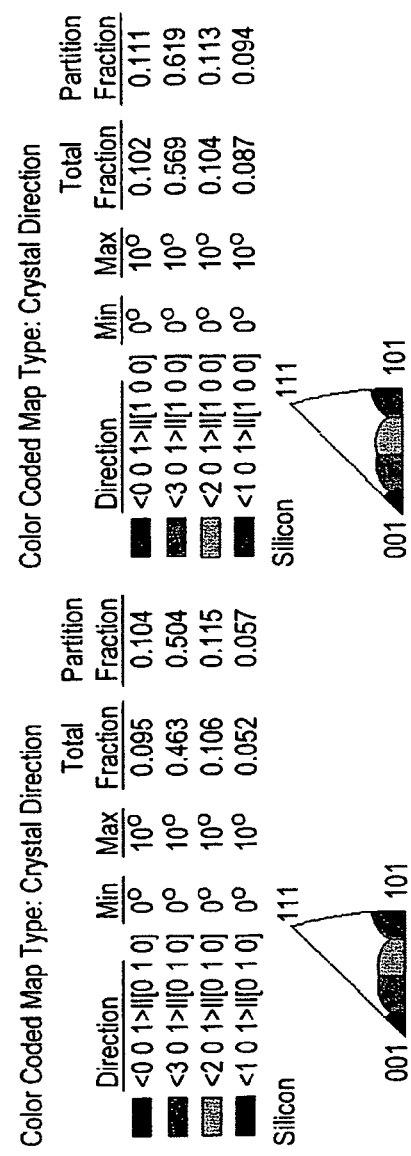
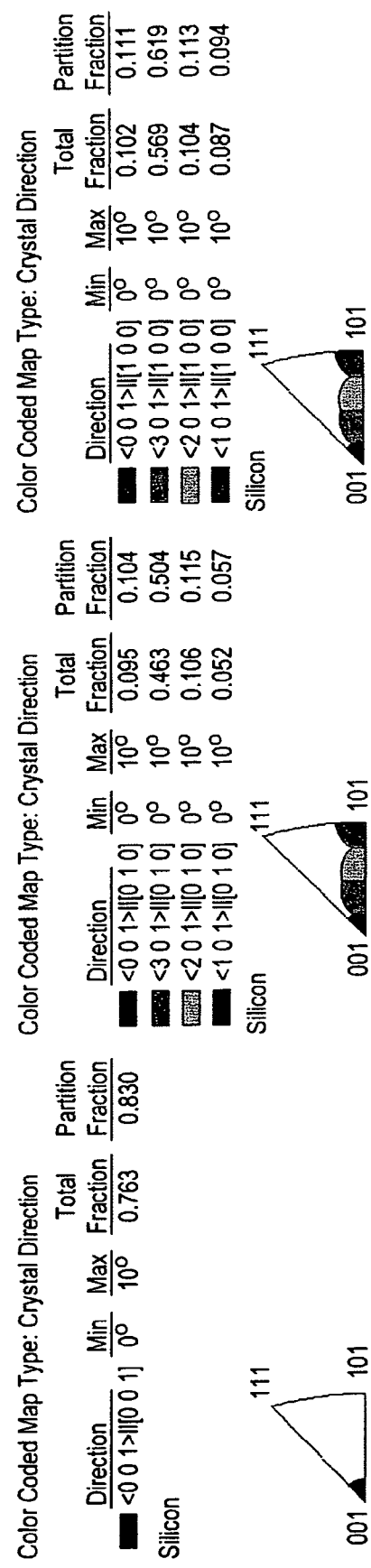

FIG. 26A
Observation Plane A

FIG. 26B
Observation Plane B

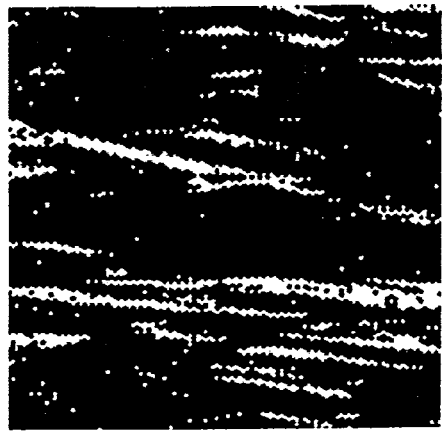

FIG. 26C
Observation Plane C

FIG. 26D
Observation Plane A
Color Coded Map Type: Crystal Direction

| Direction | Min | Max | Total Fraction | Partition Fraction |
|---|---|---|---|---|
| ■ <0 0 1>‖[0 0 1] | 0° | 10° | 0.830 | 0.866 |

Silicon

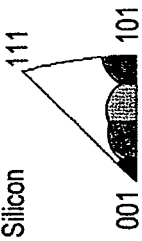

FIG. 26E
Observation Plane B
Color Coded Map Type: Crystal Direction

| Direction | Min | Max | Total Fraction | Partition Fraction |
|---|---|---|---|---|
| ■ <0 0 1>‖[0 1 0] | 0° | 10° | 0.000 | 0.000 |
| <3 0 1>‖[0 1 0] | 0° | 10° | 0.651 | 0.680 |
| <2 0 1>‖[0 1 0] | 0° | 10° | 0.195 | 0.204 |
| ■ <1 0 1>‖[0 1 0] | 0° | 10° | 0.005 | 0.005 |

Silicon

FIG. 26F
Observation Plane C
Color Coded Map Type: Crystal Direction

| Direction | Min | Max | Total Fraction | Partition Fraction |
|---|---|---|---|---|
| ■ <0 0 1>‖[1 0 0] | 0° | 10° | 0.002 | 0.002 |
| <3 0 1>‖[1 0 0] | 0° | 10° | 0.709 | 0.741 |
| <2 0 1>‖[1 0 0] | 0° | 10° | 0.212 | 0.221 |
| ■ <1 0 1>‖[1 0 0] | 0° | 10° | 0.000 | 0.000 |

Silicon

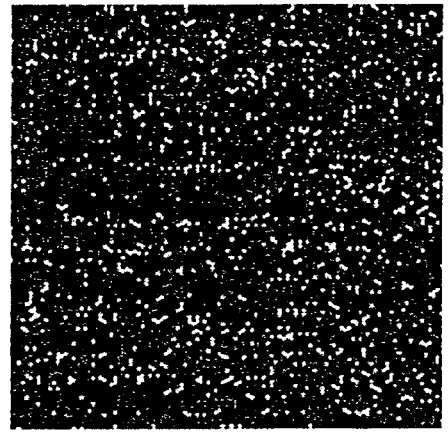

FIG. 27A
Observation Plane A

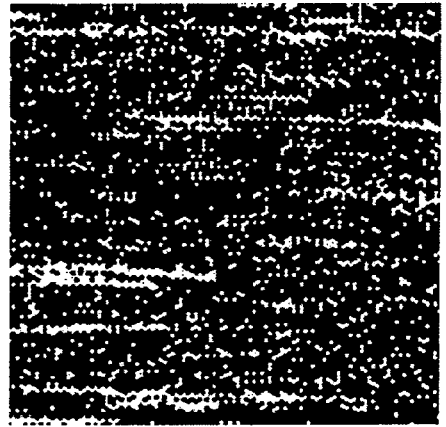

FIG. 27B
Observation Plane B

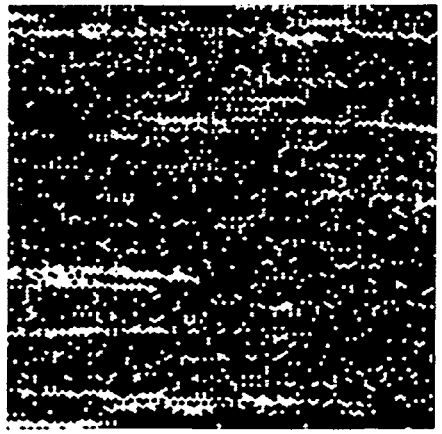

FIG. 27C
Observation Plane C

FIG. 27D
Observation Plane A
Color Coded Map Type: Crystal Direction

| Direction | Min | Max | Total Fraction | Partition Fraction |
|---|---|---|---|---|
| ▮ <2 1 1>‖[0 0 1] | 0° | 10° | 0.473 | 0.733 |

Silicon

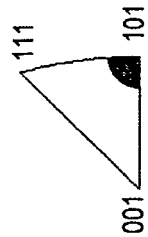

FIG. 27E
Observation Plane B
Color Coded Map Type: Crystal Direction

| Direction | Min | Max | Total Fraction | Partition Fraction |
|---|---|---|---|---|
| ▮ <1 1 1>‖[0 1 0] | 0° | 10° | 0.454 | 0.704 |

Silicon

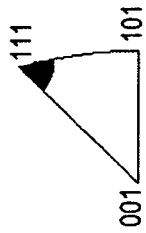

FIG. 27F
Observation Plane C
Color Coded Map Type: Crystal Direction

| Direction | Min | Max | Total Fraction | Partition Fraction |
|---|---|---|---|---|
| ▮ <1 0 1>‖[1 0 0] | 0° | 10° | 0.547 | 0.847 |

Silicon

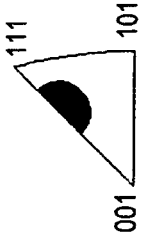

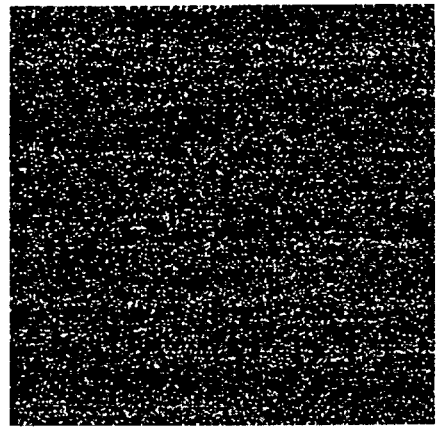

FIG. 28A
Observation Plane A

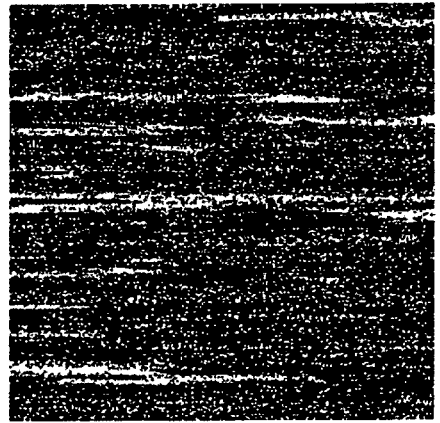

FIG. 28B
Observation Plane B

FIG. 28C
Observation Plane C

FIG. 28D
Observation Plane A
Color Coded Map Type: Crystal Direction

| Direction | Min | Max | Total Fraction | Partition Fraction |
|---|---|---|---|---|
| <2 1 1>‖[0 0 1] | 0° | 10° | 0.494 | 0.740 |

Silicon

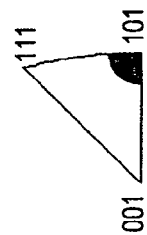

FIG. 28E
Observation Plane B
Color Coded Map Type: Crystal Direction

| Direction | Min | Max | Total Fraction | Partition Fraction |
|---|---|---|---|---|
| <1 1 1>‖[0 1 0] | 0° | 10° | 0.482 | 0.722 |

Silicon

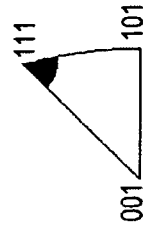

FIG. 28F
Observation Plane C
Color Coded Map Type: Crystal Direction

| Direction | Min | Max | Total Fraction | Partition Fraction |
|---|---|---|---|---|
| <1 0 1>‖[1 0 0] | 0° | 10° | 0.566 | 0.847 |

Silicon

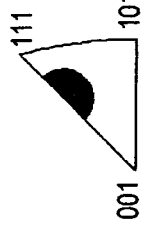

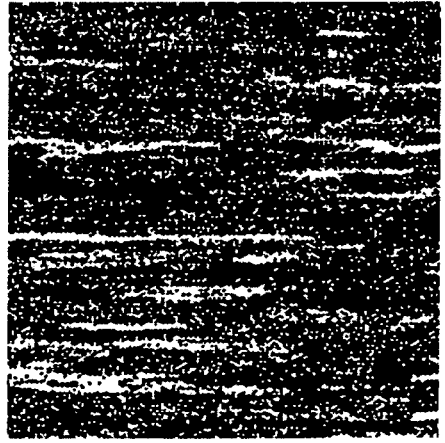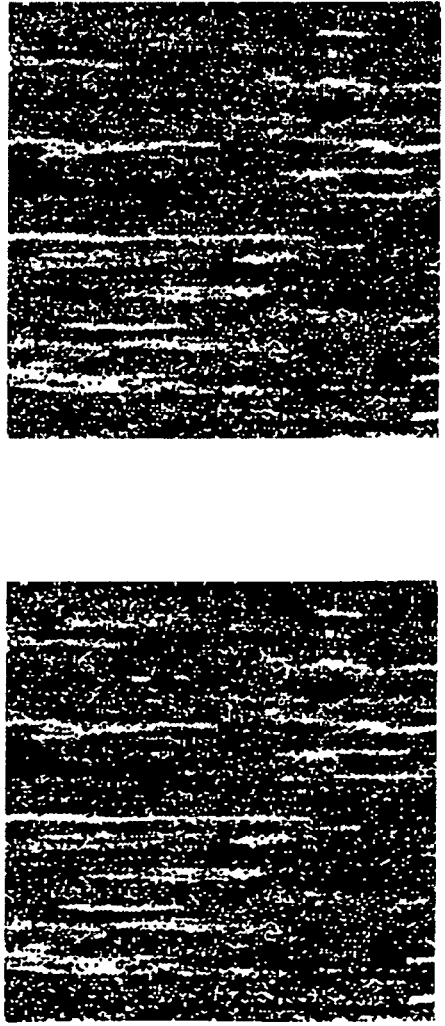

FIG. 29A Observation Plane A

FIG. 29B Observation Plane B

FIG. 29C Observation Plane C

FIG. 29D Observation Plane A
Color Coded Map Type: Crystal Direction

| Direction | Min | Max | Total Fraction | Partition Fraction |
|---|---|---|---|---|
| <2 1 1>∥[0 0 1] | 0° | 10° | 0.420 | 0.671 |

Silicon

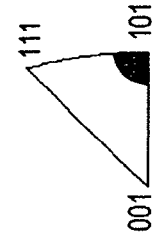

FIG. 29E Observation Plane B
Color Coded Map Type: Crystal Direction

| Direction | Min | Max | Total Fraction | Partition Fraction |
|---|---|---|---|---|
| <1 1 1>∥[0 1 0] | 0° | 10° | 0.411 | 0.656 |

Silicon

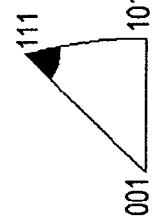

FIG. 29F Observation Plane C
Color Coded Map Type: Crystal Direction

| Direction | Min | Max | Total Fraction | Partition Fraction |
|---|---|---|---|---|
| <1 0 1>∥[1 0 0] | 0° | 10° | 0.519 | 0.828 |

Silicon

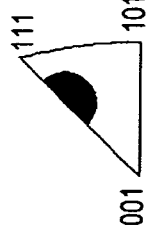

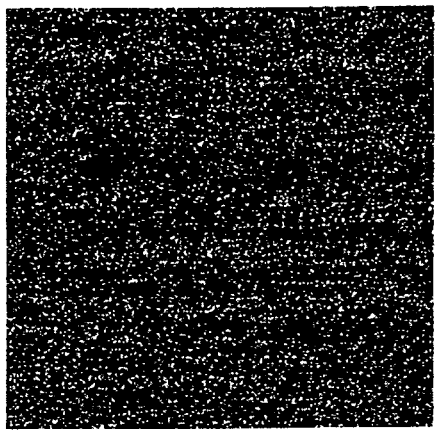

FIG. 30A Observation Plane A

FIG. 30B Observation Plane B

FIG. 30C Observation Plane C

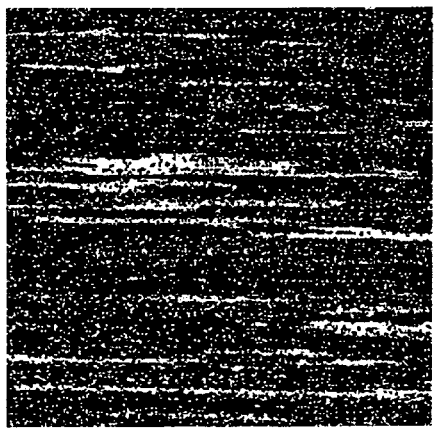

FIG. 30D Observation Plane A
Color Coded Map Type: Crystal Direction

| Direction | Min | Max | Total Fraction | Partition Fraction |
|---|---|---|---|---|
| <2 1 1>||[0 0 1] | 0° | 10° | 0.486 | 0.723 |

Silicon

FIG. 30E Observation Plane B
Color Coded Map Type: Crystal Direction

| Direction | Min | Max | Total Fraction | Partition Fraction |
|---|---|---|---|---|
| <1 1 1>||[0 1 0] | 0° | 10° | 0.475 | 0.707 |

Silicon

FIG. 30F Observation Plane C
Color Coded Map Type: Crystal Direction

| Direction | Min | Max | Total Fraction | Partition Fraction |
|---|---|---|---|---|
| <1 0 1>||[1 0 0] | 0° | 10° | 0.578 | 0.860 |

Silicon

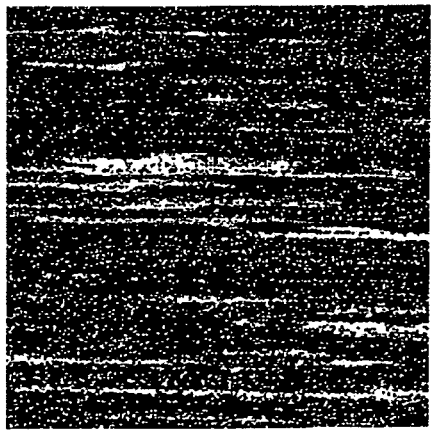

FIG. 31A Observation Plane A

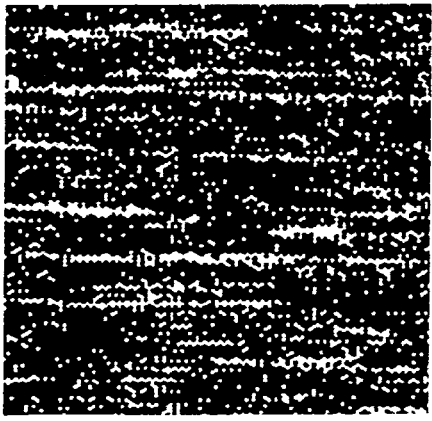

FIG. 31C Observation Plane C

FIG. 31B Observation Plane B

FIG. 31D Observation Plane A
Color Coded Map Type: Crystal Direction

| Direction | Min | Max | Total Fraction | Partition Fraction |
|---|---|---|---|---|
| <2 1 1>\|\|[0 0 1] | 0° | 10° | 0.487 | 0.706 |

Silicon

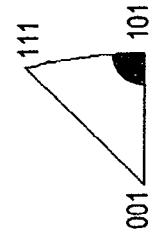

FIG. 31E Observation Plane B
Color Coded Map Type: Crystal Direction

| Direction | Min | Max | Total Fraction | Partition Fraction |
|---|---|---|---|---|
| <1 1 1>\|\|[0 1 0] | 0° | 10° | 0.470 | 0.681 |

Silicon

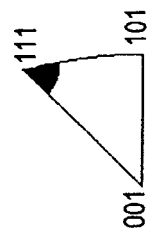

FIG. 31F Observation Plane C
Color Coded Map Type: Crystal Direction

| Direction | Min | Max | Total Fraction | Partition Fraction |
|---|---|---|---|---|
| <1 0 1>\|\|[1 0 0] | 0° | 10° | 0.596 | 0.864 |

Silicon

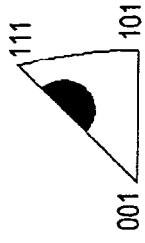

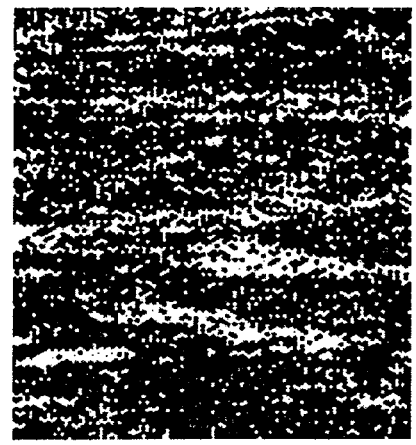
FIG. 32A
Observation Plane A
FIG. 32B
Observation Plane B
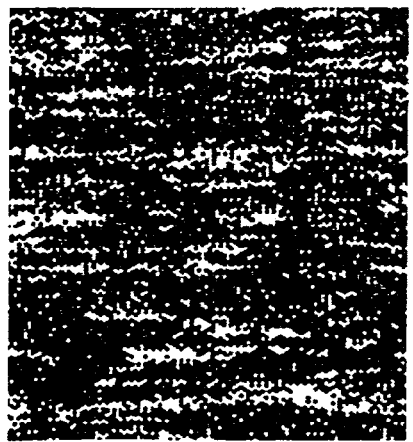
FIG. 32C
Observation Plane C
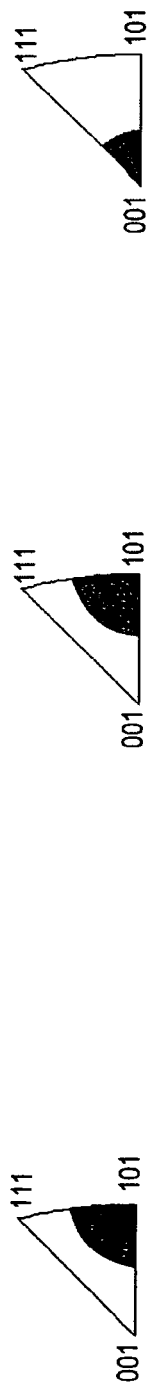

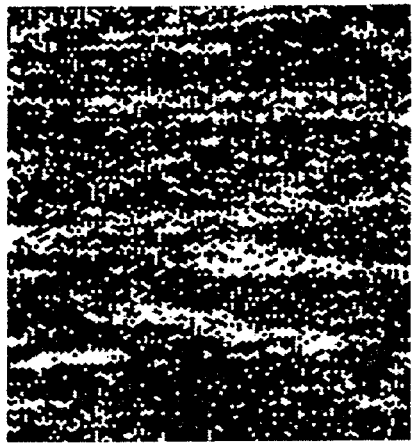

FIG. 33A
Observation Plane A

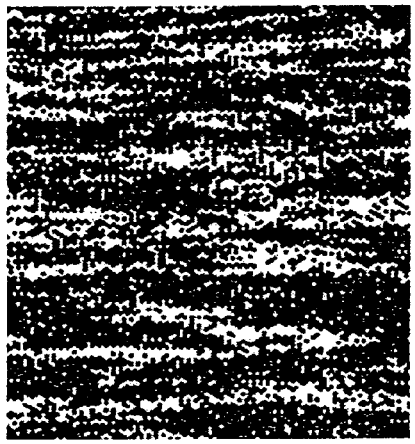

FIG. 33B
Observation Plane B

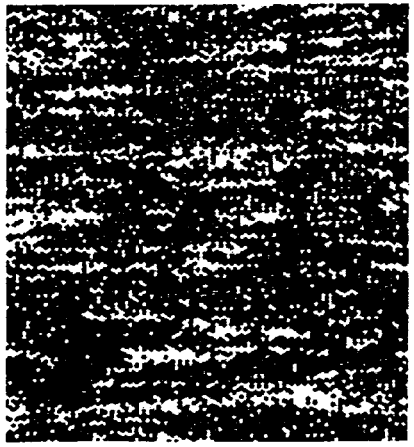

FIG. 33C
Observation Plane C

FIG. 33D
Observation Plane A
Color Coded Map Type: Crystal Direction

| Direction | Min | Max | Total Fraction | Partition Fraction |
|---|---|---|---|---|
| <1 0 1>‖[0 0 1] | 0° | 20° | 0.499 | 0.690 |

Silicon

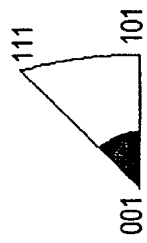

FIG. 33E
Observation Plane B
Color Coded Map Type: Crystal Direction

| Direction | Min | Max | Total Fraction | Partition Fraction |
|---|---|---|---|---|
| <1 0 1>‖[0 1 0] | 0° | 20° | 0.417 | 0.577 |

Silicon

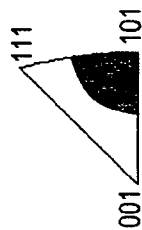

FIG. 33F
Observation Plane C
Color Coded Map Type: Crystal Direction

| Direction | Min | Max | Total Fraction | Partition Fraction |
|---|---|---|---|---|
| <0 0 1>‖[1 0 0] | 0° | 20° | 0.481 | 0.665 |

Silicon

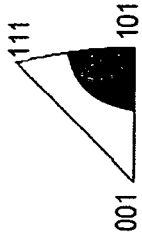

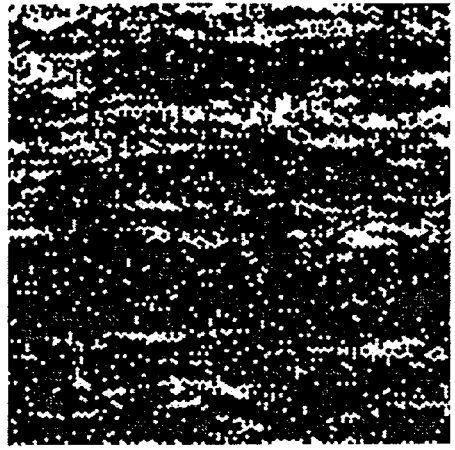

FIG. 34A
Observation Plane A

FIG. 34B
Observation Plane B

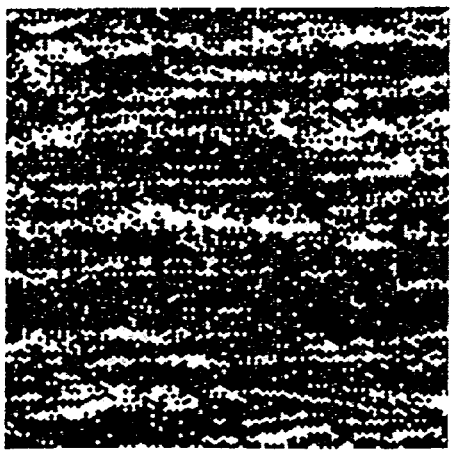

FIG. 34C
Observation Plane C

FIG. 34D
Observation Plane A
Color Coded Map Type: Crystal Direction

| Direction | Min | Max | Total Fraction | Partition Fraction |
|---|---|---|---|---|
| <1 0 1>‖[0 0 1] | 0° | 20° | 0.485 | 0.648 |

Silicon

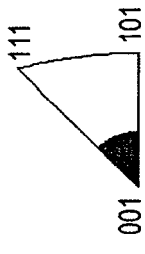

FIG. 34E
Observation Plane B
Color Coded Map Type: Crystal Direction

| Direction | Min | Max | Total Fraction | Partition Fraction |
|---|---|---|---|---|
| <1 0 1>‖[0 1 0] | 0° | 20° | 0.471 | 0.629 |

Silicon

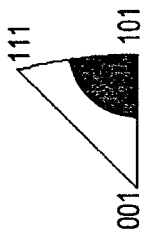

FIG. 34F
Observation Plane C
Color Coded Map Type: Crystal Direction

| Direction | Min | Max | Total Fraction | Partition Fraction |
|---|---|---|---|---|
| <0 0 1>‖[1 0 0] | 0° | 20° | 0.546 | 0.730 |

Silicon

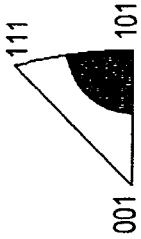

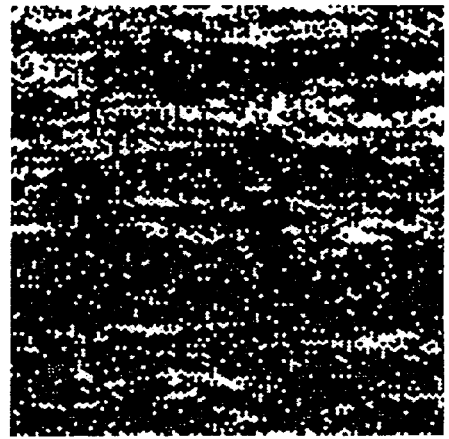

FIG. 35A
Observation Plane A

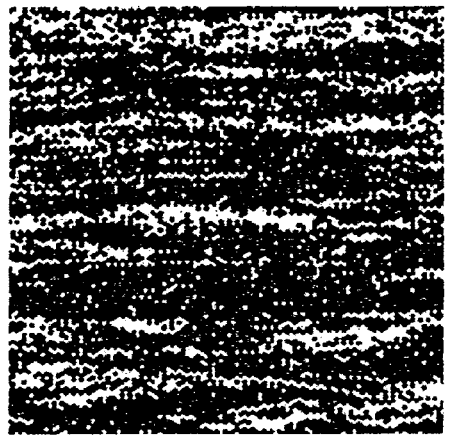

FIG. 35B
Observation Plane B

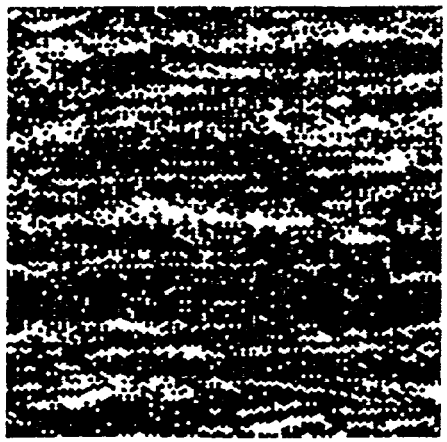

FIG. 35C
Observation Plane C

FIG. 35D
Observation Plane A
Color Coded Map Type: Crystal Direction

| Direction | Min | Max | Total Fraction | Partition Fraction |
|---|---|---|---|---|
| <1 0 1>∥[0 0 1] | 0° | 20° | 0.579 | 0.697 |

Silicon

FIG. 35E
Observation Plane B
Color Coded Map Type: Crystal Direction

| Direction | Min | Max | Total Fraction | Partition Fraction |
|---|---|---|---|---|
| <1 0 1>∥[0 1 0] | 0° | 20° | 0.555 | 0.668 |

Silicon

FIG. 35F
Observation Plane C
Color Coded Map Type: Crystal Direction

| Direction | Min | Max | Total Fraction | Partition Fraction |
|---|---|---|---|---|
| <0 0 1>∥[1 0 0] | 0° | 20° | 0.655 | 0.788 |

Silicon

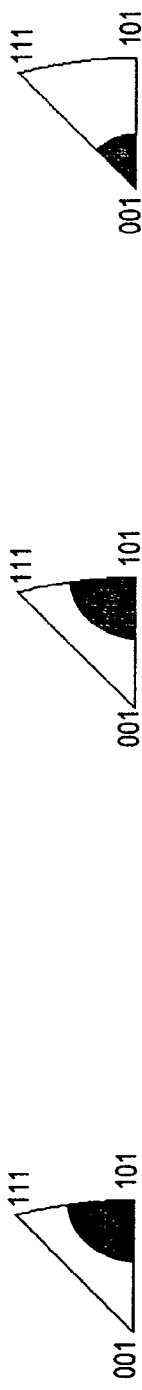

MANUFACTURING METHOD OF SEMICONDUCTOR DEVICE

BACKGROUND OF THE INVENTION

1. Field of the Invention

The present invention relates to a formation method of a semiconductor film having a crystalline structure which is formed by a laser crystallization technique, and a manufacturing method of a semiconductor device including a thin film transistor provided with the semiconductor film, or the like. More specifically, the present invention relates to a manufacturing method of a semiconductor device including an n-channel thin film transistor and a p-channel thin film transistor.

2. Description of the Related Art

In recent years, a laser crystallization technique in which an amorphous semiconductor film formed over a glass substrate is irradiated with a laser beam to form a semiconductor film having a crystalline structure (hereinafter, referred to as a crystalline semiconductor film) has been widely researched, and a large number of suggestions have been made.

The reason why the crystalline semiconductor film is used is that the crystalline semiconductor film has higher mobility than an amorphous semiconductor film. As a result, for example, TFTs using the crystalline semiconductor film is used for an active matrix liquid crystal display device or organic EL (electroluminescence) display device, or the like in which, over one glass substrate, TFTs for a pixel portion, or TFTs for a pixel portion and TFTs for a driver circuit are formed.

As a crystallization method, other than laser crystallization, there are a thermal annealing method using an annealing furnace and a rapid thermal annealing (RTA) method. When the laser crystallization is used, heat is absorbed by only a semiconductor film and crystallization can be performed without increasing substrate temperature so much. Therefore, a substance such as glass or plastic which has a low melting point can be used as the substrate. As a result, a glass substrate which is inexpensive and is easily processed even in a large area can be used, thus, production efficiency can be drastically improved by the laser crystallization.

In laser crystallization, a continuous-wave laser beam or a pulsed laser beam with a repetition rate of greater than or equal to 10 MHz is formed into a linear beam spot and the semiconductor film is irradiated with the laser beam while being scanned to move a solid-liquid interface, whereby crystals in the semiconductor film can be grown laterally. This method makes it possible to form a crystalline semiconductor film provided with a very large crystal which has a crystal grain with a width of several μm and a length of several tens of μm (hereinafter, referred to as large grain crystals). When the large grain crystal is used in a channel formation region of a thin film transistor, few grain boundaries are formed in a moving direction of carriers, and thus electrical barrier against the carriers is decreased. As a result, a thin film transistor which has mobility of about several hundreds of cm²/Vs can be manufactured.

The mobility of electrons which are carriers in an n-type thin film transistor or holes which are carriers in a p-type thin film transistor depends on an orientation of crystals planes. The n-type thin film transistor can obtain the best performance when a channel formation region is formed of crystals in which crystal planes are oriented along {001}, and the p-type thin film transistor can obtain the best performance when a channel formation region is formed of crystals in which crystal planes are oriented along {211} or {101} (Patent Document 1: Japanese Published Patent Application No. 2002-246606).

SUMMARY OF THE INVENTION

However, in a crystalline semiconductor film provided with large grain crystals formed using continuous-wave laser or a pulsed laser with a repetition rate of greater than or equal to 10 MHz, orientations of crystal planes of adjacent large grain crystals are random and they are not aligned in one direction. Thus, in a case where a thin film transistor is manufactured using the crystalline semiconductor film provided with the large grain crystals, the distribution of orientations of crystal planes of the large grain crystals in a channel formation regions is different between the different thin film transistors. That is, electrical characteristics vary in the different thin film transistors in a reflection of the orientations of crystal planes.

In addition, when there is a plurality of crystals having different orientations of crystal planes in the channel formation region of the thin film transistor, a trap level at grain boundaries is increased; thus, electrical characteristics of the thin film transistor are deteriorated.

Moreover, it is difficult to form a crystalline semiconductor film provided with crystals having an orientation of crystal planes which is suitable for an n-type thin film transistor and crystals having an orientation of crystal planes which is suitable for a p-type thin film transistor.

In view of the foregoing problems, the present invention provides a formation method of a crystalline semiconductor film which is capable of controlling formation of crystals having an orientation of crystal planes which does not prevent electrons from moving. In addition, the present invention provides a formation method of a crystalline semiconductor film which is capable of controlling formation of crystals having an orientation of crystal planes which does not prevent holes from moving. Moreover, the present invention provides a manufacturing method of a semiconductor device including an n-type thin film transistor formed of crystals in which crystal planes are oriented along {001} and a p-type thin film transistor formed of crystals in which crystal planes are oriented along {211} or {101}.

According to one feature of the present invention, a cap film is formed over a semiconductor film formed over an insulating substrate and the semiconductor film is irradiated with a laser beam which is capable of completely melting the semiconductor film in a film-thickness direction to completely melt the semiconductor film, whereby a crystalline semiconductor film in which orientations of crystal planes are controlled is formed.

According to another feature of the present invention, a cap film is formed over a semiconductor film formed over an insulating substrate and the semiconductor film is irradiated with a continuous-wave laser beam or a pulsed laser beam with a repetition rate of greater than or equal to 10 MHz, whereby a crystalline semiconductor film in which orientations of crystal planes are controlled is formed.

As the cap film, a film which transmits a laser beam having energy which is high enough to melt the semiconductor film is used. When the cap film is formed over the semiconductor film and the semiconductor film is irradiated with a laser beam, the cap film can sufficiently use heat generated when the laser beam is absorbed by the semiconductor film for crystallization of the semiconductor film because the cap film has an antireflection effect or a heat accumulation effect, whereby the semiconductor film can be crystallized with lower energy.

In addition, when a laser beam is emitted with the cap film formed over the semiconductor film, evaporation of a melt of a melted semiconductor can be reduced. This makes it possible to suppress reduction in viscosity of the melt of the semiconductor. Moreover, a certain amount of force can be applied to the semiconductor film by formation of the cap film over the semiconductor film. As a result, turbulence of the melt of the semiconductor at the time of lateral crystal growth can be suppressed and orientations of crystals planes of a crystalline semiconductor film are controlled more easily.

A melted state of the semiconductor film differs depending on the amount of energy of a laser beam which is absorbed by the semiconductor film. In the present invention, the lowest energy at which the semiconductor film is completely melted or energy which is slightly higher than the lowest energy is absorbed by the semiconductor film. The amount of heat which is applied to the semiconductor film is kept as low as possible, whereby evaporation of the melt of the semiconductor can be reduced, and turbulence of the melt of the semiconductor at the time of lateral crystal growth can be suppressed. As a result, a large grain crystal in which orientations of crystal planes are controlled to be oriented along one direction can be formed.

Furthermore, the amount of energy absorbed by the semiconductor film differs depending on a scanning rate and power of a laser beam. The melting time of the semiconductor film also differs depending on the absorbed heat. In addition, orientations of crystal planes of the crystalline semiconductor film differ depending on the melting time of the semiconductor film. Thus, the orientations of crystal planes can be controlled by control of the melting time of the semiconductor film.

That is, the amount of energy of a laser beam which is absorbed by the semiconductor film is controlled with a scanning rate and power of the laser beam with the cap film formed over the semiconductor film, whereby reduction in viscosity of the melt of the semiconductor can be suppressed, turbulence of the melt of the semiconductor can be suppressed, and orientations of crystal planes and the size of a crystal grain of a crystalline semiconductor film can be controlled. As a result, a crystalline semiconductor film which has large grain crystals and in which orientations of crystal planes are controlled can be formed.

In addition, the cap film is formed over the semiconductor film and the semiconductor film is irradiated with a continuous-wave laser beam or a pulsed laser beam with a repetition rate of greater than or equal to 10 MHz of which power and scanning rate are controlled, whereby controls of generation of crystal nuclei, viscosity of the melt of the semiconductor, the amount of energy which is absorbed by the semiconductor film, the amount of melting time of the semiconductor film, and the like become possible. As a result, orientations of crystal planes and the grain size of the crystal can be controlled.

As a result, a crystalline semiconductor film having crystals in which surface crystal planes are oriented along {001} can be formed. In addition, a crystalline semiconductor film having crystals in which surface crystal planes are oriented along {211} can be formed. Moreover, a crystalline semiconductor film having crystals in which surface crystal planes are oriented along {101} can be formed. Furthermore, a crystalline semiconductor film including a crystalline region in which surface crystal planes are oriented along {101} and a crystalline region in which surface crystal planes are oriented along {211} or {101} can be formed.

In addition, an n-channel thin film transistor can be manufactured using the crystalline region in which the crystal planes are oriented along {001}, and a p-channel thin film transistor can be manufactured using the crystalline region in which the crystal planes are oriented along {211} or {101}.

The present invention makes it possible to form a crystalline semiconductor film in which orientations of crystal planes are controlled. Also, a crystalline semiconductor film having crystals in which surface crystal planes are oriented along {001} can be formed. In addition, a crystalline semiconductor film having crystals in which surface crystal planes are oriented along {211} can be formed. Moreover, a crystalline semiconductor film having crystals in which surface crystal planes are oriented along {101} can be formed. Furthermore, a crystalline semiconductor film including a crystalline region in which surface crystal planes of are oriented along {001} and a crystalline region in which surface crystal planes are oriented along {211} or {101} can be formed.

Furthermore, a semiconductor device including an n-channel thin film transistor formed using the crystalline region in which the surface crystal planes are oriented along {001} and a p-channel thin film transistor formed using the crystalline region in which the surface crystal planes are oriented along {101} or {211} can be manufactured.

BRIEF DESCRIPTION OF THE DRAWINGS

In the accompanying drawings:

FIGS. 9A to 9D are cross-sectional views illustrating a manufacturing process of a semiconductor device of the present invention;

FIGS. 10A to 10C are cross-sectional views illustrating a manufacturing process of a semiconductor device of the present invention;

FIGS. 11A to 11C are cross-sectional views illustrating a manufacturing process of a semiconductor device of the present invention;

FIGS. 23A to 23F are diagrams showing orientation map images and orientation ratios of a crystalline silicon film of an embodiment obtained by EBSP measurement;

FIGS. 24A to 24F are diagrams showing orientation map images and orientation ratios of a crystalline silicon film of an embodiment obtained by EBSP measurement;

FIGS. 25A to 25F are diagrams showing orientation map images and orientation ratios of a crystalline silicon film of an embodiment obtained by EBSP measurement;

FIGS. 26A to 26F are diagrams showing orientation map images and orientation ratios of a crystalline silicon film of an embodiment obtained by EBSP measurement;

FIGS. 27A to 27F are diagrams showing orientation map images and orientation ratios of a crystalline silicon film of an embodiment obtained by EBSP measurement;

FIGS. 28A to 28F are diagrams showing orientation map images and orientation ratios of a crystalline silicon film of an embodiment obtained by EBSP measurement;

FIGS. 29A to 29F are diagrams showing orientation map images and orientation ratios of a crystalline silicon film of an embodiment obtained by EBSP measurement;

FIGS. 30A to 30F are diagrams showing orientation map images and orientation ratios of a crystalline silicon film of an embodiment obtained by EBSP measurement;

FIGS. 31A to 31F are diagrams showing orientation map images and orientation ratios of a crystalline silicon film of an embodiment obtained by EBSP measurement;

FIGS. 32A to 32F are diagrams showing orientation map images and orientation ratios of a crystalline silicon film of an embodiment obtained by EBSP measurement;

FIGS. 33A to 33F are diagrams showing orientation map images and orientation ratios of a crystalline silicon film of an embodiment obtained by EBSP measurement;

FIGS. 34A to 34F are diagrams showing orientation map images and orientation ratios of a crystalline silicon film of an embodiment obtained by EBSP measurement; and FIGS. 35A to 35F are diagrams showing orientation map images and orientation ratios of a crystalline silicon film of an embodiment obtained by EBSP measurement.

DETAILED DESCRIPTION OF THE INVENTION

Embodiment Mode

Figure 1A:
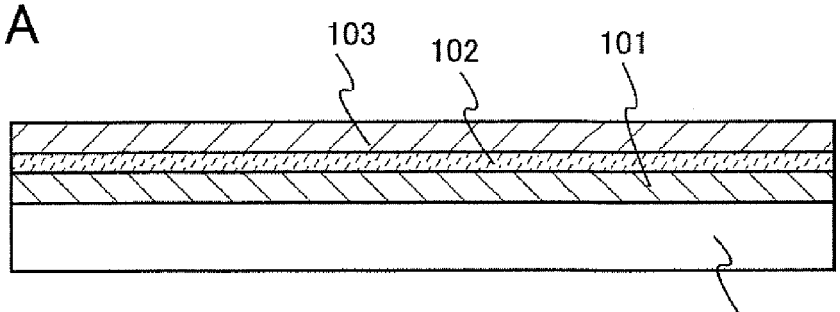
FIGS. 1A to 1E are cross-sectional views illustrating a manufacturing process of a semiconductor device of the present invention.

Embodiment Modes of the present invention will be hereinafter described with reference to the accompanying drawings. However, the present invention can be carried out in many different modes and it is easily understood by those skilled in the art that modes and details of the present invention can be modified in various ways without departing from the purpose and scope of the present invention. Therefore, the present invention should not be interpreted as being limited to the following description of Embodiment Modes. Note that in all drawings for explaining Embodiment Modes, the same portions or portions having similar functions are denoted by the same reference numerals, and repeated explanation thereof will be omitted.

Embodiment Mode 1

In this embodiment mode, a manufacturing method of a crystalline semiconductor film having crystals in which surface crystal planes are oriented along {100} and crystals in which crystal planes are oriented along {211} or {101}, in which a cap film is formed over an amorphous semiconductor film, and the amorphous semiconductor film is irradiated with a continuous-wave laser beam or a pulsed laser beam with a repetition rate of greater than or equal to 10 MHz, will be described with reference to FIGS. 1A to 1E and FIGS. 6 to 8.

First, as shown in FIG. 1A, an insulating film 101 functioning as a base film is formed on one surface of a substrate 100 with an insulating surface. The insulating film 101 functioning as a base film is formed using a silicon oxide film, a silicon nitride film, a silicon nitride oxide film in which the amount of nitrogen is larger than that of oxygen, a silicon oxynitride film in which the amount of oxygen is larger than that of nitrogen, or the like with a thickness of 50 to 150 nm as appropriate. Here, for example, a glass substrate with a thickness of 0.7 mm is used as the substrate 100 with an insulating surface. In addition, the insulating film 101 functioning as a base film is formed in such a manner that a silicon nitride oxide film with a thickness of 50 nm is formed by a plasma CVD method, and then a silicon oxynitride film with a thickness of 100 nm is formed by a plasma CVD method.

Note that the insulating film 101 functioning as a base film may be provided according to need. Although the insulating film 101 prevents an impurity from glass from diffusing into a semiconductor film 102 in a case where the substrate 100 is a glass substrate, it is not necessarily provided in a case where a quartz substrate is used as the substrate 100. In addition, a peeling film may be provided between the insulating film 101 and the substrate 100 and a semiconductor element may be peeled off from the substrate 100 after steps are completed.

Next, as the semiconductor film 102, an amorphous semiconductor film with a thickness of greater than or equal to 10 nm and less than or equal to 100 nm, preferably greater than or equal to 20 nm and less than or equal to 80 nm, is formed over the insulating film 101 by a plasma CVD method.

Although amorphous silicon is used for the semiconductor film 102 in this embodiment mode, silicon germanium ($Si_{1-x}Ge_x$ ($0 \leq x \leq 0.1$)) or the like can be used, and silicon carbide (SiC) in which a single crystal has a diamond structure can be used as well.

In addition, in a case where the semiconductor film 102 is an amorphous semiconductor film, the semiconductor film 102 may be heated after being formed. The heat treatment is treatment for dehydrogenating the amorphous semiconductor film. Note that hydrogen is extracted in order to prevent a hydrogen gas from blowing out of the semiconductor film 102 when the semiconductor film 102 is irradiated with a laser beam, and the extraction of hydrogen can be omitted if the semiconductor film 102 contains a small amount of hydrogen. Here, the semiconductor film 102 is heated in an electric furnace at 500° C. for 1 hour.

Although an example of using amorphous silicon as the semiconductor film 102 is described in this embodiment mode, polycrystalline silicon may also be used. A polycrystalline silicon film can be formed in such a manner that after forming an amorphous silicon film, a slight amount of element such as nickel, palladium, germanium, iron, tin, lead, cobalt, platinum, copper, or gold is added to the amorphous silicon film, and then heat treatment at 500 to 750° C. for 1 minute to 10 hours is performed to the amorphous silicon film.

Next, as a cap film 103, a $SiN_xO_y$ ($0 \leq x \leq 1.5$, $0 \leq y \leq 2$, $0 \leq 4x+3y \leq 6$) film with a thickness of greater than or equal to 200 nm and less than or equal to 1000 nm is formed over the semiconductor film 102. Note that in particular, if the cap film 103 is too thin, it is difficult to control orientations of crystal planes of a crystalline semiconductor film which is to be formed later; therefore, the cap film 103 is preferably formed to have a thickness of greater than or equal to 200 nm and less than or equal to 1000 nm.

The cap film 103 can be formed by a plasma CVD method using monosilane, ammonia, and nitrous oxide as reaction gases. Note that nitrous oxide is used as oxidizer, and oxygen which has oxidizing properties may be used instead of nitrous oxide. The use of such gases makes it possible to form a silicon oxynitride (hereinafter, expressed as $SiN_xO_y$ ($x<y$)) film in which the amount of oxygen is larger than that of nitrogen. Alternatively, the cap film 103 can be formed by a plasma CVD method using monosilane and ammonia as reaction gases. The use of such gases makes it possible to form a silicon nitride oxide (hereinafter, expressed as $SiN_xO_y$ ($x>y$)) film in which the amount of nitrogen is larger than that of oxygen.

As the cap film 103, a film having enough transmittance of a wavelength of a laser beam, and having a thermal value such as a thermal expansion coefficient or a value such as ductility which is close to that of the adjacent semiconductor film is preferably used. Furthermore, the cap film 103 is preferably a hard and dense film, etching rate of which is low, which is equivalent to that of a gate insulating film of a thin film transistor which is to be formed later. As an example, the following film is given: a dense film, etching rate of which when etching is performed at 20° C. with the use of a mixed aqueous solution of 7.13% of ammonium hydrogen fluoride and 15.4% of ammonium fluoride, or a hydrofluoric acid aqueous solution is greater than or equal to 1 nm/min and less than or equal to 150 nm/min, preferably greater than or equal to 10 nm/min and less than or equal to 130 nm/min. Alternatively, as an example, the following film is preferably given: a dense film, etching rate of which when dry etching is performed with the use of a hydrofluorocarbon gas is greater than or equal to 100 nm/mm and less than or equal to 150 nm/min, preferably greater than or equal to 110 nm/min and less than or equal to 130 nm/mm. Such a hard and dense film can be formed by reduction of a deposition rate. Forming a dense film as the cap film 103 makes it possible to increase thermal conductivity and prevent excessive heat accumulation due to a laser beam emitted to the cap film and the semiconductor film. Accordingly, evaporation of a melt of a semiconductor can be reduced, and thus reduction in viscosity of the melt of the semiconductor can be suppressed and turbulence of the melt of the semiconductor can be suppressed.

In addition, when laser beam irradiation is performed under such a condition in which the cap film is formed over the semiconductor film, evaporation of the melt of the semiconductor can be reduced; thus, reduction in viscosity of the melt of the semiconductor can be suppressed and turbulence of the melt of the semiconductor can be suppressed. Moreover, certain force is applied to the semiconductor film by formation of the cap film on a surface of the semiconductor film; thus, turbulence of the melt of the semiconductor can be suppressed. As a result, orientations of crystal planes of a crystalline semiconductor film can be controlled easily.

Note that when a large amount of hydrogen is contained in the cap film, heat treatment is performed for dehydrogenation in a similar manner to the semiconductor film 102.

Figure 1B:
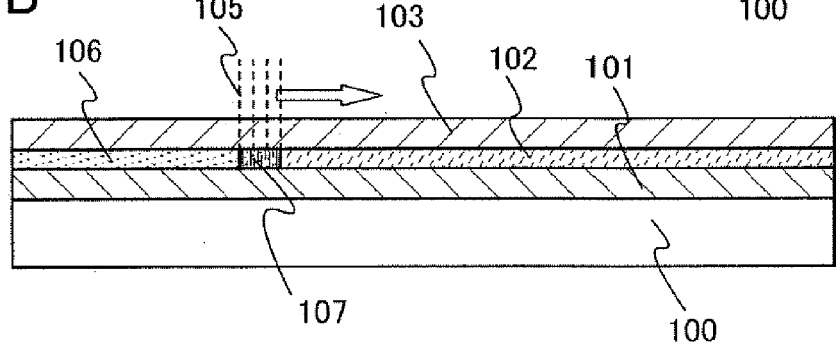

Next, as shown in FIG. 1B, part of the semiconductor film 102 is irradiated with a first laser beam 105 to form a crystalline region 106 in which surface crystal planes are oriented along {001}. Note that crystals having surface crystal planes oriented along {001} preferably make up greater than or equal to 40% and less than or equal to 100% of the crystalline region 106.

The first laser beam 105 can be emitted to the semiconductor film 102 from the cap film 103 side. In a case where the substrate 100 has a light-transmitting property, the first laser beam 105 can be emitted to the semiconductor film 102 from the substrate 100 side. In this embodiment mode, the first laser beam 105 is emitted to the semiconductor film 102 from the cap film 103 side.

For the first laser beam 105, the lowest energy at which the semiconductor film is completely melted or energy which is slightly higher than the lowest energy is desirable. The amount of heat given to the semiconductor film is suppressed to the minimum necessary, whereby turbulence of the melt of the semiconductor can be suppressed and generation of extra crystal nuclei due to turbulence can be suppressed. As a result, crystals with a large grain size can be formed.

Figure 6:
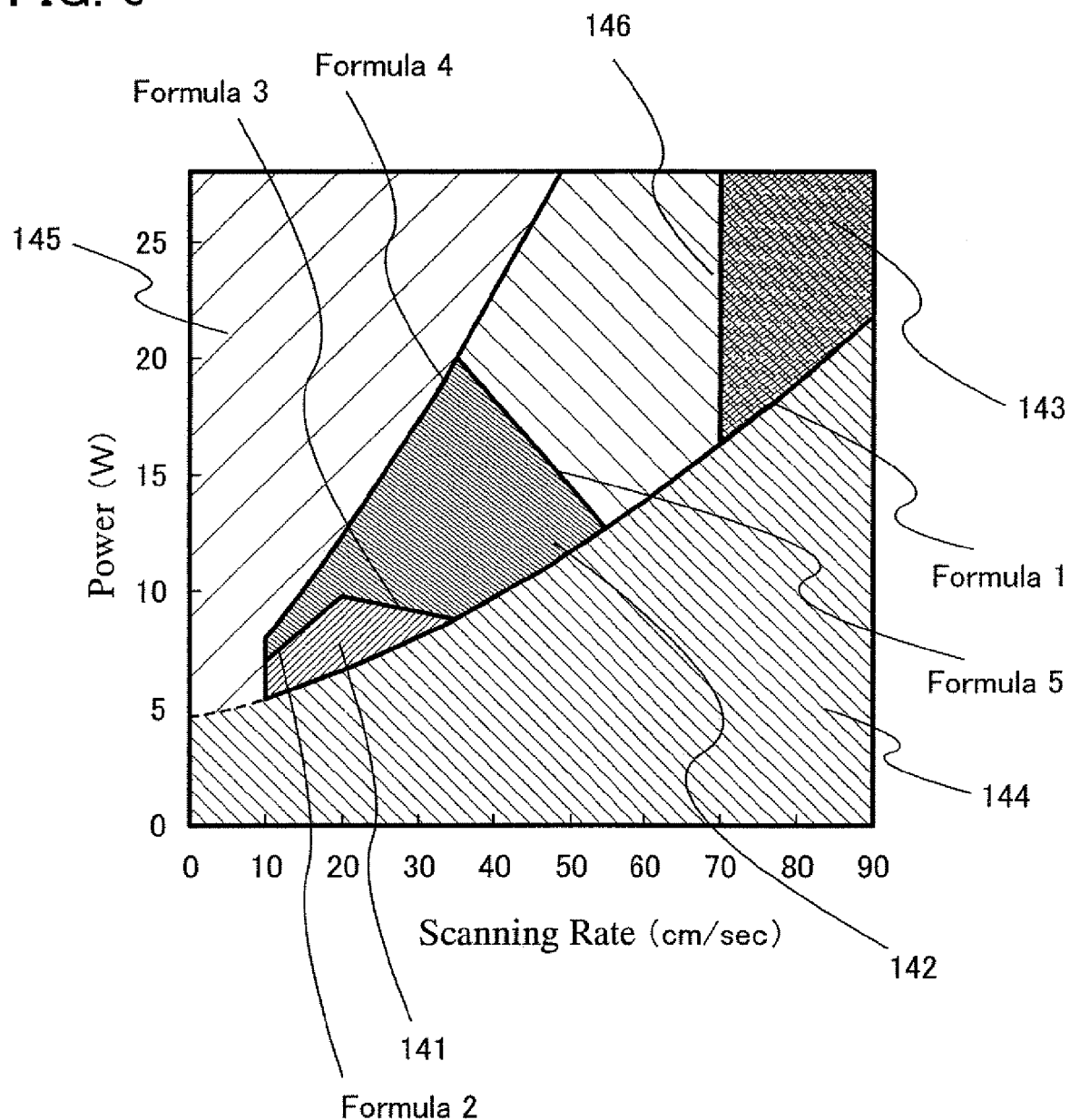
FIG. 6 is a cross-sectional view illustrating manufacturing conditions of a crystalline semiconductor film of the present invention.

Here, a relationship between a scanning rate of a laser beam and power thereof, and orientations of crystal planes of a surface of a crystalline semiconductor film to be formed are described with reference to FIG. 6. In FIG. 6, a horizontal axis indicates a scanning rate of a laser beam and a vertical axis indicates power of the laser beam.

A region 141 is a region indicating conditions by which a crystalline semiconductor film in which crystal grain size is large and surface crystal planes are oriented along {001} can be formed. Note that as for the orientations of crystal planes, an equivalent plane orientation group including (100), (010), (001), and an orientation in which "1" in each of the above-described orientations of crystal planes is −1 is denoted as {001}.

A region 142 is a region indicating conditions by which a crystalline semiconductor film in which crystal grain size is large and surface crystal planes are oriented along {211} can be formed. Note that as for the orientations of crystal planes, an equivalent plane orientation group including (211), (121), (112), and an orientation in which one or both of "1" and "2" in each of the above-described orientations of crystal planes are negative values is denoted as {211}.

A region 143 is a region indicating conditions by which a crystalline semiconductor film in which crystal grain size is large and surface crystal planes are oriented along {101} can be formed. Note that as for the orientations of crystal planes, an equivalent plane orientation group including (101), (011), (110), and an orientation in which "1" in each of the above-described plane orientations is "−1" is denoted as {101}.

A region 144 is a region indicating conditions by which a crystalline semiconductor film in which crystal grain size is small is formed. Note that the small grain size refers to an approximately-round crystal with a submicron grain size. Such a crystal is formed because the semiconductor film is irradiated with a laser beam with power which is not high enough to completely melt the semiconductor film in a film-thickness direction.

A region 145 is a region indicating conditions by which part of a crystalline semiconductor film is evaporated. A region 146 is a region indicating conditions by which a crystalline semiconductor film in which crystal grain size is large and the orientations of crystal planes are random can be formed. Since excessive energy for forming crystals with a large grain size is supplied to the semiconductor film, a great deal of turbulence is generated and the crystals have random orientations of crystal planes.

The scanning rate of the first laser beam 105 and the power thereof are preferably included in the region 141 in FIG. 6. That is, the power of the first laser beam 105 are preferably higher than a range in which a crystal with a small grain size and lower than a range in which a crystal in which crystal planes of a surface (an observation plane A) are oriented along {211} is formed. As a result, a crystalline region in which surface crystal planes are oriented along {001} can be formed. Note that crystals having surface crystal planes oriented along {001} preferably make up greater than or equal to 40% and less than or equal to 100% of the crystalline region 106. If the crystals having crystal planes of the plane oriented along {001} make up greater than or equal to 40% and less than or equal to 100% of the crystalline region 106, an JO orientation ratio of an orientation of crystal planes which does not prevent electrons from moving is high, and the use of the crystals makes it possible to increase mobility of an n-channel thin film transistor.

Note that when the semiconductor film is crystallized with the use of the first laser beam 105, greater than or equal to 40% and less than or equal to 100%, preferably greater than or equal to 60% and less than or equal to 100% of the semiconductor film can be formed of crystals having crystal planes oriented along one direction, in each of a direction which is parallel to a scanning direction of the laser beam and a direction which is parallel to a surface of the semiconductor film and perpendicular to the scanning direction of the laser beam. That is, each of three intersecting planes can be formed of crystals in which crystal planes oriented along a certain direction make up a certain percentage or more. As a result, a polycrystalline region which is close to a single crystalline structure can be formed.

Figure 1C:
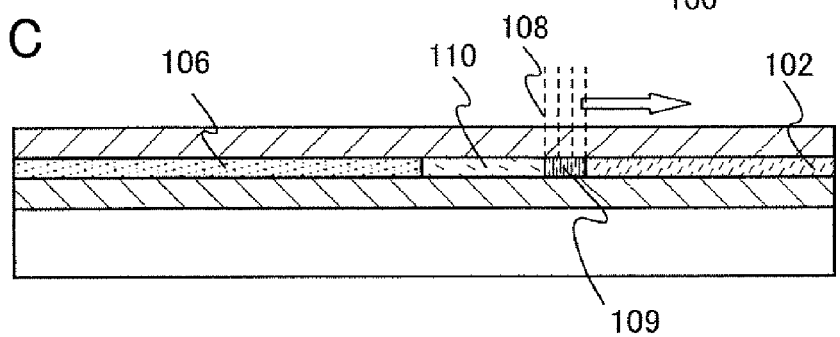

Next, as shown in FIG. 1C, part of the semiconductor film 102 is irradiated with a second laser beam 108 to form a crystalline region 110 in which surface crystal planes are oriented along {211} or {101}. Note that crystals having surface crystal planes oriented along {211} or {101} preferably makes up greater than or equal to 40% and less than or equal to 100% of the crystalline region 110.

The second laser beam 108 can be emitted to the semiconductor film 102 from the cap film 103 side. In a case where the substrate 100 has a light-transmitting property, the second laser beam 108 can be emitted to the semiconductor film 102 from the substrate 100 side. In this embodiment mode, the second laser beam 108 is emitted to the semiconductor film from the cap film 103 side.

In addition, the scanning rate of the second laser beam 108 and the power thereof may be included in the region 142 in FIG. 6. That is, the power of the second laser beam 108 are preferably higher than a range in which crystals with a small grain size are formed or a range in which crystals in which crystal planes are oriented along {001} are formed, and lower than a range in which part of the semiconductor film is ablated or a range in which crystals with a large grain size in which the orientations of crystal planes are random are formed. As a result, a crystalline region in which surface crystal planes are oriented along {211} can be formed. Note that the crystals having surface crystal planes oriented along {211} preferably make up greater than or equal to 40% and less than or equal to 100% of the crystalline region 110. If the crystals having crystal planes of the plane oriented along {211} make up greater than or equal to 40% and less than or equal to 100% of the crystalline region 110, an orientation ratio of an orientation of crystal planes which does not prevent holes from moving is high, and the use of the crystals makes it possible to increase mobility of a p-channel thin film transistor.

In addition, the scanning rate of the second laser beam 108 and power thereof may be included the region 143 in FIG. 6. That is, the power of the second laser beam 108 are preferably higher than a range in which crystals with a small grain size are formed, and lower than a range in which part of the semiconductor film is ablated or a range in which crystals with a large grain size in which the orientations of crystal planes are random are formed. As a result, a crystalline region in which surface crystal planes are oriented along {101} can be formed. Note that the crystals having surface crystal planes oriented along {101} preferably make up greater than or equal to 40% and less than or equal to 100% of the crystalline region 110. If the crystals having crystal planes of the plane oriented along {101} make up greater than or equal to 40% and less than or equal to 100% of the crystalline region 110, an orientation ratio of an orientation of crystal planes which does not prevent holes from moving is high, and the use of the crystals makes it possible to increase mobility of a p-channel thin film transistor.

Note that when the semiconductor film is crystallized with the use of the first laser beam 108, greater than or equal to 40% and less than or equal to 100%, preferably greater than or equal to 60% and less than or equal to 100% of the semiconductor film can be formed of crystals having crystal planes oriented along one direction, in each of a direction which is parallel to a scanning direction of the laser beam and a direction which is parallel to a surface of the semiconductor film and perpendicular to the scanning direction of the laser beam. That is, each of three intersecting planes can be formed of crystals having a certain orientation of crystal planes. As a result, a polycrystalline region which is close to a single crystalline structure can be formed.

Figure 1D:
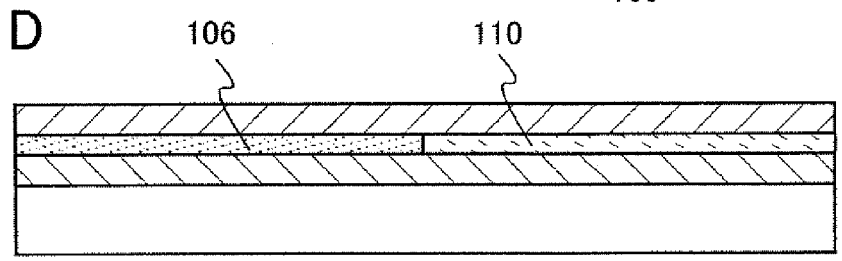

Consequently, as shown in FIG. 1D, a crystalline semiconductor film including the crystalline region 106 in which surface crystal planes are oriented along {001} and the crystalline region 110 in which surface crystal planes are oriented along {211} or {101} can be formed.

Here, a laser oscillator and an optical system forming a beam spot are described which are used when a laser beam is emitted to the amorphous semiconductor film for crystallization.

Figure 7:
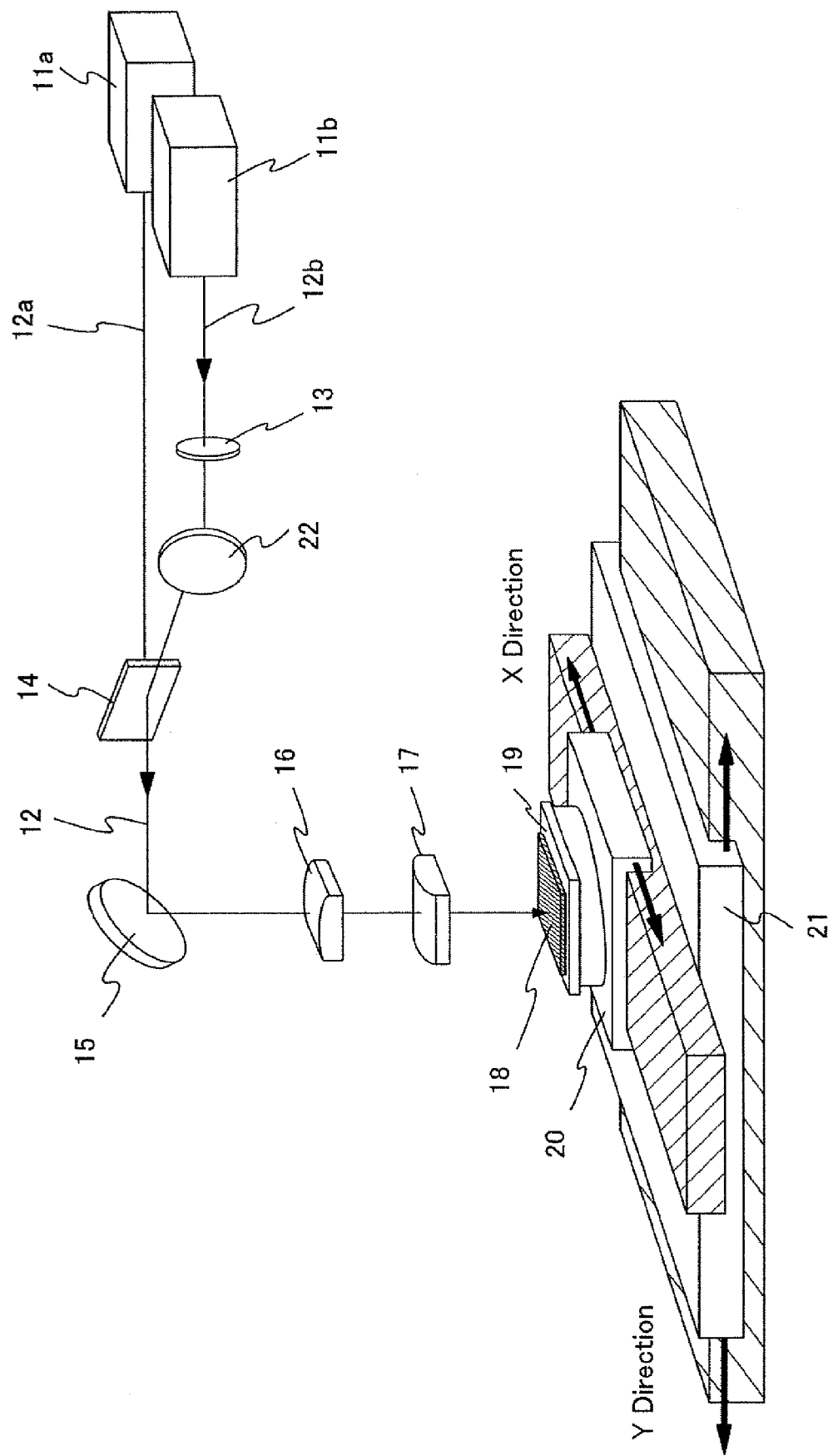
FIG. 7 is a perspective view illustrating a laser apparatus applicable to the present invention.

As shown in FIG. 7, as each of laser oscillators 11a and 11b, a laser oscillator emitting a wavelength which is absorbed by the semiconductor film 102 for several tens of % or more is used. Typically, the second harmonic or the third harmonic can be used. In this embodiment mode, a continuous-wave laser with LD (laser diode) excitation ($YVO_4$, the second harmonic (a wavelength of 532 nm)), maximum output of which is 20 W, is prepared. Although it is not necessary to particularly limit the wavelength of the laser to the second harmonic, the second harmonic is superior to a further higher order harmonic in terms of energy efficiency.

Laser power used in the present invention is within a range which can completely melt the semiconductor film and is within a range which can form a crystalline semiconductor film in which surface crystal planes are oriented along {001} or surface crystal planes are oriented along {211} or {101}. When laser power which is lower than this range is used, the semiconductor film cannot be completely melted, and a crystalline semiconductor film in which crystal grains are small and orientations of crystal planes are not aligned in one direction is formed. Therefore, the two laser oscillators are prepared in the case of FIG. 7; however, one laser oscillator may be prepared as long as the output is enough. When laser power higher than this range is used, many crystal nuclei are generated in the semiconductor film, and disorderly crystal growth is generated; thus, a crystalline semiconductor film with uneven position and size of crystal grain and orientation of crystal planes is formed.

When the semiconductor film 102 is irradiated with the continuous-wave laser, energy is continuously given to the semiconductor film 102; therefore, when the semiconductor film is once brought to a melted state, the melted state can be continued. Furthermore, a solid-liquid interface of the semiconductor film can be moved by movement of the continuous-wave laser, whereby a crystal grain which is long in one direction along this movement direction can be formed. A solid-state laser is used in doing so because, in comparison with a gas laser or the like, output of the solid-state laser has high stability and stable process is expected.

Note that, without limitation to the continuous-wave laser, a pulsed laser with a repetition rate of greater than or equal to 10 MHz can be used.

When a pulsed laser with a high repetition rate is used, the semiconductor film can be constantly kept in a melted state in a whole film-thickness direction, as long as a pulse interval of the laser is shorter than a time between melt and solidification of the semiconductor film. Thus, a semiconductor film including crystal grains which are laterally grown and long in one direction by the movement of the solid-liquid interface can be formed.

Although a $YVO_4$ laser is used for the laser oscillators 11a and 11b in this embodiment mode, other continuous-wave laser and pulsed laser with a repetition rate of greater than or equal to 10 MHz can also be used. For example, as a gas laser, there are an Ar laser, a Kr laser, a $CO_2$ laser, and the like. As a solid-state laser, there are a YAG laser, a YLF laser, a $YAlO_3$ laser, a $GdVO_4$ laser, a KGW laser, a KYW laser, an alexandrite laser, a Ti: sapphire laser, a $Y_2O_3$ laser, a $YVO_4$ laser, and the like. Moreover, there are a ceramic laser such as a YAG laser, a $Y_2O_3$ laser, a $GdVO_4$ laser, and $YVO_4$ laser. As a metal vapor laser, there are a helium cadmium laser and the like.

In addition, in the laser oscillators 11a and 11b, energy uniformity of a linear beam spot obtained on a surface to be irradiated can be increased if the laser beam is emitted with oscillation of $TEM_{00}$ (a single transverse mode), which is preferable.

The brief description of optical treatment of laser emitted from these laser oscillators is as follows. Laser beams 12a and 12b are each emitted with the same energy from the laser oscillators 11a and 11b, respectively. A polarization direction of the laser beam 12b emitted from the laser oscillator 11b is changed through a wavelength plate 13. The polarization direction of the laser beam 12b is changed because the two laser beams having polarization directions which are different from each other are synthesized by a polarizer 14.

After the laser beam 12b is passed through the wavelength plate 13, the laser beam 12b is reflected by a mirror 22 and made to enter the polarizer 14. Then, the laser beams 12a and 12b are synthesized by the polarizer 14 as a laser beam 12. The wavelength plate 13 and the polarizer 14 are adjusted so that light which has passed through the wavelength plate 13 and the polarizer 14 has appropriate energy. Note that, although the polarizer 14 is used for synthesizing the laser beams in this embodiment mode, other optical element such as a polarization beam splitter may also be used.

A laser beam 12 which is synthesized by the polarizer 14 is reflected by a mirror 15, and a cross-sectional shape of the laser beam is formed into a linear shape on a surface to be irradiated 18 by a cylindrical lens 16 having a focal length of 150 mm, and a cylindrical lens 17 having a focal length of, for example, 20 mm. The mirror 15 may be provided depending on an arrangement of an optical system of a laser irradiation apparatus.

The cylindrical lens 16 operates in a length direction of the beam spot that is formed on the surface to be irradiated 18, whereas the cylindrical lens 17 operates in a width direction of the beam spot. Accordingly, on the surface to be irradiated 18, a linear beam spot having a length of about 500 μm and a width of about 20 μm, for example, is formed. Note that, although the cylindrical lenses are used to form the beam spot into a linear shape in this embodiment mode, the present invention is not limited thereto, and other optical element such as a spherical lens may also be used. Moreover, the focal lengths of the cylindrical lenses are not limited to the above-described lengths and can be freely set.

In addition, although the laser beam is shaped using the cylindrical lenses 16 and 17 in this embodiment mode, an optical system for extending the laser beam to a linear shape and an optical system for thinly converging the laser beam on the surface to be irradiated may be additionally provided. For example, in order to obtain the linear cross section of the laser beam, a cylindrical lens array, a diffractive optical element, an optical waveguide, or the like can be used. In addition, with the use of a rectangular-shape laser medium, the linear cross section of the laser beam can also be obtained at an emission stage.

As described above, the ceramic laser can be used in the present invention, and the ceramic laser can form a shape of laser medium relatively freely; therefore, the ceramic laser is appropriate for forming such a laser beam. Note that the cross-sectional shape of the laser beam which has been formed into a linear shape is preferably as narrow as possible in the width, which increases energy density of the laser beam in the semiconductor film; therefore, process time can be shortened.

Next, an irradiation of the laser beam is described. Since the surface to be irradiated 18, where the semiconductor film 102 covered with the cap film 103 is formed, is operated with a relatively high speed, the surface to be irradiated 18 is fixed to suction stage 19. The suction stage 19 can operate in X and Y directions on a surface parallel to the surface to be irradiated 18 by an X-axis uniaxial robot 20 and a Y-axis uniaxial robot 21. The uniaxial robots are placed so that the length direction of the linear beam spot corresponds to the Y axis.

Next, the surface to be irradiated 18 is made to operate along the width direction of the beam spot, that is, the X axis, and the surface to be irradiated 18 is irradiated with the laser beam. In this embodiment mode, a scanning rate of the X-axis uniaxial robot 20 is greater than or equal to 10 cm/sec and less than or equal to 100 cm/sec, and the laser beam having an energy of greater than or equal to 2 W and less than or equal to 15 W is emitted from each of the two laser oscillators. The laser output after synthesizing the laser beams is to be greater than or equal to 4 W and less than or equal to 30 W. A region in which the semiconductor film is completely melted by laser beam irradiation is formed, and crystals are grown during a solidifying process; thus, a crystalline semiconductor film of the present invention can be formed.

Note that energy distribution of the laser beam emitted from the laser oscillator in a $TEM_{00}$ mode is generally a Gaussian distribution. Note that a width of the region where crystal grains in which crystal planes for three intersecting planes which are orthogonal to one another are controlled are formed can be changed by the optical system used for the laser beam irradiation. For example, intensity of the laser beam can be homogenized with the use of a lens array such as a cylindrical lens array or a fly eye lens; a diffractive optical element; an optical waveguide; or the like.

The semiconductor film 102 is irradiated with the laser beam having homogenized intensity, whereby the region irradiated with the laser beam can be formed of crystal grains in which crystal planes in a direction which is perpendicular to a surface are controlled.

Note that, in this embodiment mode, a mode of moving the semiconductor film 102, which is the surface to be irradiated 18, with the use of the X-axis uniaxial robot 20 and the Y-axis uniaxial robot 21 is used. Without limitation thereto, the laser beam can be moved by a method of moving an irradiation system in which an irradiated position with the laser beam is moved while the surface to be irradiated 18 is fixed; a method of moving a surface to be irradiated 18 in which the surface to be irradiated 18 is moved while the irradiated position with the laser beam is fixed; or a method in which these two methods are combined.

Furthermore, as described above, the energy distribution of the beam spot, which is formed by the above-described optical system, is a Gaussian distribution in a major axis direction; therefore, small grain crystals are formed in a place having low energy density at the both ends. Thus, part of the laser beam may be cut by provision of a slit or the like in front of the surface to be irradiated 18 so that the surface to be irradiated 18 is irradiated only with energy enough to form crystals in which orientations of crystal planes of a surface of a film are controlled. Alternatively, a metal film or the like which reflects the laser beam may be formed over the cap film 103, and a pattern may be formed so that the laser beam reaches only a place of the semiconductor film where crystals in which orientations of crystal planes are controlled are desired to be formed.

Moreover, in order to efficiently use the laser beams emitted from the laser oscillators 11a and 11b, the energy of the beam spot in a length direction may be uniformly distributed with the use of a beam homogenizer such as a lens array or a diffractive optical element. Furthermore, the Y-axis uniaxial robot 21 is moved by a width of the crystalline semiconductor film which is formed, and the X-axis uniaxial robot 20 can be moved at a predetermined scanning rate. Repeating a series of such operations makes it possible to efficiently crystallize an entire surface of the semiconductor film.

Then, the cap film is removed by etching. After that, a resist is applied on the crystalline semiconductor film, and the resist is exposed to light and developed, whereby the resist is formed into a desired shape. Furthermore, the crystalline semiconductor film is etched using the resist formed in this step as a mask, whereby the crystalline semiconductor film with a predetermined shape is formed. After that, the resist mask is removed.

Through the steps, a crystalline semiconductor film with a predetermined shape in which surface crystal planes are oriented along {001}, and a crystalline semiconductor film with a predetermined shape in which surface crystal planes are oriented along {211} or {101} can be formed.

Note that the crystalline semiconductor film may be thinned before the resist is applied on the crystalline semiconductor film. Typically, etching may be performed so that the total thickness of the crystalline semiconductor film becomes greater than or equal to 10 nm and less than or equal to 30 nm. Alternatively, reduction in thickness of the crystalline semiconductor film with a desired shape may be performed after a resist with a desired shape is formed by light-exposure and development and the crystalline semiconductor film is etched into a desired shape using the resist as a mask. Typically, etching may be performed so that the thickness of the crystalline semiconductor film with a desired shape becomes greater than or equal to 10 nm and less than or equal to 30 nm. If a thin film transistor is formed using such a thin crystalline semiconductor film, a fully-depleted thin film transistor is obtained in a channel formation region; thus, a thin film transistor with high mobility can be manufactured.

Figure 1E:
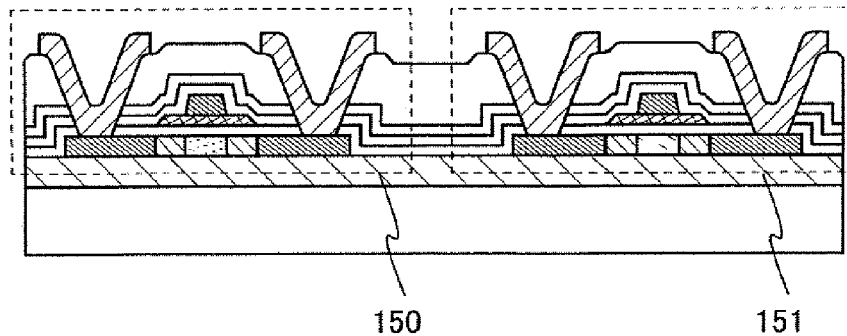

Next, as shown in FIG. 1E, an n-channel thin film transistor 150 can be manufactured using the crystalline semiconductor film with a predetermined shape in which surface crystal planes are oriented along {001}, and a p-channel thin film transistor 151 can be manufactured using the crystalline semiconductor film with a predetermined shape in which surface crystal planes are oriented along {211} or {101}.

Next, the orientations of crystal planes of the crystalline semiconductor film formed in this embodiment mode are described. In this embodiment mode, for the orientations of crystal planes of the crystalline semiconductor film where the cap film has been removed by etching, EBSP (electron back scatter diffraction pattern) measurement can be carried out. First, a basic matter of EBSP is described, and results are described while complementary explanation is being added.

EBSP refers to a method by which an EBSP detector is connected to a scanning electron microscope (SEM), a direction of a diffraction image (an EBSP image) of individual crystal, which is generated when a sample highly tilted in the scanning electron microscope is irradiated with a convergent electron beam, is analyzed, and the orientation of crystal planes of a sample is measured from orientation data and positional information of a measurement point (x, y).

When an electron beam is made to enter a crystalline semiconductor film, inelastic scatterings also occur at the back, and a linear pattern, which is peculiar to the orientation of crystal plane by Bragg diffraction, can also be observed in the sample. Here, this linear pattern is generally referred to as Kikuchi line. EBSP obtains the orientation of crystal planes of a crystalline semiconductor film by analysis of Kikuchi line reflected in a detector.

In a sample having a polycrystalline structure, normally, each crystal grain has a different orientation of crystal planes. Thus, every time the irradiation position of the crystalline semiconductor film is moved, the sample is irradiated with the electron beam and the orientation of crystal planes in each irradiation position is analyzed. In such a manner, the orientation of crystal planes or orientation information of a crystalline semiconductor film having a flat surface can be obtained. As a measurement area is broader, the tendency of the orientation of crystal planes of the entire crystalline semiconductor film can be obtained more, and the more measurement points there are, the more detailed information on the orientation of crystal planes in the measurement area can be obtained.

Vectors a to c and observation planes A to C are set as described below in the crystalline semiconductor film formed in this embodiment mode. The vector a is perpendicular to a surface of the substrate and the vector c; the vector c is parallel to a scanning direction of a laser beam (that is, a growth direction of crystal grain) and the surface of the substrate; and the vector b is parallel to the surface of the substrate and also perpendicular to the growth direction of crystal grain. That is, the vector b is perpendicular to the vector a and the vector c.

Figure 8:
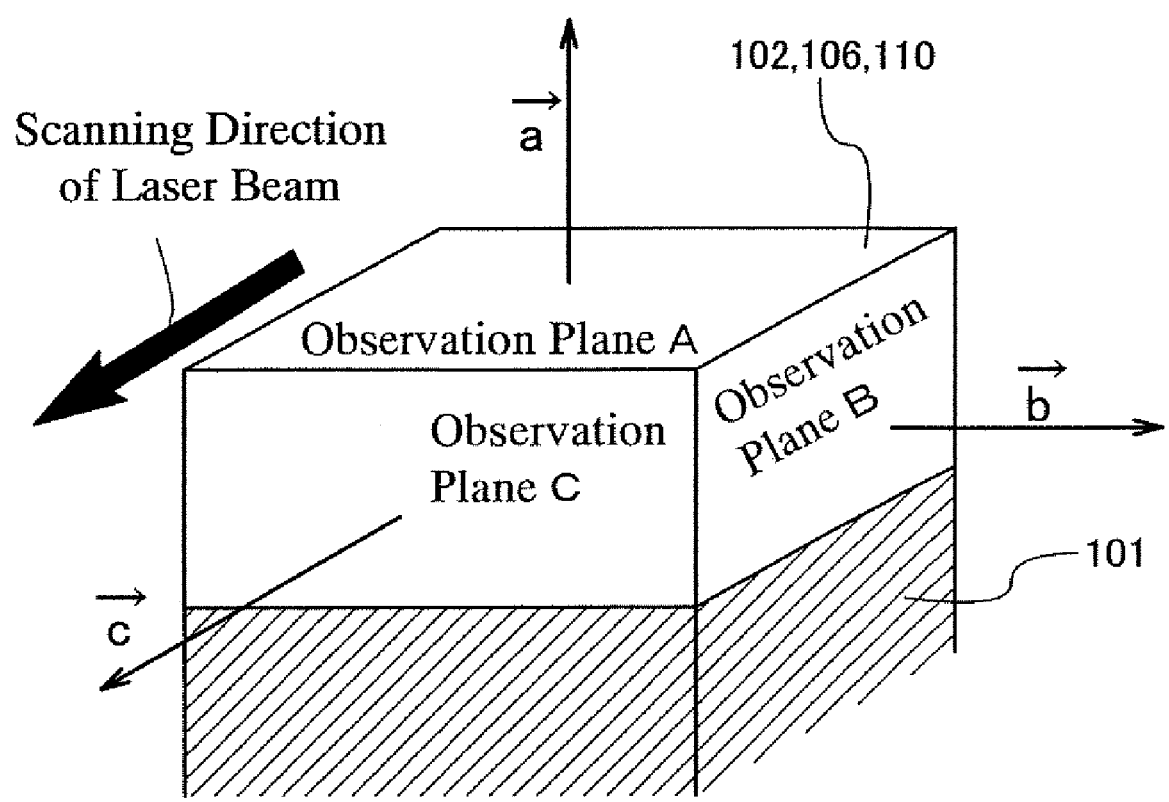
FIG. 8 is a perspective view illustrating orientations of crystal planes of a crystalline semiconductor film of the present invention.

In addition, as shown in FIG. 8, three planes where three vectors (the vector a, the vector b, and the vector c) which are orthogonal to one another become a normal vector are respectively defined as the observation plane A, the observation plane B, and the observation plane C.

In this embodiment mode, the orientations of crystal planes of the observation plane A (that is, a surface of the crystalline semiconductor film) the normal vector of which is the vector a that is perpendicular to the surface of the substrate and the vector c is controlled, and a crystalline region in which crystal planes are oriented along {001}, and a crystalline region in which crystal planes are oriented along {211} or {101} are formed.

In addition, the orientation of crystal planes within a crystal cannot be decided only with the orientation of crystal planes from observation on one observation plane of the crystal. This is because, even when the orientation of crystal planes of only one observation plane is aligned in one direction, it cannot be said that the orientation of crystal planes is aligned in the crystal if the orientation of crystal planes is not aligned in other observation planes. Thus, the more information on the orientation of crystal planes is obtained from at least two planes and the more information is obtained from many planes, the higher precision of the orientation of crystal planes in the crystal is obtained.

That is, when distributions of the orientation of crystal planes of all three planes is uniform within the measurement area, the crystal can be regarded as an approximately single crystal. Thus, the orientation of crystal planes of the crystal can be specified with high precision according to information on these three observation planes A to C.

After the cap film is formed over the semiconductor film, the semiconductor film is irradiated with a continuous-wave laser beam or a pulsed laser beam with a repetition rate of greater than or equal to 10 MHz through the cap film, whereby a crystalline region in which crystal planes of the observation plane A are oriented along {001} and a crystalline region in which crystal planes of the observation plane A are oriented along {211} or {101} can be formed.

The crystalline region in which the crystal planes of the observation plane A are oriented along {001} has an orientation of crystal planes which does not prevent electrons from moving, and the crystalline region in which the crystal planes of the observation plane A are oriented along {211} or {101} has an orientation of crystal planes which does not prevent holes from moving. Thus, an n-type thin film transistor is manufactured using the crystalline region in which the crystal planes of the observation plane A are oriented along {001} and a p-type thin film transistor is manufactured using the crystalline region in which the crystal planes of the observation plane A are oriented along {211} or {101}, whereby a semiconductor device in which mobility of each transistor is increased can be manufactured.

Embodiment Mode 2

In this embodiment mode, a manufacturing method of a crystalline semiconductor film including a crystalline region in which crystal planes of the observation plane A are oriented along {001} and a crystalline region in which crystal planes of the observation plane A are oriented along {211} or {101} will be described with reference to FIGS. 2A to 2E.

Figure 2A:
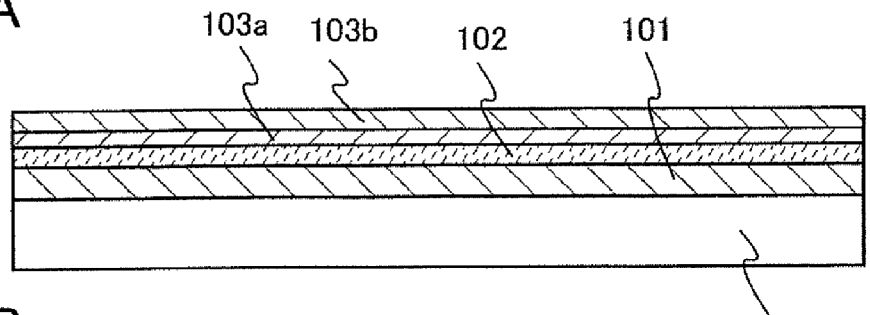
FIGS. 2A to 2E are cross-sectional views illustrating a manufacturing process of a semiconductor device of the present invention.

In a similar manner to Embodiment Mode 1, as shown in FIG. 2A, an insulating film 101 functioning as a base film is formed on one surface of a substrate 100 with an insulating surface. Next, as a semiconductor film 102, an amorphous semiconductor film is formed to have a thickness of greater than or equal to 10 nm and less than or equal to 100 nm, preferably greater than or equal to 20 nm and less than or equal to 80 nm over the insulating film 101 by a plasma CVD method.

In addition, the semiconductor film 102 may be heated in an electric furnace at 500° C. for 1 hour after formation of the semiconductor film 102. In a case where the semiconductor film 102 is an amorphous semiconductor film, the heat treatment is treatment for dehydrogenating the amorphous semiconductor film. Note that hydrogen is extracted in order to prevent a hydrogen gas from blowing out of the semiconductor film 102 when the semiconductor film 102 is irradiated with a laser beam, and the dehydrogenation can be omitted if the semiconductor film 102 contains a small amount of hydrogen.

Next, cap films 103a and 103b are stacked over the semiconductor film 102. The total thickness of the cap films 103a and 103b is preferably greater than or equal to 200 nm and less than or equal to 1000 nm. In addition, the thickness of the cap film 103a which is in contact with the semiconductor film 102 is preferably greater than or equal to 50 nm. If the thickness of the cap film 103a which is in contact with the semiconductor film 102 is less than 50 nm, when the semiconductor film 102 is irradiated with a laser beam, the cap film 103a is melted into the semiconductor film 102, and quality of the semiconductor film 102 is changed due to the change in its thickness.

The cap films 103a and 103b are formed of $SiN_xO_y$ ($0 \leq x \leq 1.5$, $0 \leq y \leq 2$, $0 \leq 4x+3y \leq 6$) films having different compositions. In this embodiment mode, a $SiN_xO_y$ (x>y) film with a thickness of 100 nm is formed as the cap film 103a, and a $SiN_xO_y$ (x<y) film with a thickness of 300 nm is formed as the cap film 103b. Note that in a case where a large amount of hydrogen is contained in the cap films 103a and 103b, similarly to the case of the semiconductor film 102, heat treatment for dehydrogenation is performed.

Figure 2B:
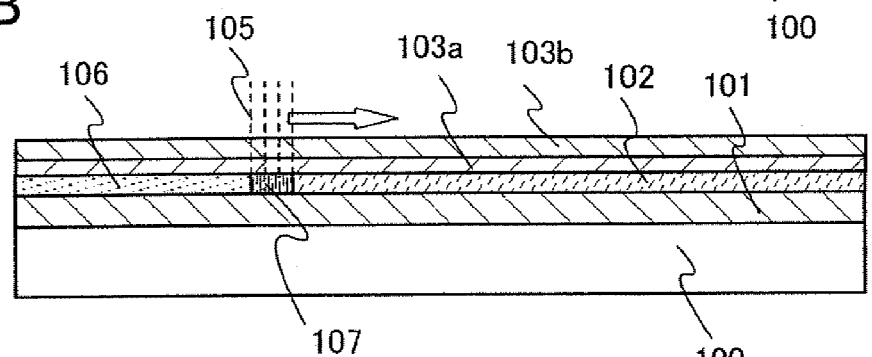

Next, as shown in FIG. 2B, part of the semiconductor film 102 is irradiated with a first laser beam 105 from the cap films 103a and 103b side, whereby a crystalline region 106 in which crystal planes of the observation plane A are oriented along {001} is formed. Note that the crystals having crystal planes oriented along {001} preferably make up greater than or equal to 40% and less than or equal to 100% of the crystalline region 106.

Note that when the semiconductor film 102 is crystallized with the use of the first laser beam 105 described in Embodiment Mode 1, greater than or equal to 40% and less than or equal to 100%, preferably greater than or equal to 60% and less than or equal to 100% of each of the observation planes B and C can be formed of crystals having crystal planes oriented along one direction. That is, greater than or equal to 40% and less than or equal to 100%, preferably greater than or equal to 60% and less than or equal to 100% of each of the observation planes A, B, and C can be formed of crystals having crystal planes oriented along a certain direction.

Figure 2C:
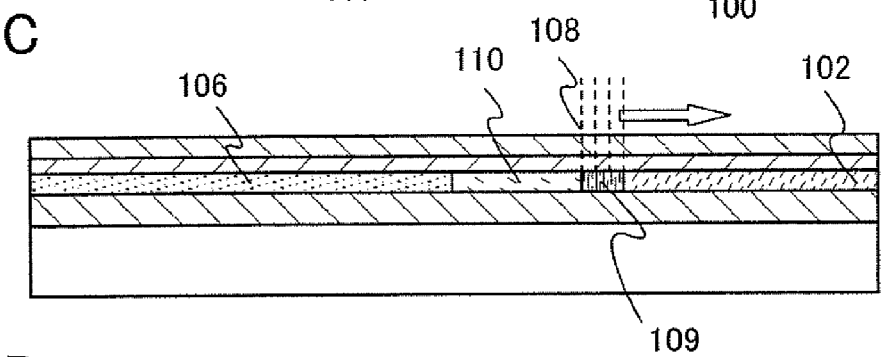

Next, as shown in FIG. 2C, part of the semiconductor film 102 is irradiated with the second laser beam 108 described in Embodiment Mode 1 from the cap films 103a and 103b side, whereby a crystalline region 110 in which crystal planes of the observation plane A are oriented along {211} or {101} is formed. Note that the crystals having crystal planes oriented along {211} or {101} preferably make up greater than or equal to 40% and less than or equal to 100% of the crystalline region 110.

Note that when the semiconductor film is crystallized with the use of the second laser beam described in Embodiment Mode 1, greater than or equal to 40% and less than or equal to 100%, preferably greater than or equal to 60% and less than or equal to 100% of each of the observation planes B and C can be formed of crystals having crystal planes oriented along one direction. That is, greater than or equal to 40% and less than or equal to 100%, preferably greater than or equal to 60% and less than or equal to 100% of each of the observation planes A, B, and C can be formed of crystals having crystal planes oriented along a certain direction.

Figure 2D:
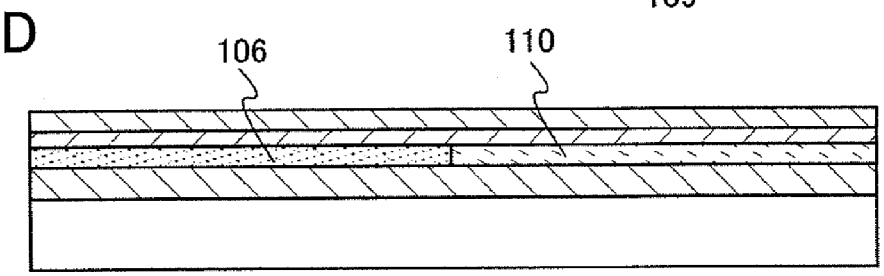

Consequently, as shown in FIG. 2D, a crystalline semiconductor film including the crystalline region 106 in which crystal planes of the observation plane A are oriented along {001} and the crystalline region 110 in which crystal planes of the observation plane A are oriented along {211} or {101} can be formed.

Next, the cap film is removed by etching. After that, a resist is applied on the crystalline semiconductor film, and the resist is exposed to light and developed, whereby the resist is formed into a desired shape. Furthermore, the crystalline semiconductor film is etched using the resist formed in this step as a mask, whereby a crystalline semiconductor film with a predetermined shape is formed. After that, the resist mask is removed.

Note that the crystalline semiconductor film may be thinned in a similar manner to Embodiment Mode 1. Typically, etching may be performed so that the total thickness of the crystalline semiconductor film becomes greater than or equal to 10 nm and less than or equal to 30 nm. If a thin film transistor is formed using such a thin crystalline semiconductor film, a fully-depleted thin film transistor is obtained in a channel formation region; thus, a thin film transistor with high mobility can be manufactured.

Consequently, the crystalline semiconductor film with a predetermined shape in which crystal planes of the observation plane A are oriented along {001} and the crystalline semiconductor film with a predetermined shape in which crystal planes of the observation plane A are oriented along {211} or {101} can be formed.

Figure 2E:
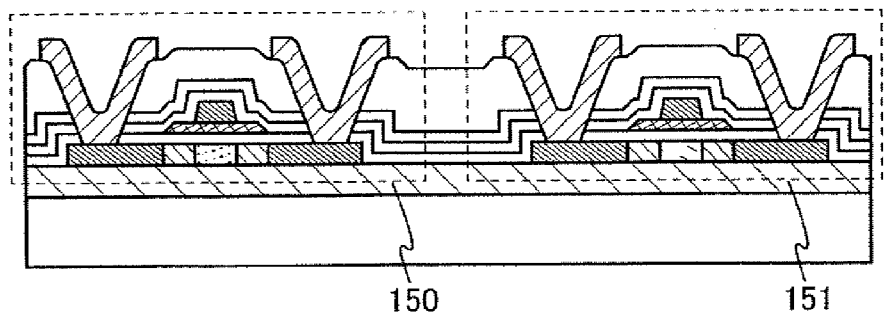

Next, as shown in FIG. 2E, an n-channel thin film transistor 150 can be manufactured using the crystalline semiconductor film with a predetermined shape in which the crystal planes of the observation plane A are oriented along {001}, and a p-channel thin film transistor 151 can be manufactured using the crystalline semiconductor film with a predetermined shape in which the crystal planes of the observation plane A are oriented along {211} or {101}.

As described above, after the cap films are formed over the semiconductor film, the semiconductor film is irradiated with a continuous-wave laser beam or a pulsed laser beam with a repetition rate of greater than or equal to 10 MHz through the cap films, whereby the crystalline region in which the crystal planes of the observation plane A are oriented along {001} and the crystalline region in which the crystal planes of the observation plane A are oriented along {211} or {101} can be formed.

The crystalline region in which the crystal planes of the observation surface A are oriented along {001} has the orientation of crystal planes which does not prevent electrons from moving, and the crystalline region in which the crystal planes of the observation plane A are oriented along {211} or {101} has the orientation of crystal planes which does not prevent holes from moving. Thus, an n-type thin film transistor is manufactured using the crystalline region in which the crystal planes of the observation plane A are oriented along {001} and a p-type thin film transistor is manufactured using the crystalline region in which the crystal planes of the observation plane A are oriented along {211} or {101}, whereby a semiconductor device in which mobility of each transistor is increased can be manufactured.

Embodiment Mode 3

In this embodiment mode, a manufacturing method of a crystalline semiconductor film including crystals in which crystal planes of the observation plane A are oriented along {001} and crystals in which crystal planes of the observation plane A are oriented along {211} or {101} due to a structure of a cap film which differs from that described in the above-described embodiment modes will be described with reference to FIGS. 3A to 3E.

Figure 3A:
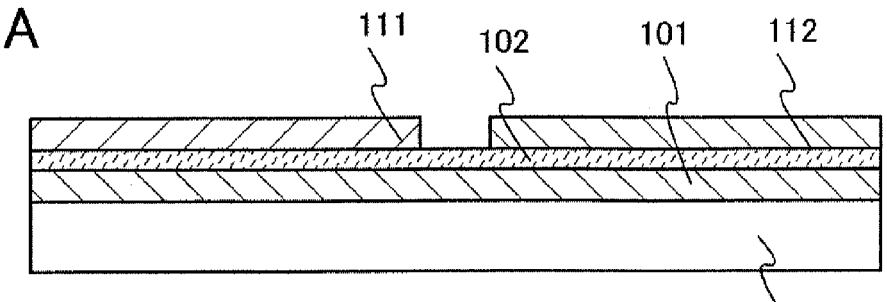
FIGS. 3A to 3E are cross-sectional views illustrating a manufacturing process of a semiconductor device of the present invention.

In a similar manner to Embodiment Mode 1, as shown in FIG. 3A, an insulating film 101 functioning as a base film is formed on one surface of a substrate 100 with an insulating Surface. Next, as a semiconductor film 102, an amorphous semiconductor film is formed to have a thickness of greater than or equal to 10 nm and less than or equal to 100 nm, preferably greater than or equal to 20 µm and less than or equal to 80 nm over the insulating film 101 by a plasma CVD method.

In addition, the semiconductor film 102 may be heated in an electric furnace at 500° C. for 1 hour after formation of the semiconductor film 102. The heat treatment is treatment for dehydrogenating the amorphous semiconductor film. Note that hydrogen is extracted in order to prevent a hydrogen gas from blowing out of the semiconductor film 102 when the semiconductor film 102 is irradiated with a laser beam, and the dehydrogenation can be omitted if the semiconductor film 102 contains a small amount of hydrogen.

Next, cap films 111 and 112 with predetermined shapes are formed over the semiconductor film 102. The thickness of each of the cap films 111 and 112 is preferably greater than or equal to 200 nm and less than or equal to 1000 nm. As the cap films 111 and 112, $SiN_xO_y$ ($0 \leq x \leq 1.5$, $0 \leq y \leq 2$, $0 \leq 4x+3y \leq 6$) films having different compositions are formed. Using the $SiN_xO_y$ (x>y) film as the cap film makes it relatively easy to preferentially form crystals in which crystal planes of the observation plane A are oriented along {001}. On the other hand, using the $SiN_xO_y$ (x<y) film as the cap film makes it relatively easy to preferentially form crystals in which crystal planes of the observation plane A are oriented along {211} or {101}. Thus, it is preferable to form the $SiN_xO_y$ (x>y) film as the cap film 111 in a region where an n-channel thin film transistor is formed later and to form the $SiN_xO_y$ (x<y) film as the cap film 112 in a region where a p-channel thin film transistor is formed.

One of the $SiN_xO_y$ (x>y) film and the $SiN_xO_y$ (x<y) film is formed on an entire surface of the amorphous semiconductor film by a plasma CVD method or the like and then the one of the $SiN_xO_y$ (x>y) film and the $SiN_xO_y$ (x<y) film is etched into a predetermined shape with a resist formed by a photolithography process used as a mask, whereby the cap film 111 is formed. Then, the other of the $SiN_xO_y$ (x>y) film and the $SiN_xO_y$ (x<y) film is formed over the cap film 111 and the amorphous semiconductor film and then the other of the $SiN_xO_y$ (x>y) film and the $SiN_xO_y$ (x<y) film is etched into a desired shape with a resist formed by a photolithography process used as a mask, whereby the cap film 112 is formed. Note that at this time, it is preferable to form a film as the cap film 111, etching rate of which is slower than that of a film as the cap film 112. As a result, the one of the $SiN_xO_y$ (x>y) film and the $SiN_xO_y$ (x<y) film can be made to remain while etching the other of the $SiN_xO_y$ (x>y) film and the $SiN_xO_y$ (x<y) film.

Note that in a case where a large amount of hydrogen is contained in the cap films 111 and 112, similarly to the case of the semiconductor film 102, heat treatment for dehydrogenation is performed.

Figure 3B:
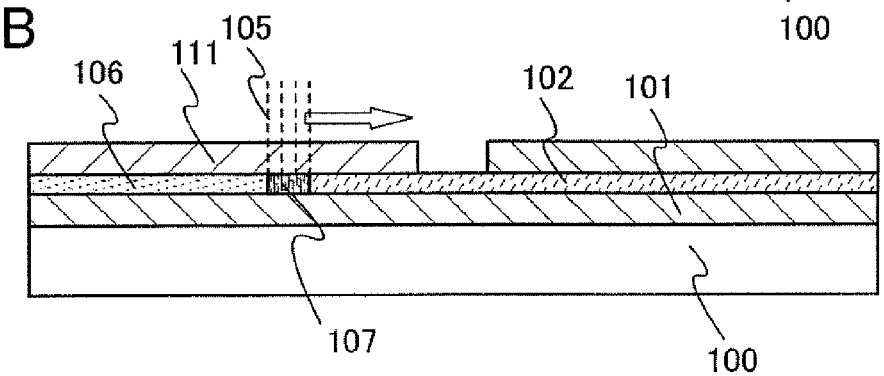

Next, as shown in FIG. 3B, part of the semiconductor film 102 is irradiated with a first laser beam 105 described in Embodiment Mode 1 from the cap film 111 side, whereby a crystalline region in which crystal planes of the observation plane A are oriented along {001} is formed. Note that the crystals having crystal planes oriented along {001} preferably make up greater than or equal to 40% and less than or equal to 100% of the crystalline region 106.

Note that when the semiconductor film is crystallized with the use of the first laser beam 105 described in Embodiment Mode 1, greater than or equal to 40% and less than or equal to 100%, preferably greater than or equal to 60% and less than or equal to 100% of each of the observation planes B and C can be formed of crystals having crystal planes oriented along one direction. That is, greater than or equal to 40% and less than or equal to 100%, preferably greater than or equal to 60% and less than or equal to 100% of each of the observation planes A, B, and C can be formed of crystals having crystal planes oriented along a certain direction.

Figure 3C:
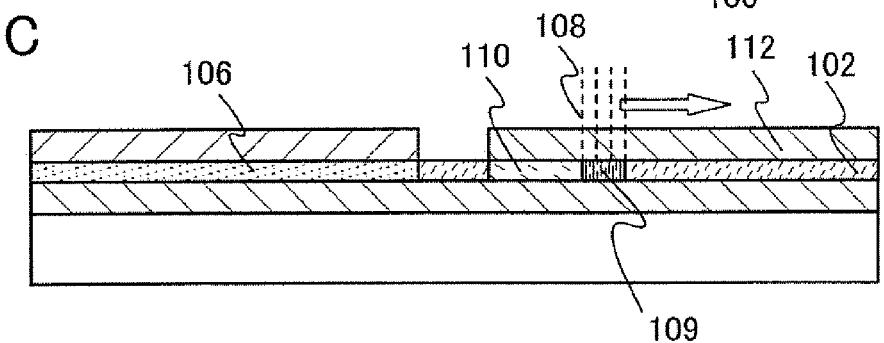

Next, as shown in FIG. 3C, part of the semiconductor film 102 is irradiated with the second laser beam 108 described in Embodiment Mode 1 from the cap film 112 side, whereby a crystalline region 110 in which crystal planes of the observation plane A are oriented along {211} or {101} is formed. Note that the crystals having crystal planes oriented along {211} or {101} preferably make up greater than or equal to 40% and less than or equal to 100% of the crystalline region 110.

Note that when the semiconductor film is crystallized with the use of the second laser beam described in Embodiment Mode 1, greater than or equal to 40% and less than or equal to 100%, preferably greater than or equal to 60% and less than or equal to 100% of each of the observation planes B and C can be formed of crystals having crystal planes oriented along one direction. That is, greater than or equal to 40% and less than or equal to 100%, preferably greater than or equal to 60% and less than or equal to 100% of each of the observation planes A, B, and C can be formed of crystals having crystal planes oriented along a certain direction can make up.

Figure 3D:
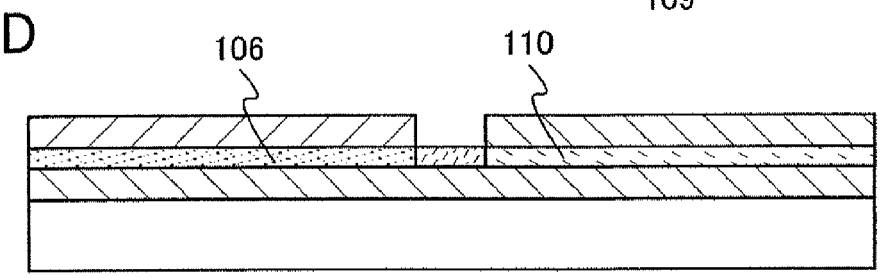

Consequently, as shown in FIG. 3D, a crystalline semiconductor film including the crystalline region 106 in which crystal planes of the observation plane A are oriented along {001} and the crystalline region 110 in which crystal planes of the observation plane A are oriented along {211} or {101} can be formed.

Next, the cap films 111 and 112 are removed by etching. After that, a resist is applied on the crystalline semiconductor film, and the resist is exposed to light and developed, whereby the resist is formed into a desired shape. Furthermore, the crystalline semiconductor film is etched using the resist formed in this step as a mask, whereby the crystalline semiconductor film with a predetermined shape is formed. After that, the resist mask is removed.

Note that the crystalline semiconductor film may be thinned in a similar manner to Embodiment Mode 1. Typically, etching may be performed so that the total thickness of the crystalline semiconductor film becomes greater than or equal to 10 nm and less than or equal to 30 nm. If a thin film transistor is formed using such a thin crystalline semiconductor film, a fully-depleted thin film transistor is obtained in a channel formation region; thus, a thin film transistor with high mobility can be manufactured.

Consequently, a crystalline semiconductor film with a predetermined shape in which crystal planes of the observation plane A are oriented along {001} and a crystalline semiconductor film with a predetermined shape in which crystal planes of the observation plane A are oriented along {211} or {101} can be formed.

Figure 3E:
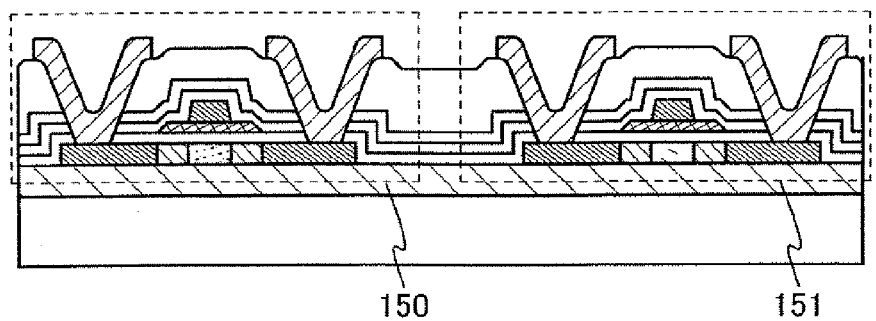

Next, as shown in FIG. 3E, an n-channel thin film transistor 150 can be manufactured using the crystalline semiconductor film with a predetermined shape in which the crystal planes of the observation plane A are oriented along {001}, and a p-channel thin film transistor 151 can be manufactured using the crystalline semiconductor film with a predetermined shape in which the crystal planes of the observation plane A are oriented along {211} or {101}.

As described in this embodiment mode, after the cap films are formed over the semiconductor film, the semiconductor film is irradiated with a continuous-wave laser beam or a pulsed laser beam with a repetition rate of greater than or equal to 10 MHz through the cap films, whereby the crystalline region in which the crystal planes of the observation plane A are oriented along {001} and the crystalline region in which the crystal planes of the observation plane A are oriented along {211} or {101} can be formed.

The crystalline region in which the crystal planes of the observation plane A are oriented along {001} has an orientation of crystal planes which does not prevent electrons from moving, and the crystalline region in which the crystal planes of the observation plane A are oriented along {211} or {101} has an orientation of crystal planes which does not prevent holes from moving. Thus, an n-type thin film transistor is manufactured using the crystalline region in which the crystal planes of the observation plane A are oriented along {001} and a p-type thin film transistor is manufactured using the crystalline region in which the crystal planes of the observation plane A are oriented along {211} or {101}, whereby a semiconductor device in which mobility of each transistor is increased can be manufactured.

Embodiment Mode 4

In this embodiment mode, a manufacturing method of a crystalline semiconductor film including crystals in which crystal planes of the observation plane A are oriented along {001} and crystals in which crystal planes of the observation plane A are oriented along {211} or {101} due to a structure of a cap film which differs from that described in the above-described embodiment modes will be described with reference to FIGS. 4A to 4E.

Figure 4A:
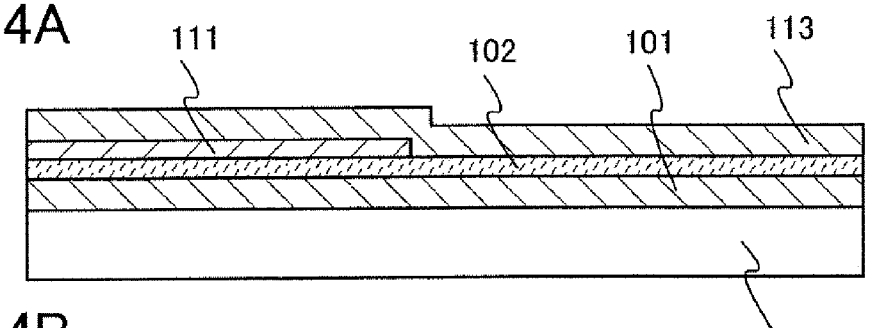
FIGS. 4A to 4E are cross-sectional views illustrating a manufacturing process of a semiconductor device of the present invention.

In a similar manner to Embodiment Mode 1, as shown in FIG. 4A, an insulating film 101 functioning as a base film is formed on one surface of a substrate 100 with an insulating surface. Next, as a semiconductor film 102, an amorphous semiconductor film is formed to have a thickness of greater than or equal to 10 nm and less than or equal to 100 nm, preferably greater than or equal to 20 nm and less than or equal to 80 nm over the insulating film 101 by a plasma CVD method.

In addition, the semiconductor film 102 may be heated in an electric furnace at 500° C. for 1 hour after formation of the semiconductor film 102. The heat treatment is treatment for dehydrogenating the amorphous semiconductor film. Note that hydrogen is extracted in order to prevent a hydrogen gas from blowing out of the semiconductor film 102 when the semiconductor film 102 is irradiated with a laser beam, and the dehydrogenation can be omitted if the semiconductor film 102 contains a small amount of hydrogen.

Next, after a cap film 111 with a predetermined shape is formed over the semiconductor film 102, a cap film 113 is formed over the cap film 111 and the semiconductor film 102. The thickness of the cap film 111 is preferably greater than or equal to 200 nm and less than or equal to 500 nm. The thickness of the cap film 113 is preferably greater than or equal to 200 nm and less than or equal to 500 nm. The cap films 111 and 113 are formed of $SiN_xO_y$ ($0 \leq x \leq 1.5$, $0 \leq y \leq 2$, $0 \leq 4x+3y \leq 6$) films having different compositions. The amount of heat which is effectively absorbed by the semiconductor film is changed by a multilayer film interference effect; thus, melting time of the semiconductor film is changed. As a result, the orientations of crystal planes of a crystalline semiconductor film can be controlled.

As for the cap film, the $SiN_xO_y$ ($x>y$) film makes it easy to preferentially form crystals in which crystal planes of the observation plane A are oriented along $\{001\}$. On the other hand, the $SiN_xO_y$ ($x<y$) film makes it easy to preferentially form crystals in which crystal planes of the observation plane A are oriented along $\{211\}$ or $\{001\}$. Therefore, it is preferable to form the $SiN_xO_y$ film in which a ratio of nitrogen is higher than that of oxygen as the cap film 111 in a region where an n-channel thin film transistor is formed later and to form the $SiN_xO_y$ film in which a ratio of oxygen is higher than that of nitrogen as the cap film 113 in a region where a p-channel thin film transistor is formed later.

One of the $SiN_xO_y$ ($x>y$) film and the $SiN_xO_y$ ($x<y$) film is formed on an entire surface of the amorphous semiconductor film by a plasma CVD method or the like and then the one of the $SiN_xO_y$ ($x>y$) film and the $SiN_xO_y$ ($x<y$) film is etched into a predetermined shape with a resist formed by a photolithography process used as a mask, whereby the cap film 111 is formed. Then, the other of the $SiN_xO_y$ ($x>y$) film and the $SiN_xO_y$ ($x<y$) film is formed over the cap film 111 and the amorphous semiconductor film, whereby the cap film 113 is formed. Note that, at this time, it is preferable to form a film for the cap film 111, etching rate of which is slower than that of a film for the cap film 113.

As for the cap films in this embodiment mode, one of the cap films (in this embodiment mode, the cap film 111) is formed into a predetermined shape and the other cap film (in this embodiment mode, the cap film 113) is not formed into a predetermined shape but formed on an entire surface of the substrate. Accordingly, the number of steps can be reduced in comparison with Embodiment Mode 3.

Note that in a case where a large amount of hydrogen is contained in the cap films 111 and 113, similarly to the case of the semiconductor film 102, heat treatment for dehydrogenation is performed.

Figure 4B:
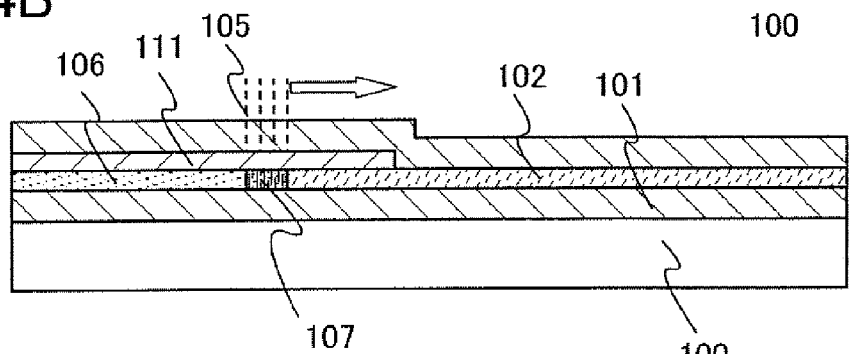

Next, as shown in FIG. 4B, part of the semiconductor film 102 is irradiated with a first laser beam 105 from the cap films 111 and 113 sides, whereby a crystalline region 106 in which crystal planes of the observation plane A are oriented along $\{001\}$ is formed. Note that the crystals having crystal planes oriented along $\{001\}$ preferably make up greater than or equal to 40% and less than or equal to 100% of the crystalline region 106.

Note that when the semiconductor film 102 is crystallized with the use of the first laser beam 105 described in Embodiment Mode 1, greater than or equal to 40% and less than or equal to 100%, preferably greater than or equal to 60% and less than or equal to 100% of each of the observation planes B and C can be formed of crystals having crystal planes oriented along one direction. That is, a fixed percentage of each of the observation planes A, B, and C can be formed of crystals having crystal planes oriented along a certain direction.

Figure 4C:
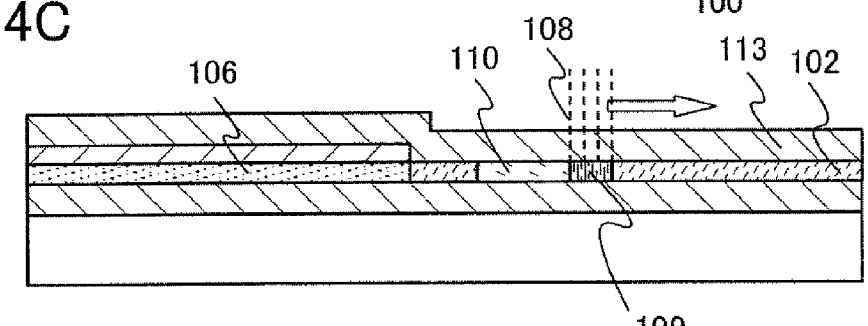

Next, as shown in FIG. 4C, part of the semiconductor film 102 is irradiated with the second laser beam 108 described in Embodiment Mode 1 from the cap film 113 side, whereby a crystalline region 110 in which crystal planes of the observation plane A are oriented along $\{211\}$ or $\{101\}$ is formed. Note that the crystals having crystal planes oriented along $\{211\}$ or $\{101\}$ preferably make up greater than or equal to 40% and less than or equal to 100% of the crystalline region 110.

Note that when the semiconductor film is crystallized with the use of the second laser beam 108 described in Embodiment Mode 1, greater than or equal to 40% and less than or equal to 100%, preferably greater than or equal to 60% and less than or equal to 100% of each of the observation planes B and C can be formed of crystals having crystal planes oriented along one direction. That is, a fixed percentage of each of the observation planes A, B, and C can be formed of crystals having crystal planes oriented along a certain direction.

Figure 4D:
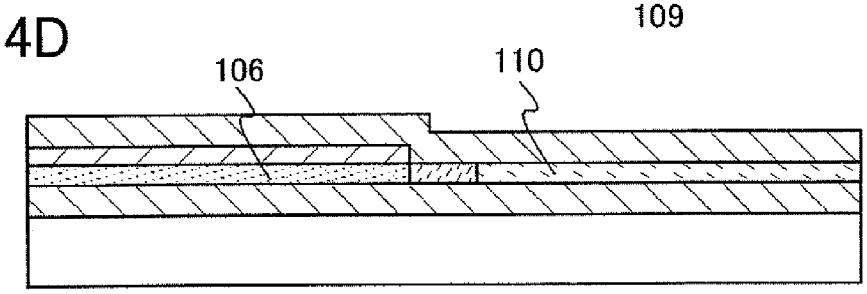

Consequently, as shown in FIG. 4D, a crystalline semiconductor film including the crystalline region 106 in which crystal planes of the observation plane A are oriented along $\{001\}$ and the crystalline region 110 in which crystal planes of the observation plane A are oriented along $\{211\}$ or $\{101\}$ can be formed.

Next, the cap films 111 and 113 are removed by etching. After that, a resist is applied on the crystalline semiconductor film, and the resist is exposed to light and developed, whereby a resist is formed into a desired shape. Furthermore, the crystalline semiconductor film is etched using the resist formed in this step as a mask, whereby the crystalline semiconductor film with a predetermined shape is formed. After that, the resist mask is removed.

Note that the crystalline semiconductor film may be thinned in a similar manner to Embodiment Mode 1. Typically, etching may be performed so that the total thickness of the crystalline semiconductor film becomes greater than or equal to 10 nm and less than or equal to 30 nm. If a thin film transistor is formed using such a thin crystalline semiconductor film, a fully-depleted thin film transistor is obtained in a channel formation region; thus, a thin film transistor with high mobility can be manufactured.

Through the steps, the crystalline semiconductor film with a predetermined shape in which the crystal planes of the observation plane A are oriented along $\{001\}$ and the crystalline semiconductor film with a predetermined shape in which the crystal planes of the observation plane A are oriented along $\{211\}$ or $\{101\}$ can be formed.

Figure 4E:
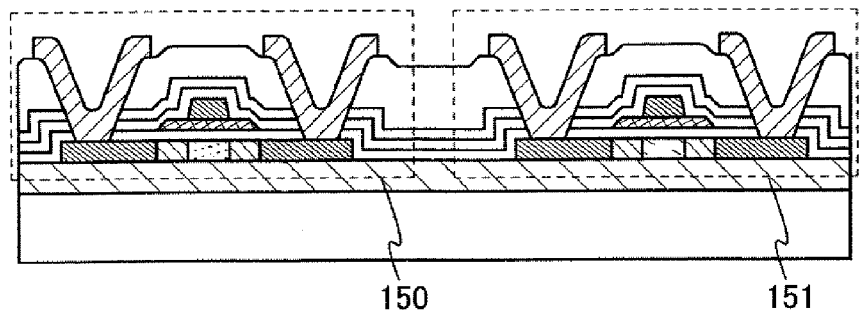

Next, as shown in FIG. 4E, an n-channel thin film transistor 150 can be manufactured using the crystalline semiconductor film with a predetermined shape in which the crystal planes of the observation plan A are oriented along $\{001\}$, and a p-channel thin film transistor 151 can be manufactured using the crystalline semiconductor film with a predetermined shape in which the crystal plane of the observation plan A are oriented along $\{211\}$ or $\{101\}$.

As described above, after the cap films are formed over the semiconductor film, the semiconductor film is irradiated with a continuous-wave laser beam or a pulsed laser beam with a repetition rate of greater than or equal to 10 MHz through the cap films, whereby the crystalline region in which the crystal planes of the observation plane A are oriented along $\{001\}$ and the crystalline region in which the crystal planes of the observation plane A are oriented along $\{211\}$ or $\{101\}$ can be formed.

The crystalline region in which the crystal planes of the observation plan A are oriented along {001} has an orientation of crystal planes which does not prevent electrons from moving, and the crystalline region in which the crystal planes of the observation plan A are oriented along {211} or {101} has an orientation of crystal planes which does not prevent holes from moving. Thus, an n-type thin film transistor is manufactured using the crystalline region in which the crystal planes of the observation plane A are oriented along {001} and a p-type thin film transistor is manufactured using the crystalline region in which the crystal planes of the observation plane A are oriented along {211} or {101}, whereby a semiconductor device in which mobility of each transistor is increased can be manufactured.

Embodiment Mode 5

In this embodiment mode, power and scanning rate of a laser beam capable of forming a crystalline region in which crystal planes of the observation plane A are oriented along {001}, a crystalline region in which crystal planes of the observation plane A are oriented along {211}, and a crystalline region in which crystal planes of the observation plane A are oriented along {101}, which are described in the above-described embodiment modes will be described with reference to FIG. 6.

Here, as an insulating film functioning as a base film, a $SiN_xO_y$ (x>y) film with a thickness of 50 nm is formed over a substrate by a plasma CVD method, and then a $SiN_xO_y$ (x<y) film with a thickness of 100 nm is formed by a plasma CVD method. Then, an amorphous silicon film with a thickness of 66 nm is formed over the insulating film by a plasma CVD method.

In addition, heat treatment for dehydrogenating the amorphous silicon film is performed after the semiconductor film is formed, and then a cap film is formed over the semiconductor film. As the cap film, a $SiN_xO_y$ (x>y) film with a thickness of 400 nm, or a $SiN_xO_y$ (x<y) film with a thickness of 500 nm is formed. As an example of etching rate of this film, the following is given: etching rate of greater than or equal to 1 nm/min and less than or equal to 150 nm/min, preferably greater than or equal to 10 nm/min and less than or equal to 130 nm/min when etching is performed at 20° C. with the use of a mixed aqueous solution of 7.13% of ammonium hydrogen fluoride and 15.4% of ammonium fluoride or a hydrofluoric acid aqueous solution. As another example of etching rate, the following is given: etching rate of greater than or equal to 100 nm/min and less than or equal to 150 nm/min, preferably greater than or equal to 110 nm/min and less than or equal to 130 nm/min when etching is performed with the use of a hydrofluorocarbon gas. Note that as the cap film, the $SiN_xO_y$ (x>y) film is formed using monosilane and ammonia as reactive gases by a plasma CVD method. In addition, the $SiN_xO_y$ (x<y) film is formed using monosilane, ammonia, and nitrous oxide as reactive gases by a plasma CVD method.

Note that when the cap film is formed, light absorptance of the semiconductor film is changed due to a multilayer film interference effect, and of course, it fluctuates according to the thickness of the cap film. In addition, it is known that the semiconductor film has different light absorptance in a solid state and a melted state. The smaller the difference in light absorptance between the solid state and the melted state is, the larger a margin of laser power of lateral crystal growth becomes. That is, in a case where a solid semiconductor film is irradiated with a laser beam and absorptance is rapidly increased at the moment the semiconductor film is melted, the semiconductor film is easily ablated. Thus, it is needless to say that the laser power in FIG. 6 relatively fluctuates according to the thickness of the semiconductor film or the cap film.

After that, the amorphous silicon film is irradiated with a continuous-wave laser beam or a pulsed laser beam with a repetition rate of greater than or equal to 10 MHz through the cap film. FIG. 6 shows the relationship between scanning rate and power of a laser beam at the time of the irradiation and the orientation of crystal planes of the observation plane A.

In FIG. 6, a horizontal axis indicates a scanning rate of a laser beam and a vertical axis indicates power of the laser beam. Note that portions of the laser beam where the energy distribution is nonuniform in Gaussian distribution at the time of the irradiation are removed by slits, and the area of a beam spot is set to 500 μm×20 μm.

A region 141 is a region indicating conditions by which a crystalline semiconductor film in which crystal grain size is large and crystal planes of the observation plane A are oriented along {001} can be formed.

A region 142 is a region indicating conditions by which a crystalline semiconductor film in which crystal grain size is large and crystal planes of the observation plane A are oriented along {211} can be formed.

A region 143 is a region indicating conditions by which a crystalline semiconductor film in which crystal grain size is large and crystal planes of the observation plane A are oriented along {101} can be formed.

A region 144 is a region indicating conditions by which a crystalline semiconductor film in which crystal grain size is small can be formed.

A region 145 is a region indicating conditions by which part of a crystalline semiconductor film is evaporated.

The power of the laser beam that is capable of forming a crystal in which crystal planes are oriented along {001} for the observation plane A is higher than the power of the laser beam that forms small crystal grains and lower than the power the laser beam that form a crystal in which crystal planes are oriented along {211} for the observation plane A. That is, in the range of scanning rate x of greater than or equal to 10 cm/sec and less than or equal to 20 cm/sec or less, power y of the laser beam is greater than or equal to those which satisfy Formula 1 that shows the power of the laser beam that is capable of forming the crystal in which crystal planes are oriented along {001} and less than those which satisfy Formula 2 that shows the power of the laser beam between the upper limit for forming the crystal in which crystal planes are oriented along {001} for the observation plane A and the lower limit for forming the crystal in which crystal planes are oriented along {211} for the observation plane A. In addition, in the range of scanning rate x of greater than or equal to 20 cm/sec and less than or equal to 35 cm/sec, power y is greater than or equal to those which satisfy Formula 1 and less than Formula 3 that shows the power of the laser beam between the upper limit for forming the crystal in which crystal planes are oriented along {001} for the observation plane A and the lower limit for forming the crystal in which crystal planes are oriented along {211} for the observation plane A.

$$y=0.0012x^2+0.083x+4.4 \quad \text{(Formula 1)}$$

$$y=0.28x+4.2 \quad \text{(Formula 2)}$$

$$y=-0.0683x+11.167 \quad \text{(Formula 3)}$$

The power of the laser beam that is capable of forming the crystal in which crystal planes are oriented along {211} for the observation plane A is higher than the power of the laser beam that forms small crystal grains or the power of the laser beam that forms the crystal in which crystal planes are oriented along {001} for the observation plane A and less than those which satisfy conditions by which a film is ablated or lower than the power of the laser beam that forms a crystalline semiconductor film in which crystal grain size is large and orientations of crystal planes are random.

That is, in the range of scanning rate x of greater than or equal to 10 cm/sec and less than or equal to 20 cm/sec, power y is greater than or equal to those which satisfy Formula 2 and less than or equal to those which satisfy Formula 4 that shows the power of the laser beam that is capable of forming the crystal in which crystal planes are oriented along {211} for the observation plane A. In addition, in the range of scanning rate x of greater than or equal to 20 cm/sec and less than or equal to 35 cm/sec, power y is greater than or equal to those which satisfy Formula 3 and are less than or equal to those which satisfy Formula 4. Moreover, in the range of scanning rate x of greater than or equal to 35 cm/sec and less than or equal to 55 cm/sec, power y is greater than or equal to those which satisfy Formula 1 and less than or equal to those which satisfy Formula 5 that shows the power of the laser beam that is capable of forming the crystal in which crystal planes are oriented along {211} for the observation plane A.

$$y=0.0027x^2+0.36x+4.2 \quad \text{(Formula 4)}$$

$$y=-0.37x+33 \quad \text{(Formula 5)}$$

The power of the laser beam that is capable of forming a crystal in which crystal planes are oriented along {101} for the observation plane A is higher than the power of the laser beam that forms small crystal grains and less than those which satisfy conditions by which a film is ablated or less than the power of the laser beam by which crystal grain size is large and orientations of crystal planes are random.

That is, in the range of scanning rate x of greater than or equal to 70 cm/sec and less than or equal to 90 cm/sec, power y is greater than or equal to those which satisfy Formula 1 and less than those which satisfy conditions by which a film is ablated or less than the power of the laser beam by which crystal grain size is large and orientations of crystal planes are random.

The semiconductor film is selectively irradiated with the laser beam with the above-described power and scanning rate, whereby a crystalline region in which crystal planes are oriented along {001} and a crystalline region in which crystal planes are oriented along {211} can be selectively formed. In addition, the crystalline region in which crystal planes are oriented along {001} and a crystalline region in which crystal planes are oriented along {101} can be selectively formed. Moreover, the crystalline region in which crystal planes are oriented along {001}, the crystalline region in which crystal planes are oriented along {211}, and the crystalline region in which the crystal planes are oriented along {101} can be selectively formed.

The crystalline region in which the crystal planes of the observation plane A are oriented along {001} has an orientation of crystal planes which does not prevent electrons from moving, and the crystalline region in which the crystal planes of the observation plane A are oriented along {211} or {101} has an orientation of crystal planes which does not prevent holes from moving. Thus, an n-type thin film transistor is manufactured using the crystalline region in which the crystal planes of the observation plane A are oriented along {001} and a p-type thin film transistor is manufactured using the crystalline region in which the crystal planes of the observation plane A are oriented along {211} or {101}, whereby a semiconductor device in which mobility of each transistor is increased can be manufactured.

Embodiment Mode 6

In this embodiment mode, a semiconductor film having a polycrystalline structure which is close to a single crystalline structure and a manufacturing method of the semiconductor film, in which a cap film formed of $SiN_xO_y$ (x<y) is formed over an amorphous semiconductor film and the amorphous semiconductor film is irradiated with a continuous-wave laser beam or a pulsed laser beam with a repetition rate of greater than or equal to 10 MHz through the cap film, will be described with reference to FIGS. 5A to 5D.

Figure 5A:
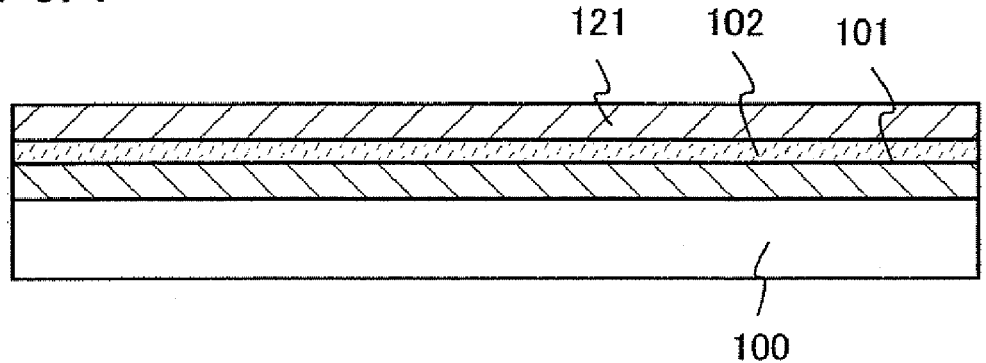
FIGS. 5A to 5D are cross-sectional views illustrating a manufacturing process of a semiconductor device of the present invention.

First, as shown in FIG. 5A, as a substrate 100 with an insulating surface, for example, a glass substrate with a thickness of 0.7 mm is used, and an insulating film 101 functioning as a base film is formed on one surface of the substrate 100. A $SiO_2$ film, a $SiN_x$ film, or a $SiN_xO_y$ (x<y) film with a thickness of greater than or equal to 50 nm and less than or equal to 150 nm is used as appropriate as the insulating film 101 functioning as a base film. In this embodiment mode, as the insulating film 101 functioning as a base film, a $SiN_xO_y$ (x>y) film with a thickness of 50 nm is formed by a plasma CVD method, and then a $SiN_xO_y$ (x<y) film with a thickness of 100 nm is formed by a plasma CVD method.

Next, as a semiconductor film 102, an amorphous semiconductor film is formed over the insulating film 101 to have a thickness of greater than or equal to 10 nm and less than or equal to 100 nm, preferably greater than or equal to 20 nm and less than or equal to 80 nm by a plasma CVD method.

Although, as for the semiconductor film 102, amorphous silicon is used for the semiconductor film in this embodiment mode, the following can also be used: polycrystalline silicon, silicon germanium ($Si_{1-x}Ge_x$ (0<x<0.1)), and silicon carbide (SiC) in which single crystal has a diamond structure. In this embodiment mode, as the semiconductor film 102, an amorphous silicon film with a thickness of 66 nm is formed by a plasma CVD method.

In addition, in a case where the semiconductor film is formed of an amorphous semiconductor film, the semiconductor film may be heated in an electric furnace at 500° C. for 1 hour after the formation of the semiconductor film 102.

Next, as a cap film 121, a $SiN_xO_y$ (0≦x=4/3, 0≦y≦2, x<y) film with a thickness of greater than or equal to 200 nm and less than or equal to 1000 nm is formed over the semiconductor film 102. Note that in particular, the cap film 121 is formed to have a thickness of greater than or equal to 200 nm and less than or equal to 1000 nm, preferably greater than or equal to 300 nm and less than or equal to 600 nm because it becomes difficult to control the orientation of crystal planes of a crystalline semiconductor film which is to be formed later if the cap film 121 is too thin.

The cap film 121 can be formed using monosilane ($SiH_4$), ammonia ($NH_3$), and nitrous oxide ($N_2O$) as reactive gases by a plasma CVD method. Note that nitrous oxide is used as oxidizer, and oxygen which has oxidizing properties may be used instead of nitrous oxide.

The cap film 121 preferably has enough transmittance of a wavelength of a laser beam and a thermal value such as thermal expansion coefficient or a value such as ductility which is close to that of the semiconductor film which is adjacent to the cap film 121. Furthermore, the cap film is preferably a hard and dense film, etching rate of which is low, which is equivalent to that of a gate insulating film of a thin film transistor which is to be formed later. Typically, the cap film 121 is preferably a dense film, etching rate of which is greater than or equal to 100 nm/min and less than or equal to 150 nm/mm, preferably greater than or equal to 110 nm/min and less than or equal to 130 nm/min, when etching is performed at 20° C. with the use of a mixed aqueous solution of 7.13% of ammonium hydrogen fluoride and 15.4% of ammonium fluoride, or a hydrofluoric acid aqueous solution In addition, the cap film 121 is desirably a dense film, etching rate of which is greater than or equal to 100 nm/min and less than or equal to 150 nm/min, preferably greater than or equal to 110 nm/min and less than or equal to 130 nm/min, when dry etching is performed with the use of a hydrofluorocarbon gas. Lowering a film formation rate makes it possible to form such a solid and dense film.

Figure 5B:
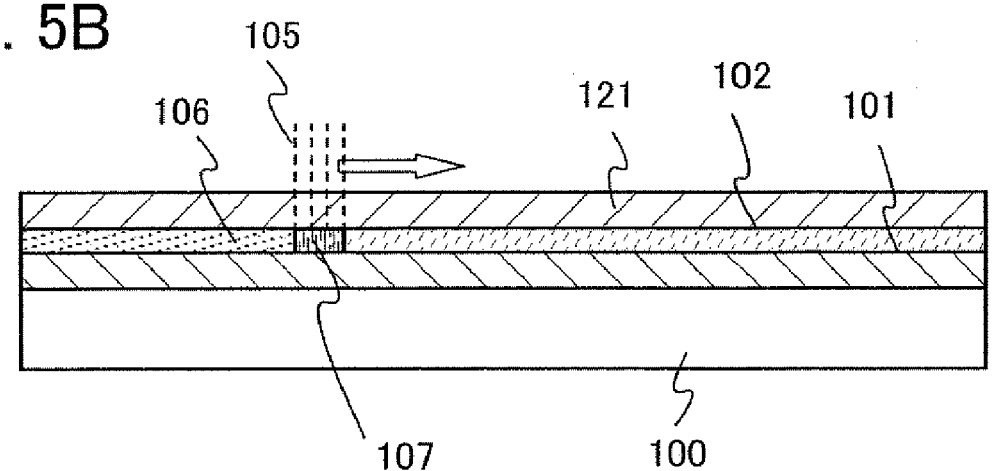

Next, as shown in FIG. 5B, the semiconductor film 102 is irradiated with a first laser beam 105 of a continuous-wave laser or a pulsed laser with a repetition rate of greater than or equal to 10 MHz through the cap film 121. The scanning rate of the laser beam at the time of the irradiation is preferably greater than or equal to 10 cm/sec and less than or equal to 100 cm/sec, and the power thereof is preferably greater than or equal to 4 W and less than or equal to 20 W. By the laser beam irradiation, a region in which the semiconductor is completely melted is formed, a crystal grows along a certain orientation of crystal plane in a solidification step, whereby a crystalline semiconductor film of the present invention can be formed. Here, the scanning rate of the laser beam is greater than or equal to 10 cm/sec and less than or equal to 20 cm/sec, and the power thereof is greater than or equal to 6.8 W and less than or equal to 9.6 W.

Figure 5C:
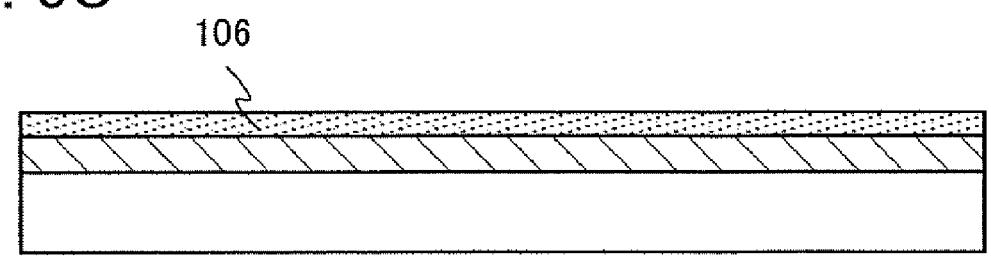

Through the above-described steps, as shown in FIG. 5C, a crystalline semiconductor film in which crystal planes of the observation plane A are oriented along {001} can be formed.

Next, the cap film 121 is removed by etching. After that, a resist is applied on the crystalline semiconductor film, and the resist is exposed to light and developed, whereby a resist is formed into a desired shape. Furthermore, the crystalline semiconductor film exposed by the development is etched using the resist formed in this step as a mask to be removed.

Figure 5D:
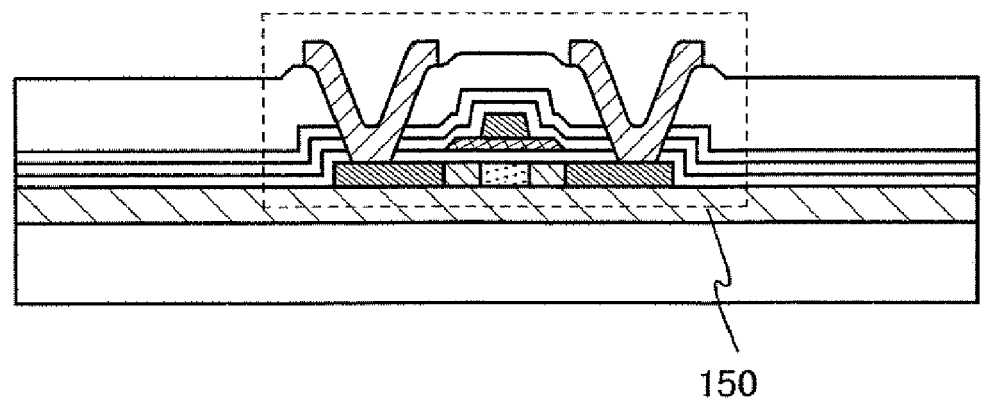

Next, as shown in FIG. 5D, a thin film transistor 150 can be formed using the semiconductor film with a predetermined shape.

As described in Embodiment Mode 1, information on three planes (observation plane A, observation plane B, and observation planes C) which respectively have, as a normal vector, three vectors (vector a, vector b, and vector c) which are orthogonal to one another is synthesized, whereby the orientation of crystal planes inside a crystal can be specified with a high degree of accuracy.

The analysis results of the orientations of crystal planes (the orientation of crystal axis which is perpendicular to the observation plane) of a crystalline semiconductor film are shown in FIGS. 23A to 23F and FIGS. 24A to 24F.

An electron beam was incident on a surface of the crystalline semiconductor film which is formed in this embodiment mode at an incidence angle of 60°, and the orientation of crystal planes was measured according to the obtained EBSP images. The measurement range was 50 μm×50 μm. In this region, the measurement was performed on lattice points each having 0.5 μm in length and width. Since a plane to be measured by EBSP is a sample surface, the crystalline semiconductor film is needed to be an uppermost layer, and therefore the measurement was performed after etching of the cap film after the step shown in FIG. 5C.

A crystalline semiconductor film shown in FIGS. 23A to 23F is a crystalline silicon film which is formed by irradiation with a laser beam, the scanning rate of which is 20 cm/sec and the power of which is 9.6 W.

FIGS. 23A to 23C are each an orientation map image showing an orientation of crystal planes of each measurement point. An orientation map image of the observation plane A is shown in FIG. 23A, an orientation map image of the observation plane B is shown in FIG. 23B, and an orientation map image of the observation plane C is shown in FIG. 23C. In addition, in each of FIGS. 23D to 23F, the calculation result of the orientation of crystal planes of each observation plane is shown, and each orientation of crystal planes is color-coded to be shown. The orientations of crystal planes at the measurement points in FIGS. 23A to 23C are indicated by the colors corresponding to orientations of crystal planes in FIGS. 23D to 23F, respectively.

Note that, distinction of crystals is difficult in FIGS. 23A to 23F because of monochrome and display of only lightness; however, in color display, it is found that the crystal planes are oriented mainly along {001} for the observation plane A, the crystal planes are oriented mainly along {201} for the observation plane B, and the crystal planes are oriented mainly along {201} for the observation plane C.

That is, it is found that in the crystalline semiconductor film formed in this embodiment mode, the crystal planes are oriented mainly along {001}, {201}, and {201} respectively for the observation planes A, B, and C.

In FIGS. 23D to 23F, the calculation results of orientation ratios of the orientations of crystal planes with high frequencies of appearance for observation planes are shown. In FIG. 23D, the result of the orientation ratio for the observation plane A is shown, and the orientation ratio was obtained in such a manner that the range of angle fluctuation of the orientation of crystal planes with respect to {001} was set within ±10°, and a proportion of the number of the measurement points existing within the angle fluctuation of the orientation of crystal planes of ±10° with respect to {001} to all measurement points was obtained. Note that the colored region in FIG. 23A is a region which shows a crystal in which the range of angle fluctuation of the orientation of crystal planes with respect to {001} is within ±10°.

In FIGS. 23E and 23F, similarly to FIG. 23D, the results of the orientation ratios for the observation planes B and C are shown, respectively. Note that the colored regions in FIGS. 23E and 23F show regions in which the range of angle fluctuation of the orientation of crystal planes with respect to {x01} (x=0, 1, 2, 3) is within ±10° respectively for the observation planes B and C. In addition, the colors of the regions are changed depending on the value of x, so that regions corresponding to the orientations of crystal planes of {001}, {301}, {201}, and {101} are separated. Here, an area where the orientations of crystal planes overlap is excluded.

In addition, the value which is the result of a ratio of points having a specific orientation among all measurement points is a value of Partition Fraction. The value which is the result of an orientation ratio of highly-reliable measurement points among the points having a specific orientation in all measurement points is a value of Total Fraction. Consequently, for the observation plane A of the crystalline semiconductor film which is formed in Embodiment Mode 1, the orientation of crystal planes of {001} makes up 72.5% that is greater than or equal to 40% and less than or equal to 100%, preferably greater than or equal to 60% and less than or equal to 100% within the range of angle fluctuation of ±10°.

In FIGS. 23E and 23F, similarly to FIG. 23A, the results of the orientation ratios for the observation planes B and C are shown, respectively. Note that the colored regions in FIGS. 23E and 23F are regions showing crystals in which the range of angle fluctuation of the orientation of crystal planes with respect to {001}, {301}, {201}, and {101} is within ±10°. For the observation plane B of the crystalline semiconductor film which is formed in Embodiment Mode 1, the orientation of crystal planes of {201} makes up 63% that is greater than or equal to 40% and less than or equal to 100%, preferably greater than or equal to 60% and less than or equal to 100% within the range of angle fluctuation of ±10. For the observation plane C, the orientation of crystal planes of {201} makes up 62% that is greater than or equal to 40% and less than or equal to 100%, preferably greater than or equal to 60% and less than or equal to 100% within the range of angle fluctuation of ±10°.

The orientation ratio of each orientation of crystal planes for each of the observation planes A to C and the orientation ratio of {x01} (x=0, 1, 2, 3) (that is, the sum of orientation ratios of {001}, {301}, {201}, and {101} except for the overlapping portion) are shown in Table 1. Note that the values were rounded to the nearest whole number.

Note that the meaning of the orientation of crystal planes of {x01} (x=0, 1, 2, 3) is as follows: the above-described orientation of crystal planes of {x01} means the sum of the orientation ratios of the orientations of crystal planes of {001}, {301}, {201}, and {101}. Note that when the total area of the orientations of crystal planes of {001} to {301} is simply calculated, there is an overlapping portion in part of each orientation of crystal planes. Therefore, calculation was performed under the condition that each overlapping portion of the orientations of crystal planes of {001} to {301} was considered as only an orientation ratio in any one of the orientations of crystal planes, and the calculation result was expressed as {x01}.

TABLE 1

|  | {001} | {301} | {201} | {101} | {x01} |
|---|---|---|---|---|---|
| Observation plane A | 73% |  |  |  |  |
| Observation plane B | 2% | 13% | 63% | 1% | 79% |
| Observation plane C | 2% | 13% | 62% | 5% | 82% |

As described above, for each of three observation planes which are orthogonal to one another, the orientation of crystal planes is aligned in one direction at a high rate. That is, it is found that an approximately single crystal, where the orientation of crystal planes can be regarded as being aligned in one direction, is formed in a crystallized region. In this manner, it was confirmed that crystals having the specific orientation of crystal planes which make up a high percentage of a region with one side of several µm are formed over a glass substrate.

From the above-described results, the orientation of crystal planes of the crystalline semiconductor film which is formed in Embodiment Mode 1 is measured by EBSP, crystals having crystal planes oriented along {001} make up greater than or equal to 40% and less than or equal to 100%, preferably greater than or equal to 60% and less than or equal to 100%, more preferably greater than or equal to 70% and less than or equal to 100% of the observation plane A within the range of angle fluctuation of ±10°. Crystals having crystal planes oriented along {201} make up greater than or equal to 40% and less than or equal to 100%, preferably greater than or equal to 60% and less than or equal to 100% of the observation plane B within the range of angle fluctuation of ±10°. Crystals having crystal planes oriented along {201} make up greater than or equal to 40% and less than or equal to 100%, preferably greater than or equal to 60% and less than or equal to 100% of the observation plane C within the range of angle fluctuation of ±10°.

Next, FIGS. 24A to 24F show the analysis results of the orientations of crystal planes of a crystalline silicon film which is formed when the power and scanning rate of the laser beam in the formation step of the above-described crystalline semiconductor film are changed.

The measurement results by EBSP of a crystalline semiconductor film which is formed using a laser beam having a scanning rate of 10 cm/sec and power of 6.8 W are described below. Note that measurement conditions of EBSP and a formation method of a sample are similar to those in the above-described example.

FIGS. 24A to 24C are each an orientation map image showing an orientation of crystal planes of each measurement point. An orientation map image of the observation plane A is shown in FIG. 24A, an orientation map image of the observation plane B is shown in FIG. 24B, and an orientation map image of the observation plane C is shown in FIG. 24C. In addition, in each of FIGS. 24D to 24F, the calculation result of the orientation of crystal planes of each observation plane is shown, and each orientation of crystal planes is color-coded to be shown. The orientations of crystal planes at the measurement points in FIGS. 24A to 24C are indicated by the colors corresponding to orientations of crystal planes in FIGS. 24D to 24F, respectively.

Note that distinction of crystals is difficult in FIGS. 24A to 24F because of monochrome and display of only lightness; however, in color display, it is found that crystal planes are oriented mainly along {001} for the observation plane A.

In FIGS. 24D to 24F, the calculation results of orientation ratios of the orientations of crystal planes with high frequencies of appearance for observation planes are shown. In FIG. 24D, the result of the orientation ratio for the observation plane A is shown, and the orientation ratio was obtained in such a manner that the range of angle fluctuation of the orientation of crystal planes with respect to {001} was set within ±10°, and a proportion of the number of the measurement points existing within the angle fluctuation of the orientation of crystal planes of ±10° with respect to {001} to all measurement points was obtained. Note that the colored region in FIG. 24D is a region which shows an orientation of crystal planes in which the range of angle fluctuation of the orientation of crystal planes with respect to {001} is within ±10°.

In FIGS. 24E and 24F, similarly to FIG. 24D, the results of the orientation ratios for the observation planes B and C are shown, respectively. Note that the colored regions in FIGS. 24E and 24F show regions in which the range of angle fluctuation of the orientation of crystal planes with respect to {x01} (x=0, 1, 2, 3) is within ±10° respectively for the observation planes B and C. In addition, the colors of the regions are changed depending on the value of x, so that regions corresponding to the orientations of crystal planes of {001}, {301}, {201}, and {101} are separated. Here, an area where the orientations of crystal planes overlap is excluded.

The orientation ratio of each orientation of crystal planes for each of the observation planes A to C and the orientation ratio of {x01} (x=0, 1, 2, 3) (that is, the sum of orientation ratios of {001}, {301}, {201}, and {101} except for the overlapping portion) are shown in Table 2. Note that the values were rounded to the nearest whole number.

TABLE 2

|  | {001} | {301} | {201} | {101} | {x01} |
|---|---|---|---|---|---|
| Observation plane A | 65% | | | | |
| Observation plane B | 23% | 18% | 22% | 5% | 68% |
| Observation plane C | 24% | 20% | 22% | 8% | 74% |

According to Table. 2, it is found that, as for the orientations of crystal planes for the observation plane A, the orientation of crystal planes of {001} makes up 65% that is greater than or equal to 60% within the range of angle fluctuation of ±10°. In addition, it is found that the orientations of crystal planes of {x01} (x=0, 1, 2, 3) for the observation plane B makes up 68% that is greater than or equal to 60% of the observation plane B. Moreover, it is found that the orientations of crystal planes of {x01} (x=0, 1, 2, 3) makes up 74% that is greater than or equal to 60% of the observation plane C. Furthermore, the orientation ratios of the orientations of crystal planes of {x01} (x=0, 2, 3), where the orientation of crystal planes of {101} is excluded, makes up greater than or equal to 60% of each of the observation planes B and C.

That is, it is found that an approximately single crystal, where the orientation of crystal planes can be regarded as being aligned in one direction, is formed in a crystallized region. In this manner, it was confirmed that crystals having the specific orientation of crystal planes which make up a high percentage of a region with one side of several μm are formed over a glass substrate.

Note that the crystalline semiconductor film formed in the present invention is a polycrystalline semiconductor film. Therefore, the orientation ratio of the orientation of crystal planes for each of the observation planes A to C becomes less than 100% if crystal defects such as grain boundaries are included. In addition, the EBSP measurement is possible for a channel region of a thin film transistor, for example. That is, the EBSP measurement is possible for a semiconductor layer which is covered with a gate wiring and a gate insulating film.

According to the above-described results, when the orientation of crystal planes of the crystalline semiconductor film formed in this embodiment mode is measured by EBSP, the orientation of crystal planes of {001} makes up greater than or equal to 40% and less than or equal to 100%, preferably greater than or equal to 60% and less than or equal to 100%, more preferably greater than or equal to 70% and less than or equal to 100% of the observation plane A within the range of angle fluctuation of ±10°. In addition, the sum of the orientations of crystal planes of {x1} (x0, 1, 2, 3) makes up greater than or equal to 40% and less than or equal to 100%, preferably greater than or equal to 100% of the observation plane B within the range of angle fluctuation of ±10°. Moreover, the sum of the orientations of crystal planes of {x01} (x=0, 1, 2, 3) makes up greater than or equal to 40% and less than or equal to 60%, preferably greater than or equal to 60% and less than or equal to 100% of the observation plane C within the range of angle fluctuation of ±10°.

The crystal planes in the crystalline semiconductor film which is formed in this embodiment mode are aligned along one direction or a direction which can be substantially regarded as one direction. That is, the crystalline semiconductor film has a property which is close to that of a single crystalline semiconductor film. The use of such a semiconductor film makes it possible to greatly improve performance of a semiconductor device. For example, in a case where a TFT is formed using this crystalline semiconductor film, field effect mobility (mobility) which is close to that of a semiconductor device formed using a single crystalline semiconductor can be obtained.

In addition, in the TFT, variation in each of an on current value (a value of a drain current which flows when the TFT is on), an off current value (a value of a drain current which flows when the TFT is off), a threshold voltage, subthreshold swing (S value), and field effect mobility can be reduced. Such an effect makes it possible to improve electric characteristics of the TFT, and operation characteristics and reliability of a semiconductor device using the TFT. Thus, a semiconductor device which is capable of high-speed operation, has high current driving ability, and little variation in performance among a plurality of elements can be manufactured.

Embodiment Mode 7

In this embodiment mode, a liquid crystal display device which is an example of a semiconductor device will be described with reference to FIGS. 9A to 9D and FIGS. 10A to 10C. As shown in FIG. 9A, similarly to Embodiment Mode 1, an insulating film 101 functioning as a base film is formed over a substrate 100, a semiconductor film 102 is formed over the insulating film 101, and a cap film 103 is formed over the semiconductor film 102.

In this embodiment mode, a glass substrate is used as the substrate 100, and a $SiN_xO_y$ (x>y) film with a thickness of 40 to 60 nm and $SiN_xO_y$ (x<y) film with a thickness of 80 to 120 nm are formed by a plasma CVD method as the insulating film 101. As the semiconductor film 102, an amorphous semiconductor film with a thickness of 20 to 80 nm is formed by a plasma CVD method. As the cap film 103, $SiN_xO_y$ (x>y) film with a thickness of greater than or equal to 200 nm and less than or equal to 1000 nm is formed by a plasma CVD method.

Next, as shown in FIG. 9B, the semiconductor film 102 is irradiated with a first laser beam 105 from the cap film 103 side to form a crystalline region 106 in which crystal planes for the observation plane A are oriented along {001} over the insulating film 101. In addition, the semiconductor film 102 is irradiated with a second laser beam 108 from the cap film 103 side to form a crystalline region 110 in which crystal planes for the observation plane A are oriented along {211} or {101}. Note that, for the first laser beam 105 and the second laser beam 108, a laser beam having energy capable of melting the semiconductor film 102 and having a wavelength capable of being absorbed by the amorphous semiconductor film 102 is selected. Heat treatment for extracting hydrogen contained in the amorphous semiconductor film or the cap film may be performed before the semiconductor film 102 is irradiated with the laser beams 105 and 108.

In this embodiment mode, as the laser beams 105 and 108, a second harmonic of a $YVO_4$ laser is used, and then the cap film 103 is removed. Although any of various removal methods such as dry etching, wet etching, and polishing can be used as a method of removing the cap film 103, the cap film 103 is removed by dry etching in this embodiment mode.

Next, as shown in FIG. 9C, the crystalline semiconductor film is selectively etched to form semiconductor layers 201 to 203. As an etching method for the crystalline semiconductor film, dry etching, wet etching, or the like can be used. In this embodiment, a resist is applied on the crystalline semiconductor film, and then, light exposure and development are performed, whereby a resist mask is formed. The crystalline semiconductor film is selectively etched by dry etching in which a flow ratio of $SF_6:O_2$ is set to 4:15 with the use of the formed resist mask. After that, the resist mask is removed.

Next, as shown in FIG. 9D, a gate insulating film 204 is formed over the semiconductor layers 201 to 203. The gate insulating film 204 is formed of a single layer or a stacked layer of a $SiN_x$ film, a $SiN_xO_y$ (x>y) film, a $SiO_2$ film, a $SiN_xO_y$ (x<y) film, or the like. In this embodiment mode, a $SiN_xO_y$ (x<y) film with a thickness of 10 to 115 nm is formed by a plasma CVD method. After that, gate electrodes 205 to 208 are formed. The gate electrodes 205 to 208 can be formed of a metal or a polycrystalline semiconductor doped with an impurity having one conductivity type.

In a case of using a metal, tungsten (W), molybdenum (Mo), titanium (Ti), tantalum (Ta), aluminum (Al), or the like can be used. Moreover, metal nitride obtained by nitridation of the metal can also be used. Alternatively, a structure may be employed in which a first layer including the metal nitride and a second layer including the above-described metal are stacked. Alternatively, the gate electrode can be formed in such a manner that paste including particles is formed on the gate insulating film by a droplet discharge method and the paste is dried and burned. Further alternatively, the gate electrode can be formed in such a manner that paste including particles is formed on the gate insulating film by a printing method and the paste is dried and burned. As typical examples of the particles, there are gold, silver, copper, alloy of gold and silver, alloy of gold and copper, alloy of silver and copper, alloy of gold, silver, and copper, and the like.

In this embodiment mode, after a tantalum nitride film with a thickness of 30 nm and a tungsten film with a thickness of 370 nm are formed over the gate insulating film 204 by a sputtering method, the tantalum nitride film and the tungsten film are selectively etched using a resist mask formed by a photolithography process, whereby the gate electrodes 205 to 208 each having a shape in which an end portion of the tantalum nitride film extends out farther to the outside than an end portion of the tungsten film are formed.

Subsequently, with the gate electrodes 205 to 208 used as a mask, either an impurity imparting an n-type conductivity or an impurity imparting a p-type conductivity is added to each of the semiconductor layers 201 to 203, whereby regions 209 to 214 each of which is a source region or a drain region and a high concentration impurity region 215 are formed. In addition, low concentration impurity regions 216 to 223 overlapping with part of the gate electrodes 205 to 208 are formed. Moreover, channel regions 201c to 203c, and 203d respectively overlapping with the gate electrodes 205 to 208 are formed.

Note that, in this embodiment mode, the regions 209, 210, 213, and 214, each of which is the source region or the drain region, the high concentration impurity region 215, and the low concentration impurity regions 216, 217, and 220 to 223 are doped with boron which is an impurity element imparting p-type conductivity. In addition, the regions 211 and 212, each of which is the source region or the drain region, and the low concentration impurity regions 218 and 219 are doped with phosphorus which is an impurity element imparting n-type conductivity.

After that, heat treatment for activating the impurity elements added to the semiconductor layer is performed. In this embodiment mode, the heat treatment is performed at 550° C. for 4 hours in a nitrogen atmosphere. Through the above-described steps, thin film transistors 225 to 227 are formed. Note that a p-channel thin film transistor is employed as the thin film transistor 225 and 227, and an n-channel thin film transistor is employed as the thin film transistors 226. In this case, the p-channel thin film transistor 225 and the n-channel thin film transistor 226 form a driver circuit, and the p-channel thin film transistor 227 functions as an element which applies voltage to a pixel electrode.

Next, as shown in FIG. 10A, a first interlayer insulating film for insulating the gate electrodes of the thin film transistors 225 to 227 and wirings is formed. In this embodiment mode, the first interlayer insulating film is formed of a staked-layer of a silicon oxide film 231, a silicon nitride film 232, and a silicon oxide film 233. Next, over the silicon oxide film 233 which is part of the first interlayer insulating film, wirings 234 to 239 are formed to be connected to the source regions and the drain regions of the thin film transistors 225 to 227, and a connection terminal 240 are formed. In this embodiment mode, a Ti film with a thickness of 100 nm, an Al film with a thickness of 700 nm, and a Ti film with a thickness of 100 nm are consecutively formed by a sputtering method, and then the films are selectively etched using a resist mask formed by a photolithography process, whereby the wirings 234 to 239 and the connection terminal 240 are formed. After that, the resist mask is removed.

Next, the second interlayer insulating film 241 is formed over the first interlayer insulating film, the wirings 234 to 239, and the connection terminal 240. As the second interlayer insulating film 241, an inorganic insulating film such as a silicon oxide film, a silicon nitride film, a $SiN_xO_y$ (x<y) film, or a $SiN_xO_y$ (x>y) film can be used, and a single layer or two or more layers of the insulating films may be used. In addition, as a method of forming the inorganic insulating film, a sputtering method, an LPCVD method, a plasma CVD method, or the like may be used.

In this embodiment mode, after a $SiN_xO_y$ (x>y) film with a thickness of 100 to 150 nm is formed by a plasma CVD method, the $SiN_xO_y$ (x>y) film is selectively etched using a resist mask formed by a photolithography process, whereby the second interlayer insulating film 241 is formed as well as contact holes reaching the connection terminal 240 and the wiring 239 of the thin film transistor 227. After that, the resist mask is removed. As in Embodiment Mode 7, formation of the second interlayer insulating film 241 makes it possible to prevent the TFTs, the wirings, or the like in the driver circuit portion from being exposed and to protect the TFTs from contaminants.

Next, a first pixel electrode 242 is formed to be connected to the wiring 239 of the thin film transistor 227 and a conductive layer 244 is formed to be connected to the connection terminal 240. In a case where a liquid crystal display device is a light-transmissive liquid crystal display device, the first pixel electrode 242 is formed of a conductive film with a light-transmitting property. In addition, in a case where a liquid crystal display device is a reflective liquid crystal display device, the first pixel electrode 242 is formed of a conductive film with reflectivity. In this embodiment mode, the first pixel electrode 242 and the conductive layer 244 are formed in such a manner that a film is formed of ITO containing silicon oxide to have a thickness of 125 nm by a sputtering method and then the ITO film is selectively etched using a resist mask formed by a photolithography process.

Next, an insulating film 243 functioning as an orientation film is formed. The insulating film 243 is formed in such a manner that a high molecular compound layer such as a layer made of polyimide or polyvinyl alcohol is formed by a roll coating method, a printing method, or the like and then rubbing is performed. Alternatively, the insulating film 243 can be formed by deposition of $SiO_2$ from an oblique angle to a substrate. Further alternatively, the insulating film 243 can be formed in such a manner that a photoreactive-type high molecular compound is irradiated with polarized UV light and the photoreactive-type high molecular compound is polymerized. In this embodiment, the insulating film 243 is formed in such a manner that a high molecular compound layer such as a layer made of polyimide or a polyvinyl alcohol is printed by a printing method, burned, and then rubbed.

Next, as shown in FIG. 10B, a second pixel electrode 253 is provided for a counter substrate 251, and an insulating film 254 functioning as an orientation film is formed on the second pixel electrode 253, Note that a colored layer 252 may be provided between the counter substrate 251 and the pixel electrode 253. At this time, a substrate which is similar to the substrate 100 can be selected as appropriate as the counter substrate 251. In addition, the second pixel electrode 253 can be formed in a similar manner to the first pixel electrode 242, and the insulating film 254 functioning as an orientation film can be formed in a similar manner to the insulating film 243. Furthermore, the colored layer 252 is needed for color display, and in a case of the RGB system, a colored layer in which dye and pigment corresponding to each color of red, green, and blue are dispersed is formed corresponding to each pixel.

Next, the substrate 100 and the counter substrate 251 are attached to each other with a sealant 257, and a liquid crystal layer 255 is formed between the substrate 100 and the counter substrate 251. The liquid crystal layer 255 can be formed in such a manner that a liquid crystal material is injected by a vacuum injection method using capillary phenomenon into a region surrounded by the sealant 257 and the insulating films 243 and 254 each functioning as an orientation film. Alternatively, the liquid crystal layer 255 can be formed in such a manner that one side of the counter substrate 251 is provided with the sealant 257 and a liquid crystal material is dropped in a region surrounded by the sealant, and then the substrate 251 and the substrate 100 are pressure-bonded to each other using the sealant under reduced pressure.

The sealing material 257 can be formed using a heat curable epoxy resin, a UV curable acrylic resin, thermoplastic nylon, polyester, or the like by a dispenser method, a printing method, a thermo-compression bonding method, or the like. Note that by application of filler to the sealant 257, a space between the substrate 100 and the counter substrate 251 can be kept. In this embodiment mode, the sealant 257 is formed using a heat curable epoxy resin.

In addition, in order to keep the space between the substrate 100 and the counter substrate 251, a spacer 256 may be provided between the insulating films 243 and 254 each functioning as an orientation film. The spacer can be formed in such a manner that an organic resin is applied and the organic resin is etched into a desired shape, typically a pillar shape or a columnar shape. Alternatively, a bead spacer may be formed as the spacer. Thus, a bead spacer is used as the spacer 256 in this embodiment mode.

In addition, although not shown, one or both of the first substrate 100 and the counter substrate 251 are provided with a polarizing plate.

Next, as shown in FIG. 10C, in a terminal portion 263, a connection terminal is formed to be connected to a gate wiring and a source wiring of a thin film transistor (in FIG. 10C, the connection terminal 240 is formed to be connected to a source wiring or a drain wiring). An FPC (flexible printed circuit) 262 is connected to the connection terminal 240 through the conductive layer 244 and an anisotropic conductive film 261. The connection terminal 240 receives a video signal or a clock signal through the conductive layer 244 and the anisotropic conductive film 261.

In a driver circuit portion 264, circuits for driving a pixel, such as a source driver and a gate driver, are formed. In this embodiment mode, the n-channel thin film transistor 226 and the p-channel thin film transistor 225 are placed. Note that the n-channel thin film transistor 226 and the p-channel thin film transistor 225 form a CMOS circuit.

In a pixel portion 265, a plurality of pixels is formed, and a liquid crystal element 258 is formed in each pixel. The liquid crystal element 258 is a portion where the first pixel electrode 242, the second pixel electrode 253, and the liquid crystal layer 255 provided between the first pixel electrode 242 and the second pixel electrode 253 overlap. Furthermore, the first pixel electrode 242 included in the liquid crystal element 258 is electrically connected to the thin film transistor 227.

Through the above-described steps, a liquid crystal display device can be manufactured. As for the liquid crystal display device described in Embodiment Mode 7, in the semiconductor layers of the thin film transistors formed in the driver circuit portion 264 and the pixel portion 265, the n-type thin film transistor is formed using the crystalline region in which crystal planes of the observation plane A are oriented along {001} and the p-type thin film transistors are formed using the crystalline region in which crystal planes of the observation plane A are oriented along {211} or {101}. Accordingly, a liquid crystal display device in which mobility of each transistor is improved can be manufactured.

Note that crystal planes of crystals of the thin film transistors in this embodiment mode are aligned in a certain direction for each of three planes which are orthogonal to one another. Thus, variations in electrical characteristics of a plurality of thin film transistors can be reduced. As a result, a liquid crystal display device capable of high-resolution display with little partial discoloration and few defects can be manufactured.

Embodiment Mode 8

In this embodiment mode, a manufacturing process of a light-emitting device including a light-emitting element, which is an example of a semiconductor device, will be described. As shown in FIG. 11A, in a similar process to Embodiment Mode 7, the thin film transistors 225 to 227 are formed over the substrate 100 with the insulating film 101 interposed therebetween, and the silicon oxide film 231, the silicon nitride film 232, and the silicon oxide film 233 are stacked as the first interlayer insulating film for insulating the gate electrodes and the wirings of the thin film transistors 225 to 227. Furthermore, over the silicon oxide film 233 that is part of the first interlayer insulating film, wirings 308 to 313 are formed to be connected to the semiconductor layers of the thin film transistors 225 to 227, and a connection terminal 314 is formed.

Next, a second interlayer insulating film 315 is formed over the first interlayer insulating film, the wirings 308 to 313, and the connection terminal 314. Then, a first electrode layer 316 is formed to be connected to the wiring 313 of the thin film transistor 227 and a conductive layer 320 is formed to be connected to the connection terminal 314. The first electrode 316 and the conductive layer 320 are formed in such a manner that a film is formed of ITO containing silicon oxide to have a thickness of 125 nm by a sputtering method and then the ITO film is selectively etched using a resist mask formed in a photolithography process. As in this embodiment mode, formation of the second interlayer insulating film 315 makes it possible to prevent TFTs, wirings, or the like in a driver circuit portion from being exposed and to protect the TFTs from contaminants.

Next, an organic insulating film 317 is formed to cover an end portion of the first electrode layer 316. In this embodiment mode, after photosensitive polyimide is applied and burnt, light exposure and development are performed, whereby the organic insulating film 317 is formed so that a driver circuit, the first electrode layer 316 in a pixel region, and the second interlayer insulating film 315 in the periphery of the pixel region are exposed.

Next, a layer 318 containing a light-emitting substance is formed over part of the first electrode layer 316 and the organic insulating film 317 by an evaporation method. The layer 318 containing a light-emitting substance is formed of an organic compound having a light-emitting property or an inorganic compound having a light-emitting property. Note that the layer 318 containing a light-emitting substance may be formed of an organic compound having a light-emitting property and an inorganic compound having a light-emitting property. In addition, a light-emitting substance emitting red light, a light-emitting substance emitting blue light, and a light-emitting substance emitting green light are used for the layer 318 containing a light-emitting substance, whereby a light-emitting pixel emitting red light, a light-emitting pixel emitting blue light, and a light-emitting pixel emitting green light, respectively can be formed, respectively.

Note that provision of a light-emitting pixel emitting white light as well as the light-emitting pixels emitting red, blue, and green light makes it possible to reduce power consumption.

Next, a second electrode layer 319 is formed over the organic insulating film 317 and the layer 318 containing a light-emitting substance. In this embodiment mode, an Al film with a thickness of 200 nm is formed by an evaporation method. As a result, a light-emitting element 321 is formed of the first electrode layer 316, the layer 318 containing a light-emitting substance, and the second electrode layer 319.

Although, as a material used for the layer 318 containing a light-emitting substance, a single layer or a stacked layer of an organic compound, or a single layer or a stacked layer of an inorganic compound is used in many cases, a structure in which an inorganic compound is contained in part of a film formed of an organic compound may be included in the category of this specification. There is no limitation on a stacking method of layers in the light-emitting element. Any method such as an evaporation method, a spin coating method, a ink jet method, or a dip coating method may be selected as long as layers can be stacked.

Next, as shown in FIG. 11B, a protective film 322 is formed over the second electrode layer 319. The purpose of the protective film 322 is to prevent water, oxygen, or the like from entering the light-emitting element 321 and the protective film 322. The protective film 322 is preferably formed of silicon nitride, silicon oxide, $SiN_xO_y$ (x>y), $SiN_xO_y$ (x<y), aluminum oxynitride, aluminum oxide, DLC (diamond like carbon), CN (nitrogen-containing carbon), or other insulating material by a plasma CVD method, a sputtering method, or the like.

Furthermore, a sealing substrate 324 is attached to the second interlayer insulating film 315 formed over the substrate 100 with a sealant 323, whereby a structure in which the light-emitting element 321 is provided in a space 325 surrounded by the substrate 100, the sealing substrate 324, and the sealant 323 is obtained. Note that the space 325 is filled with filler, and there is also a case where the space 325 is filled with the sealant 323 as well as an inert gas (nitrogen, argon, or the like).

Note that it is desirable to use an epoxy resin for the sealant 323. The material is desirably a material which allows as little water or oxygen as possible to be transmitted. As a material for forming the sealing substrate 324, a plastic substrate made of FRP (fiberglass-reinforced plastics), PVF (polyvinyl fluoride), polyester, acrylic, or the like can be used as well as a glass substrate or a quartz substrate.

Next, as shown in FIG. 11C, in a similar manner to Embodiment Mode 7, an FPC 327 is attached to the conductive layer 320 which is in contact with the connection terminal 314 with the use of an anisotropic conductive layer 326. Through the above-described steps, a semiconductor device including an active matrix light-emitting element can be manufactured.

Figure 12:
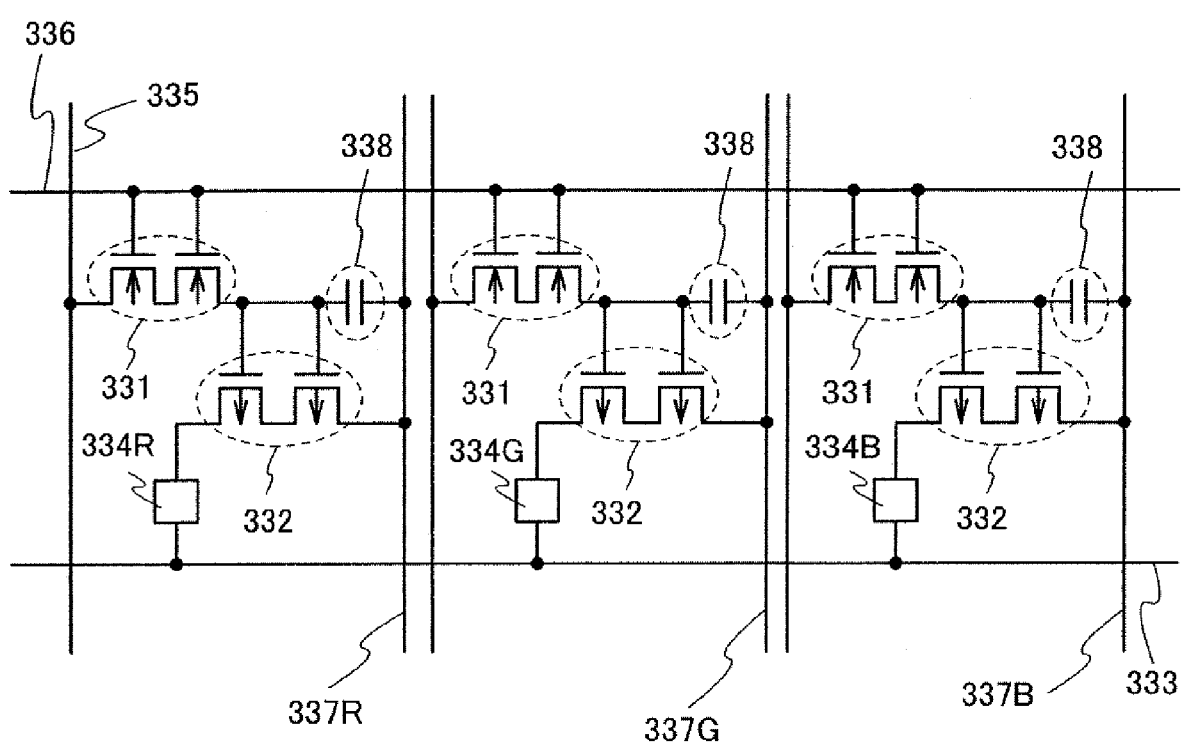
FIG. 12 is a diagram illustrating an equivalent circuit of a light-emitting element applicable to the present invention.

Here, an equivalent circuit diagram of a pixel in a case of full-color display in Embodiment Mode 8 is shown in FIG. 12. In FIG. 12, thin film transistors 332 surrounded by dashed lines correspond to thin film transistors which drive a light-emitting element, Thin film transistors 331 control on and off of thin film transistors 332. Note that a mode is described in which as the light-emitting element, an organic EL element (hereinafter, referred to as OLED) in which a layer containing a light-emitting substance is formed of a layer containing an organic compound is used.

In a pixel for displaying red, an OLED 334R emitting red light is connected to a drain region of a thin film transistor 332, and a source region thereof is provided with a red anode-side power supply line 337R. The switching thin film transistor 331 is connected to a gate wiring 336, and a gate electrode of the driver thin film transistor 332 is connected to a drain region of the switching thin film transistor 331. Note that the drain region of the switching thin film transistor 331 is connected to a capacitor 338 connected to the red anode-side power supply line 337R.

In a pixel for displaying green, an OLED 334G emitting green light is connected to a drain region of a thin film transistor 332, and a source region thereof is provided with a green anode-side power supply line 337G. The switching thin film transistor 331 is connected to a gate wiring 336, and a gate electrode of the driver thin film transistor 332 is connected to a drain region of the switching thin film transistor 331. Note that the drain region of the switching thin film transistor 331 is connected to a capacitor 338 connected to the green anode-side power supply line 337G.

In a pixel for displaying blue, an OLED 334B emitting blue light is connected to a drain region of a thin film transistor 332, and a source region thereof is provided with a blue anode-side power supply line 337B. The switching thin film transistor 331 is connected to a gate wiring 336, and a gate electrode of the driver thin film transistor 332 is connected to the drain region of the switching thin film transistor 331. Note that the drain region of the switching thin film transistor 331 is connected to a capacitor 338 connected to the blue anode-side power supply line 337B.

Different voltage is applied to the pixels displaying different colors, depending on a material of the layer containing a light-emitting substance. Note that, although the source wiring 335 and the anode-side power supply lines 337R, 337G, and 337B are formed in parallel in this embodiment mode, without being limited thereto, the gate wiring 336 and the anode-side power supply lines 337R, 337G, and 337B may be formed in parallel. Furthermore, the driver thin film transistor 332 may have a multi-gate electrode structure.

In the light-emitting device, there is no particular limitation on a driving method for image display, and for example, a dot sequential driving method, a line sequential driving method, an area sequential driving method, or the like may be used. Typically, the line sequential driving method is used, and a time division gray scale driving method or an area gray scale driving method may be used as appropriate. A video signal inputted to the source line of the light-emitting device may be either an analog signal or a digital signal. The driver circuit or the like is preferably designed in accordance with the video signal as appropriate.

As for a light-emitting device using a digital video signal, there are two kinds of driving methods: a driving method in which video signals inputted to a pixel are ones with constant voltage (CV) and a driving method in which video signals inputted to a pixel are ones with constant current (CC). Further, as for the driving method using video signals with constant voltage (CV), there are two kinds of methods: a method in which voltage applied to a light-emitting element is constant (CVCV) and a method in which current applied to a light-emitting element is constant (CVCC). In addition, as for the driving method using video signals with constant current (CC), there are two kinds of methods: a method in which voltage applied to a light-emitting element is constant (CCCV) and a method in which current applied to a light-emitting element is constant (CCCC). In the light-emitting device, a protective circuit (e.g., a protective diode or the like) for preventing electrostatic breakdown may be provided.

Through the above-described steps, the light-emitting device including an active matrix light-emitting element can be manufactured. As for the light-emitting device described in this embodiment mode, an n-type thin film transistor is formed using a crystalline region in which crystal planes of the observation plane A are oriented along {001} and a p-type thin film transistor is formed using a crystalline region in which crystal planes of the observation plane A are oriented along {211} or {101}. Accordingly, a light-emitting device in which mobility of each transistor is improved can be manufactured.

In addition, crystal planes of a crystal of the thin film transistor of this embodiment mode are aligned in a certain direction for each of three planes which are orthogonal to one another. Thus, variation in electrical characteristics of the thin film transistor which drivers the light-emitting element can be reduced. As a result, variation in luminance of the light-emitting element can be reduced, and a light-emitting device capable of high-resolution display with little partial discoloration and few defects can be manufactured.

Embodiment Mode 9

In this embodiment mode, a manufacturing process of a semiconductor device capable of noncontact data transmission will be described with reference to FIGS. 13A to 16D. In addition, a structure of the semiconductor will be described with reference to FIG. 17, and furthermore, application of the semiconductor device described in this embodiment mode will be described with reference to FIGS. 18A to 18F.

Figure 13A:
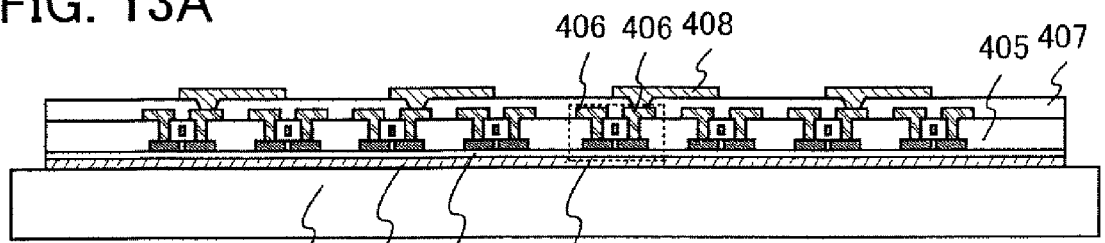
FIGS. 13A to 13E are cross-sectional views illustrating a manufacturing process of a semiconductor device of the present invention.

As shown in FIG. 13A, a peeling film 402 is formed over a substrate 401. Next, an insulating film 403 is formed over the peeling film 402 in a similar manner to Embodiment Modes 1 and 2, and a thin film transistor 404 is formed over the insulating film 403. Then, an interlayer insulating film 405 which insulates a conductive film included in the thin film transistor 404, and source and drain electrodes 406 connected to a semiconductor layer of the thin film transistor 404 are formed.

After that, an insulating film 407 is formed to cover the thin film transistor 404, the interlayer insulating film 405, and the source and drain electrodes 406, and a conductive film 408 is formed to be connected to one of the source electrode 406 and the drain electrode 406 with the insulating film 407 interposed therebetween. As the substrate 401, a substrate which is similar to the substrate 100 can be used. Although, as the substrate, a metal substrate or a stainless-steel substrate with an insulating film formed on one surface thereof, a plastic substrate which can withstand treatment temperature of this process, or the like can be used, a glass substrate is used as the substrate 401 in this embodiment mode.

The peeling film 402 is formed of a single layer or a stacked layer of a layer formed of an element selected from tungsten (W), molybdenum (Mo), titanium (Ti), tantalum (Ta), niobium (Nb), nickel (Ni), cobalt (Co), and silicon (Si), an alloy material containing the above-described element as a main component, or a compound material containing the above-described element as a main component. Note that a crystalline structure of a layer containing silicon, which is the peeling film 402, may be any of an amorphous structure, a microcrystalline structure, and a polycrystalline structure.

In a case where the peeling film 402 has a single-layer structure, a tungsten layer, a molybdenum layer, or a layer containing a mixture of tungsten and molybdenum is preferably formed.

In a case where the peeling film 402 has a stacked-layer structure, a tungsten layer, a molybdenum layer, or a layer containing a mixture of tungsten and molybdenum is preferably formed as a first layer, and oxide, nitride, oxynitride, or nitride oxide of tungsten, molybdenum, or a mixture of tungsten and molybdenum is preferably formed as a second layer. In a case where the peeling film 402 is formed to have a stacked-layer structure of a tungsten layer and a layer containing tungsten oxide, the fact may be utilized that, by formation of a tungsten layer and an insulating oxide film over the tungsten layer, a tungsten oxide layer is formed at an interface between the tungsten layer and the insulating film.

Furthermore, the tungsten oxide layer may be formed in such a manner that thermal oxidation treatment, oxygen plasma treatment, $N_2O$ plasma treatment, treatment with a solution having strong oxidation power, such as ozone water or water containing hydrogen, or the like, is performed on the surface of the tungsten layer. This method can be applied to the cases of forming layers containing nitride, oxynitride, and nitride oxide of tungsten, and after forming the tungsten layer, a silicon nitride layer, a $SiN_xO_y$ (x<y) layer, or a $SiN_xO_y$ (x>y) layer is preferably formed over the tungsten layer.

The oxide of tungsten is expressed by $WO_x$. X is in the range of greater than or equal to 2 and less than or equal to 3: there are $WO_2$ in a case where x is 2, $W_2O_5$ in a case where x is 2.5, $W_4O_{11}$ in a case where x is 2.75, $WO_3$ in a case where x is 3, and the like. In this embodiment mode, a tungsten film with a thickness of 20 to 100 nm, preferably 40 to 80 nm, is formed by a sputtering method. Note that, although the peeling film 402 is formed so as to be in contact with the substrate 401 in the above-described step, the present invention is not limited to this step. An insulating film which serves as a base may be formed so as to be in contact with the substrate 401, and the peeling film 402 may be provided so as to be in contact with the insulating film.

The insulating film 403 formed over the peeling film can be formed in a similar manner to the insulating film 101. In this embodiment mode, plasma is generated with dinitrogen monoxide flowing to form a tungsten oxide film on a surface of the peeling film 402, and then a $SiN_xO_y$ (x<y) layer is formed by a plasma CVD method. The thin film transistor 404 can be formed in a similar manner to the thin film transistors 225 to 227 described in Embodiment Mode 7. The source and drain electrodes 406 can be formed in a similar manner to the wirings 234 to 239 described in Embodiment Mode 7.

The interlayer insulating film 405 and the insulating film 407 which cover the source and drain electrodes 406 can be formed by application and burning of polyimide, acrylic, or siloxane polymer. Alternatively, the interlayer insulating film 405 and the insulating film 407 may be formed of a single layer or a stacked layer of an inorganic compound by a sputtering method, a plasma CVD method, a coating method, a printing method, or the like. As typical examples of the inorganic compound, there are silicon oxide, silicon nitride, and $SiN_xO_y$ (x<y).

Figure 13B:
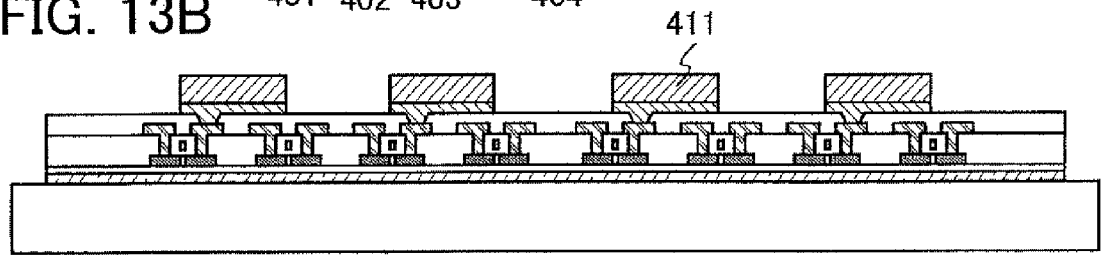

Next, as shown in FIG. 13B, a conductive film 411 is formed over the conductive film 408. In this embodiment mode, the conductive film 411 is formed in such a manner that a composition containing gold particles is printed by a printing method and heated at 200° C. for 30 minutes to be burnt.

Figure 13C:
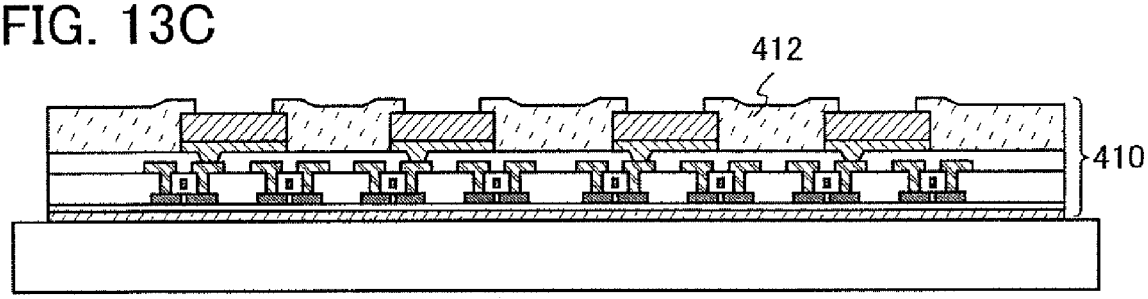

Subsequently, as shown in FIG. 13C, an insulating film 412 which covers the insulating film 407 and end portions of the conductive film 411 is formed. In this embodiment mode, the insulating film 412 which covers the insulating film 407 and the end portions of the conductive film 411 is formed of an epoxy resin. At this formation, a composition of the epoxy resin is applied by a spin coating method and heated at 160° C. for 30 minutes, and then part of the insulating film, which covers the conductive film 411, is removed to expose the conductive film 411, and the insulating film 412 with a thickness of 1 to 20 nm, preferably 5 to 10 μm, is formed as well. Note that, in this embodiment mode, a stacked body from the insulating film 403 to the insulating film 412 is referred to as an element formation layer 410.

Figure 13D:
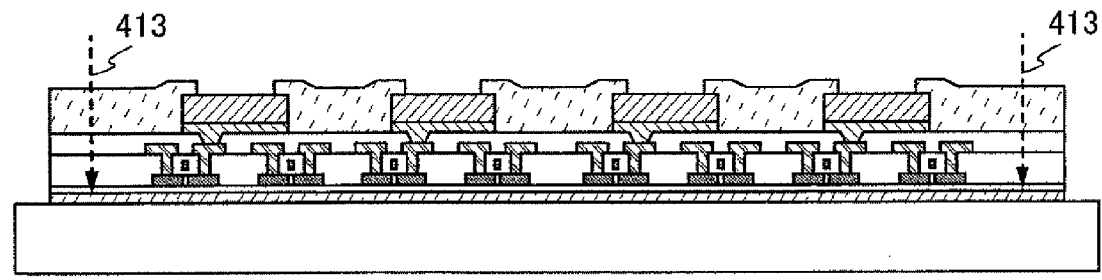
Figure 13E:
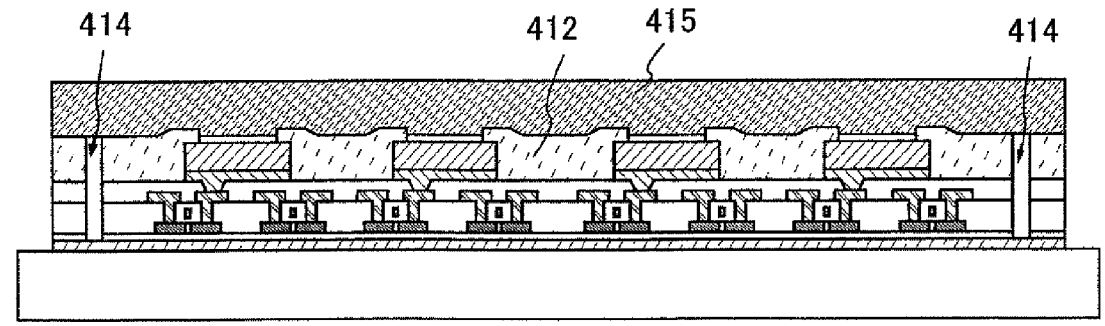

Then, as shown in FIG. 13D, in order to perform a subsequent peeling step easily, the insulating films 403, 405, and 407 and the insulating film 412 are irradiated with a laser beam 413 to form openings 414 as shown in FIG. 13E. After that, an adhesive member 415 is attached to the insulating film 412. The laser beam used to form the openings 414 is preferably a laser beam with a wavelength which is absorbed by the insulating films 403, 405, 407, or the insulating film 412. Typically, a laser beam of an ultraviolet region, a visible region, or an infrared region is selected as appropriate for irradiation.

As a laser oscillator capable of emitting such a laser beam, the following can be used: an excimer laser oscillator such as a KrF excimer laser, an ArF excimer laser, or a XeCl excimer laser; a gas laser oscillator such as a He laser, a He—Cd laser, an Ar laser, a He—Ne laser, an HF laser, or a $CO_2$ laser; a solid-state laser oscillator such as a crystal laser in which a crystal such as YAG, $GdVO_4$, $YVO_4$, YLF, or $YAlO_3$ is doped with Cr, Nd, Er, Ho, Ce, Co, Ti, or Tm, a glass laser, or a ruby laser; or a semiconductor laser oscillator such as a GaN laser, a GaAs laser, a GaAlAs laser, or an InGaAsP laser can be used. In a case of using a solid-state laser oscillator, it is preferable to employ any of the fundamental wave to the fifth harmonic wave as appropriate.

As a result of the laser irradiation, the insulating films 403, 405, 407, and 412 absorb the laser light 413 to be melted, whereby the openings are formed. When the step of irradiating the insulating films 403, 405, 407, and the insulating film 412 with the laser light 413 is omitted, throughput can be improved.

Figure 14A:
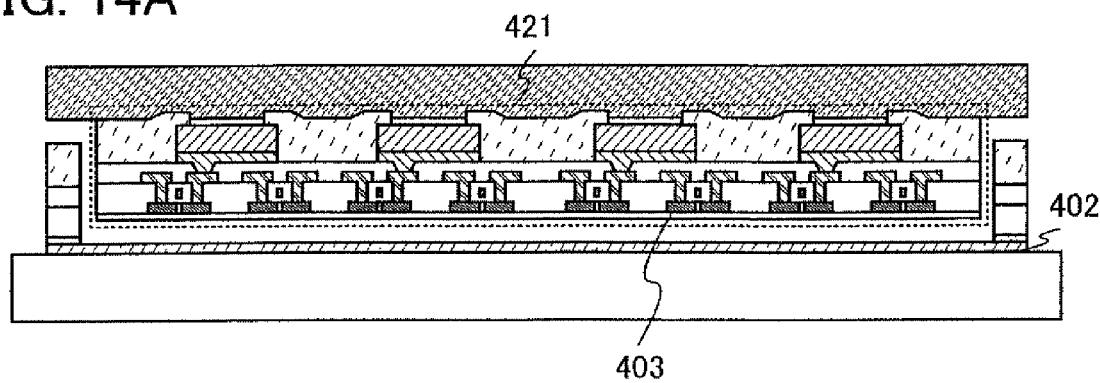
FIGS. 14A to 14D are cross-sectional views illustrating a manufacturing process of a semiconductor device of the present invention.

Next, as shown in FIG. 14A, part 421 of the element formation layer is peeled off from the substrate 401 provided with the peeling film 402 by physical means at a metal oxide film formed at an interface between the peeling film 402 and the insulating film 403. The physical means in this case refers to dynamic means or mechanical means, which changes some kind of dynamic energy (mechanical energy), and typically application of mechanical power (e.g., peeling by human hands or a grip tool, or separation treatment by rotation of a roller).

Although, in Embodiment Mode 9, the method is used in which the metal oxide film is formed between the peeling film and the insulating film to peel off the element formation layer 410 by physical means, the present invention is not limited to this method. A method can be employed in which a light-transmitting substrate is used as the substrate, an amorphous silicon film containing hydrogen is used as the peeling film, and after the step of FIG. 13E, the amorphous silicon film is irradiated with a laser beam from the substrate side to vaporize hydrogen contained in the amorphous silicon film, whereby peeling occurs between the substrate and the peeling film.

After the step of FIG. 13E, alternatively, a method of removing the substrate by mechanical polishing, or a method of removing the substrate with the use of a solution of HF or the like which can dissolve the substrate can be employed. In this case, the peeling film is not needed to be used. Further alternatively, the following method can be used: before attaching a sticking member 415 to the insulating film 412 in FIG. 13E, a fluoride gas such as $NF_3$, $BrF_3$, or $ClF_3$ is introduced into the openings 414, and the peeling film is etched and removed with the fluoride gas; the adhesive member 415 is attached to the insulating film 412; and then the part 421 of the element formation layer is peeled off from the substrate.

Alternatively, the following method can be used: before attaching the adhesive member 415 to the insulating film 412 in FIG. 13E, a fluoride gas such as $NF_3$, $BrF_3$, or $ClF_3$ is introduced into the openings 414, and the peeling layer is partially etched and removed with the fluoride gas; the adhesive member 415 is attached to the insulating film 412; and then the part 421 of the element formation layer is peeled off from the substrate by physical means.

Figure 14B:
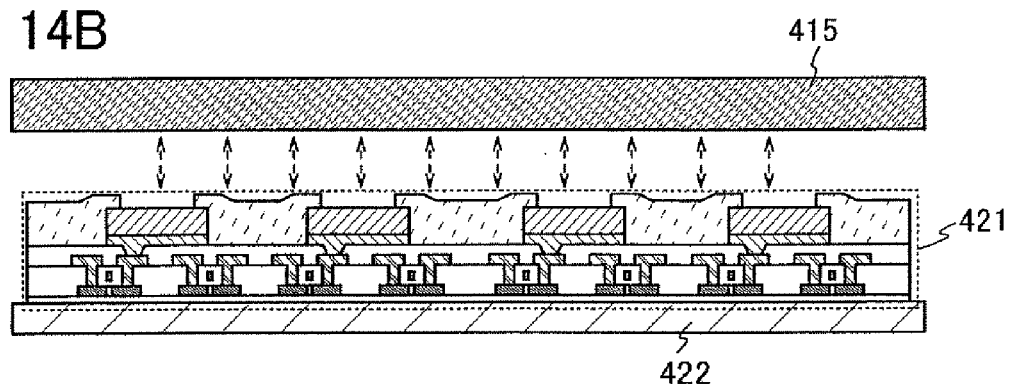
Figure 14C:
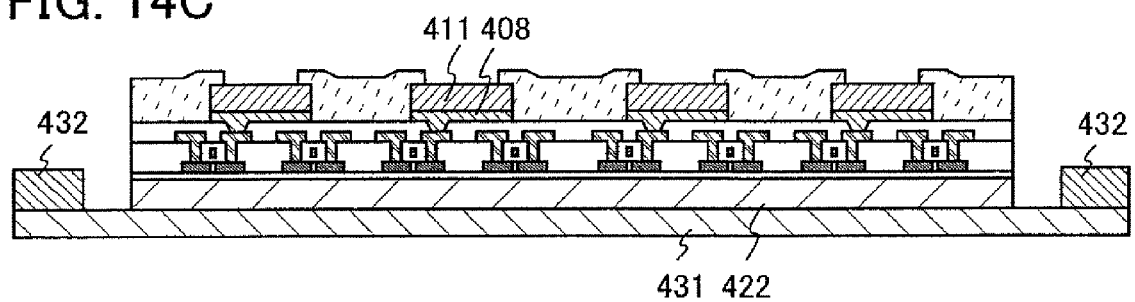
Figure 14D:
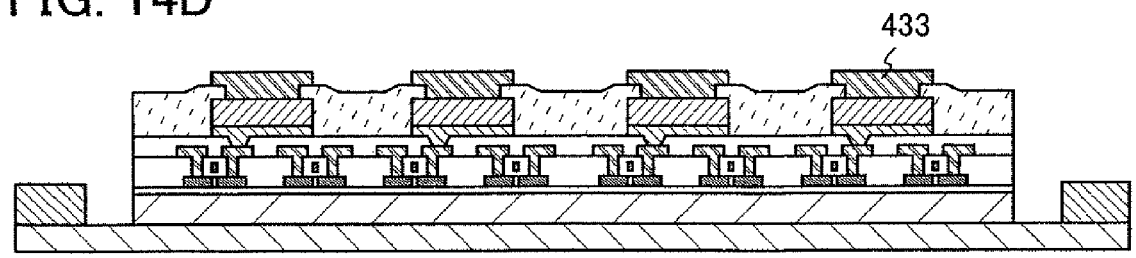

Next, as shown in FIG. 14B, a flexible substrate 422 is attached to the insulating film 403 in the part 421 of the element formation layer, and then the adhesive member 415 is peeled off from the part 421 of the element formation layer. In this embodiment mode, a film formed of polyaniline by a cast method is used as the flexible substrate 422, and then the flexible substrate 422 is attached to a UV sheet 431 of a dicing frame 432 as shown in FIG. 14C. Since this UV sheet 431 is adhesive, the flexible substrate 422 is fixed onto the UV sheet 431. After that, the conductive film 411 may be irradiated with a laser beam to increase adhesiveness between the conductive film 411 and the conductive film 408. Then, a connection terminal 433 is formed over the conductive film 411 as shown in FIG. 14D. By formation of the connection terminal 433, alignment and adhesion with the conductive film which later functions as an antenna can be performed easily.

Figure 15A:
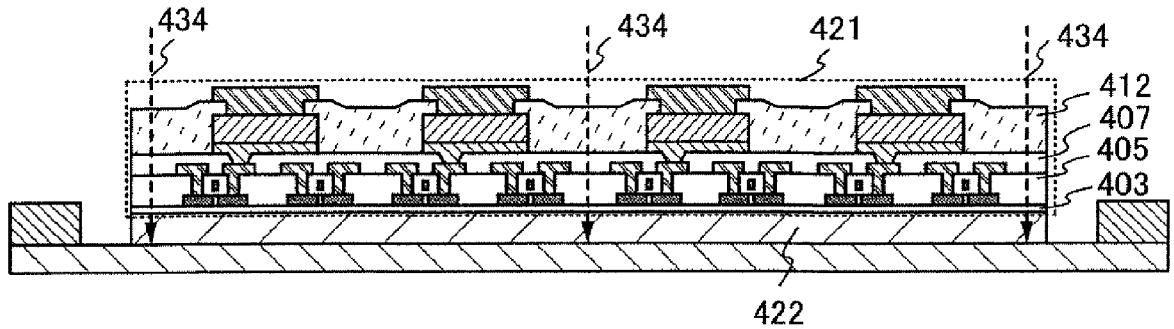
FIGS. 15A to 15C are cross-sectional views illustrating a manufacturing process of a semiconductor device of the present invention.
Figure 15B:
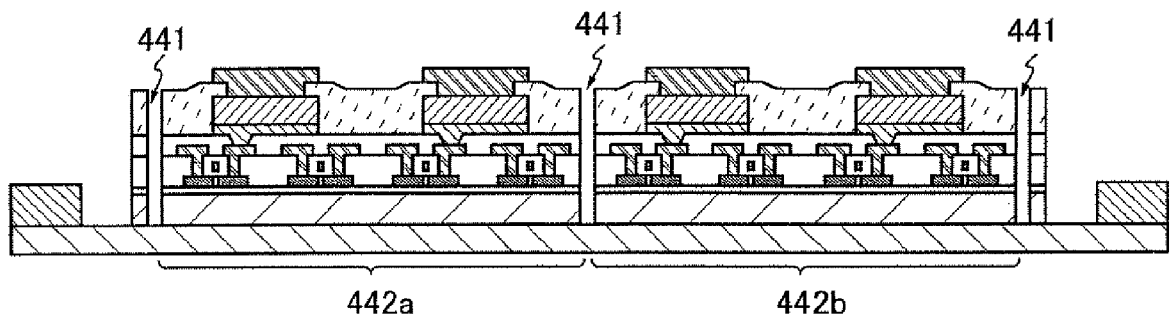

Next, as shown in FIG. 15A, the part 421 of the element formation layer is divided. In this embodiment mode, the part 421 of the element formation layer and the flexible substrate 422 are irradiated with a laser beam 434, whereby the part 421 of the element formation layer is divided into plural sections as shown in FIG. 15B. As the laser beam 434, the laser beam exemplified for the laser beam 413 can be used as appropriate. In this embodiment mode, a laser beam which can be absorbed by the insulating films 403, 405, 407, the insulating film 412, and the flexible substrate 422 is preferably selected. Although, in this embodiment mode, the part of the element formation layer is divided into plural sections by a laser cut method, a dicing method, a scribing method, or the like can be used as appropriate instead of a laser cut method. The divided element formation layers are shown as thin film integrated circuits 442a and 442b.

Figure 15C:
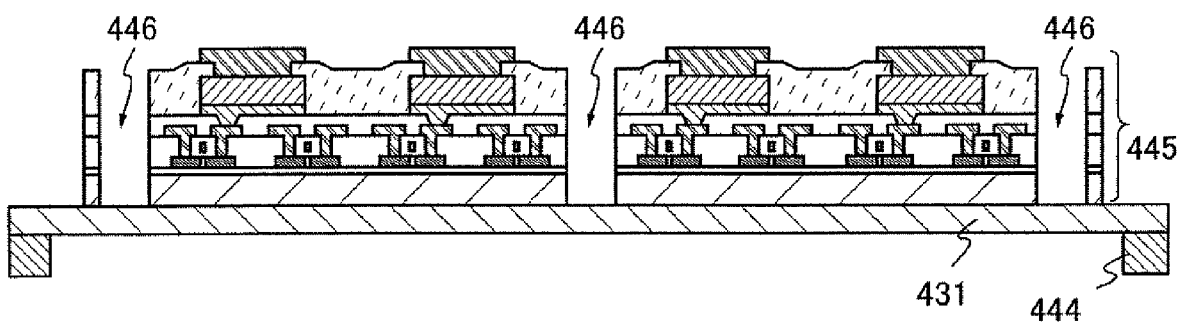

Next, as shown in FIG. 15C, the UV sheet of the dicing frame 432 is irradiated with UV light to decrease the adhesiveness of the UV sheet 431. Then, the UV sheet 431 is supported by an expander frame 444. At this time, the UV sheet 431 is supported with the expander frame 444 while stretching the UV sheet 431, the width of a groove 441 which is formed between the thin film integrated circuits 442a and 442b can be increased. An expanded groove 446 preferably corresponds to the size of an antenna substrate to be later attached to the thin film integrated circuits 442a and 442b.

Figure 16A:
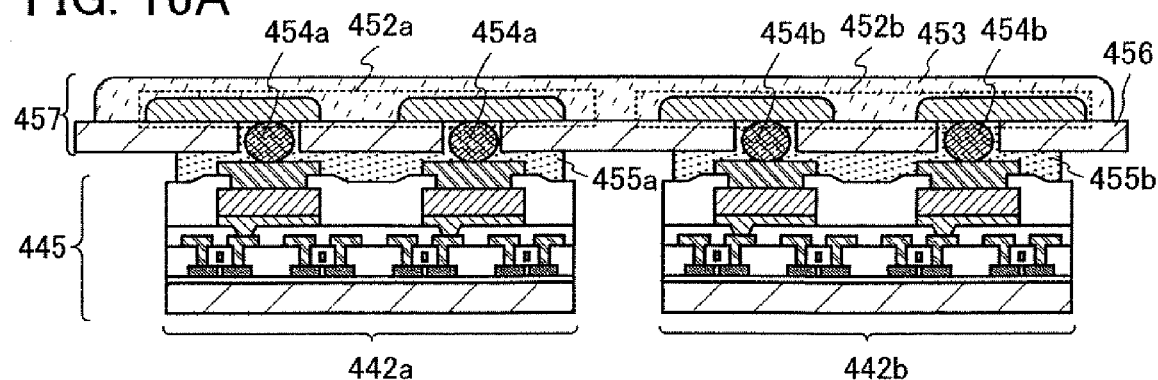
FIGS. 16A to 16D are cross-sectional views illustrating a manufacturing process of a semiconductor device of the present invention.

Next, as shown in FIG. 16A, a flexible substrate 456 provided with conductive films 452a and 452b functioning as antennas is attached to the thin film integrated circuits 442a and 442b with anisotropic conductive adhesives 455a and 455b. The flexible substrate 456 provided with the conductive films 452a and 452b functioning as antennas is provided with openings so as to partially expose the conductive films 452a and 452b. An insulating film 453 which covers the conductive films 452a and 452b functioning as antennas is formed over the flexible substrate 456.

Accordingly, the flexible substrate 456 is attached to the thin film integrated circuits 442a and 442b while adjusting their positions so that the conductive films 452a and 452b functioning as antennas are connected to connection terminals of the thin film integrated circuits 442a and 442b with conductive particles 454a and 454b included in the anisotropic conductive adhesives 455a and 455b. In this embodiment mode, the conductive film 452a functioning as an antenna is connected to the thin film integrated circuit 442a by the conductive particle 454a in the anisotropic conductive adhesive 455a, while the conductive film 452b functioning as an antenna is connected to the thin film integrated circuit 442b by the conductive particle 454b in the anisotropic conductive adhesive 455b.

Figure 16B:
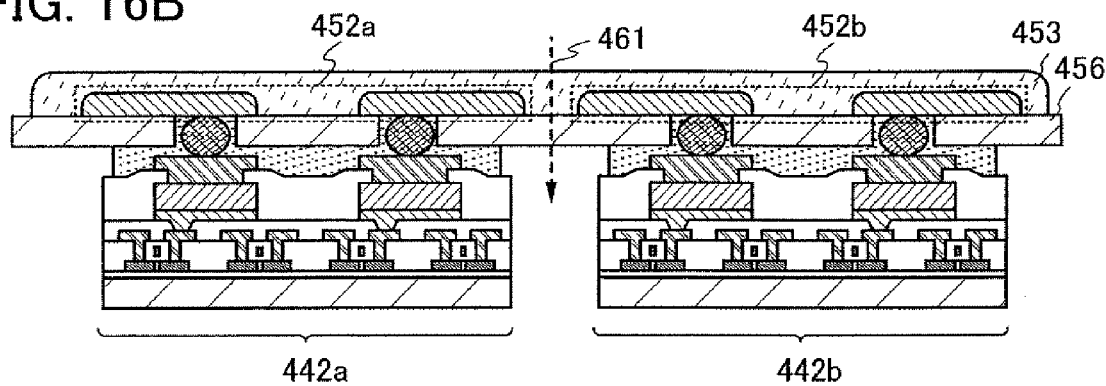
Figure 16C:
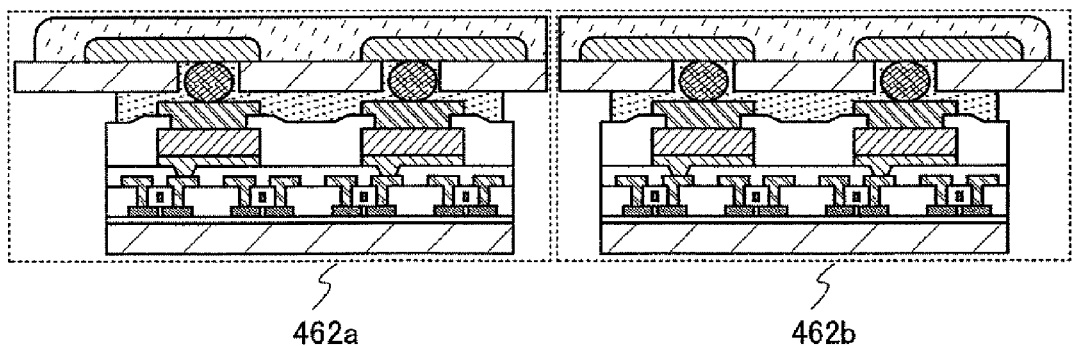

Next, as shown in FIG. 16B, the insulating film 453 and the flexible substrate 456 are divided in a region where the conductive films 452a and 452b functioning an antennas and the thin film integrated circuits 442a and 442b are not formed. In this embodiment mode, the insulating film 453 and the flexible substrate 456 are divided by a laser cut method in which the insulating film 453 and the flexible substrate 456 are irradiated with a laser beam 461. Through the above-described steps, semiconductor devices 462a and 462b capable of noncontact data transmission can be manufactured as shown in FIG. 16C.

Figure 16D:
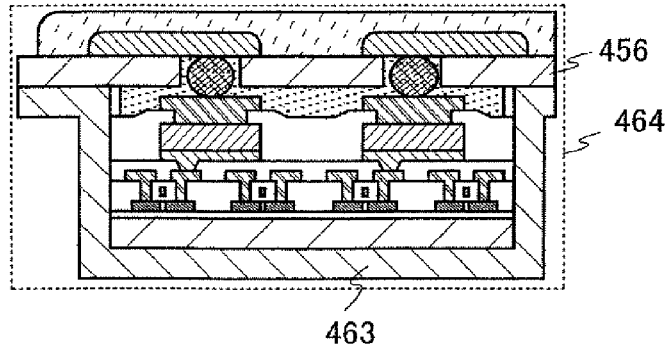

A semiconductor device 464 as shown in FIG. 16D may be manufactured in such a manner that the flexible substrate 456 provided with the conductive films 452a and 452b functioning as antennas is attached to the thin film integrated circuits 442a and 442b with the anisotropic conductive adhesives 455a and 455b in FIG. 16A; a flexible substrate 463 is provided so as to seal the flexible substrate 456 and the thin film integrated circuits 442a and 442b; and the region where the conductive films 452a and 452b functioning as antennas and the thin film integrated circuits 442a and 442b are not formed is irradiated with a laser beam 461 as shown in FIG. 16B. In this case, the thin film integrated circuits are sealed by the divided flexible substrates 456 and 463; therefore, deterioration of the thin film integrated circuits can be suppressed.

Through the above-described steps, a thin and lightweight semiconductor device can be manufactured with high yield. As for the semiconductor device described in this embodiment mode, an n-type thin film transistor is formed using a crystalline region in which crystal planes of the observation plane A are oriented along {001} and a p-type thin film transistor is formed using a crystalline region in which crystal planes of the observation plane A are oriented along {211} or {101}. Accordingly, a semiconductor device in which mobility of each transistor is improved can be manufactured.

In addition, crystal planes of a crystal of the thin film transistor in this embodiment mode are aligned in a certain direction for each of three planes which are orthogonal to one another. Thus, variation in electrical characteristics of the thin film transistors can be suppressed.

Figure 17:
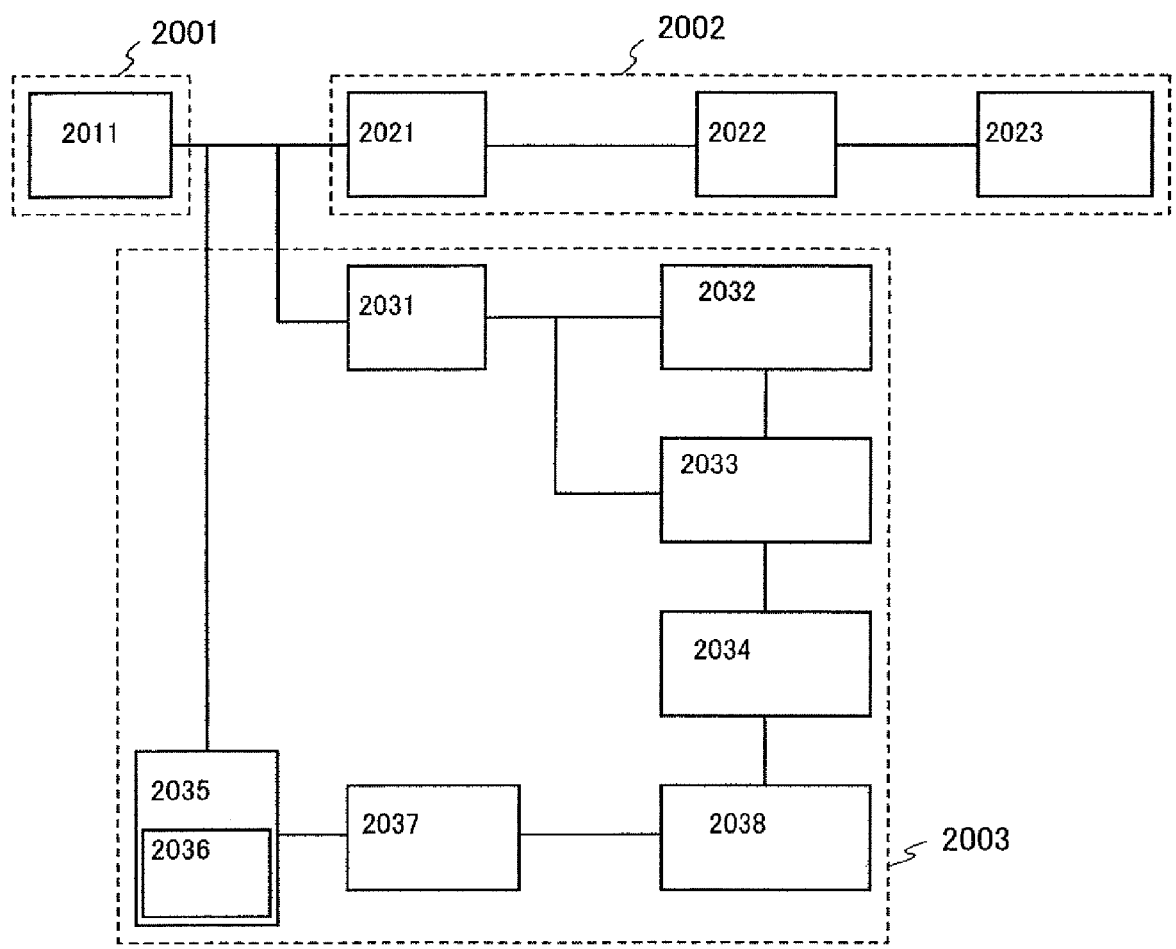
FIG. 17 is a diagram illustrating a structure of a semiconductor device of the present invention.
Figure 18A:
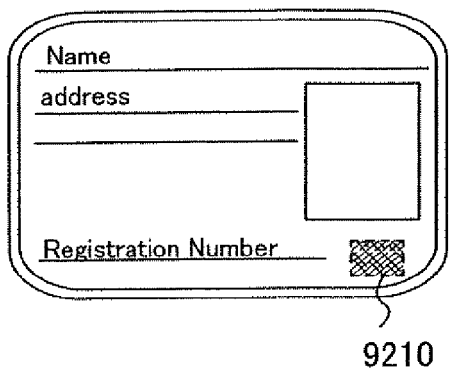
FIGS. 18A to 18F are diagrams illustrating applications of a semiconductor device of the present invention.
Figure 18B:
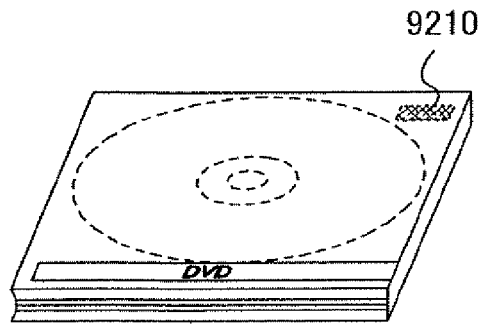
Figure 18C:
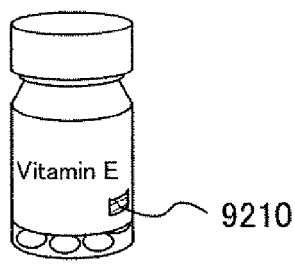
Figure 18D:
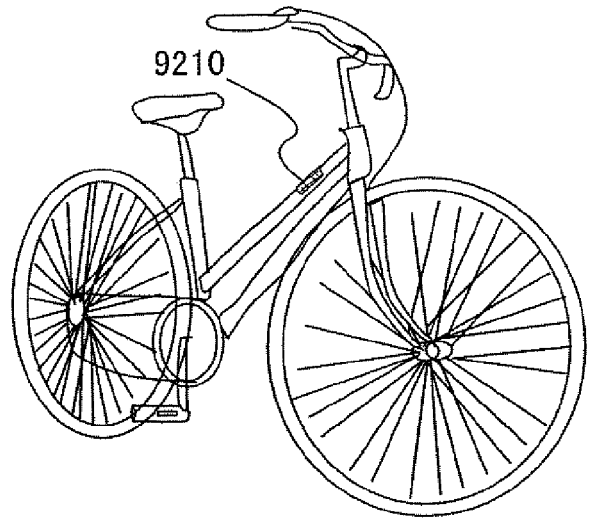
Figure 18E:
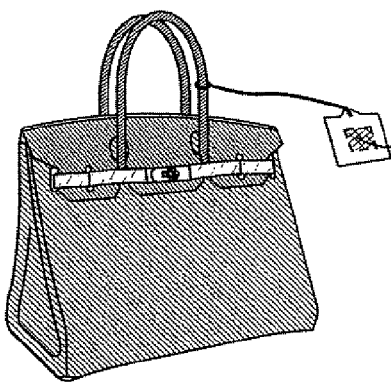
Figure 18F:
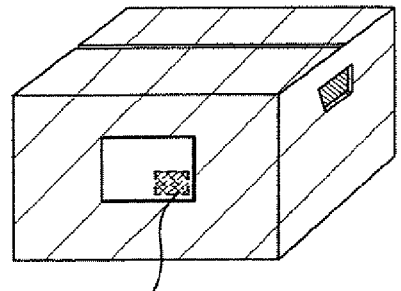

Next, a structure of the semiconductor device capable of noncontact data transmission is described with reference to FIG. 17. The semiconductor device of Embodiment Mode 9 includes an antenna portion 2001, a power supply portion 2002, and a logic portion 2003 as its main components. The antenna portion 2001 includes an antenna 2011 for receiving external signals and transmitting data. A signal transmission method of the semiconductor device can be any of an electromagnetic coupling method, an electromagnetic induction method, and a microwave method. Note that the transmission method may be selected as appropriate in consideration of usage by a practitioner, and an optimum antenna may be provided in accordance with the transmission method.

The power supply portion 2002 includes a rectifier circuit 2021 which produces power supply voltage based on a signal received from the outside through the antenna 2011; a storage capacitor 2022 for storing the produced power supply voltage; and a constant voltage circuit 2023 which produces constant voltage to be supplied to each circuit. The logic portion 2003 includes a demodulating circuit 2031 which demodulates a received signal, a clock generation/correction circuit 2032 which produces a clock signal, a code recognition and determination circuit 2033, a memory controller 2034 which produces a signal for reading data from a memory based on a received signal, a modulation circuit 2035 which modulates an encoded signal for transmitting the encoded signal, an encoding circuit 2037 which encodes the read data, and a mask ROM 2038 which stores data. The modulation circuit 2035 has a resistor 2036 for modulation.

A code recognized and determined by the code recognition/determination circuit 2033 is a frame termination signal (EOF: end of frame), a frame starting signal (SOF: start of frame), a flag, a command code, a mask length, a mask value, and the like. The code recognition/determination circuit 2033 also has a cyclic redundancy check (CRC) function for discriminating transmission errors.

Application of the above-described semiconductor device capable of noncontact data transmission is described with reference to FIGS. 18A to 18F. A semiconductor device 9210 capable of noncontact data transmission has a wide range of applications, such as bills, coins, securities, bearer bonds, documents (e.g., driver's licenses or resident's cards, see FIG. 18A), packaging containers (e.g., wrapping paper or bottles, see FIG. 18C), storage media (e.g., DVD software or video tapes, see FIG. 18B), vehicles (e.g., bicycles, see FIG. 18D), personal belongings (e.g., shoes or glasses), food, plants, animals, human body, clothing, everyday articles, or tags on goods such as electronic appliances or on bags (see FIGS. 18E and 18F).

The semiconductor device 9210 of Embodiment Mode 9 is fixed to an article by being mounted on a printed board, being attached to a surface of the article, being embedded in the article, or the like. For example, the semiconductor device is fixed to an article by being embedded in paper in a case of a book, or by being embedded in an organic resin in a case of a package made of an organic resin. Since the semiconductor device 9210 of Embodiment Mode 9 can be small, thin, and lightweight, it does not degrade the quality of design even after being fixed to an article.

In addition, bills, coins, securities, bearer bonds, certificates, and the like can have an authentication function when provided with the semiconductor devices 9210 of Embodiment Mode 9, and falsification can be prevented if this authentication function is utilized. Moreover, when packing containers, recoding media, personal belongings, food, clothing, everyday articles, electronic appliances, and the like are provided with the semiconductor device of this embodiment mode, a system such as an inspection system can have higher efficiency.

Embodiment Mode 10

As electronic appliances including the semiconductor device shown in any of Embodiment Mode 7 or 9, there are a television device (also simply referred to as a TV or a television receiver), a camera such as a digital camera or a digital video camera, a mobile phone device (also simply referred to as a mobile phone appliance or a mobile phone), a mobile information terminal such as a PDA, a mobile game machine, a monitor for a computer, a computer, a sound reproducing device such as a car audio device, an image reproducing device provided with a recording medium, such as a home-use game machine, and the like. Specific examples of these are described with reference to FIGS. 19A to 19F as Embodiment Mode 10.

Figure 19A:
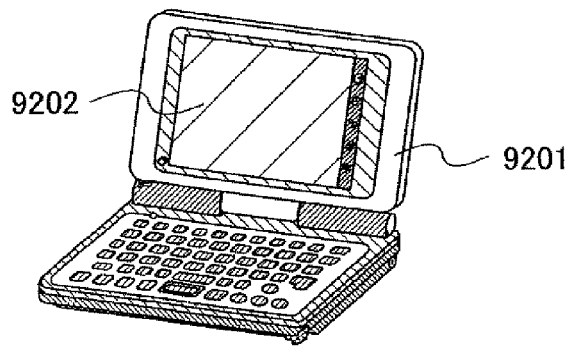
FIGS. 19A to 19F are diagrams illustrating electronic appliances each using a semiconductor device of the present invention.

A mobile information terminal shown in FIG. 19A includes a main body 9201, a display portion 9202, and the like. The semiconductor device described in Embodiment Modes 7 and 8 is applied to the display portion 9202, whereby a mobile information terminal capable of high-definition display can be provided.

Figure 19B:
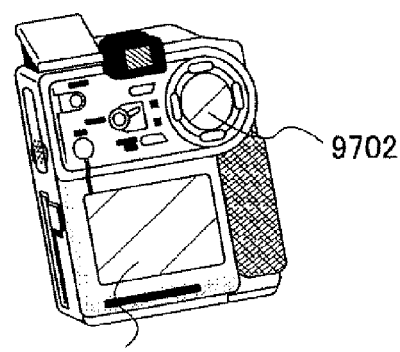

A digital video camera shown in FIG. 19B includes display portions 9701 and 9702, and the like. The semiconductor device described in Embodiment Modes 7 and 8 is applied to the display portion 9701, whereby a digital video camera capable of high-definition display can be provided.

Figure 19C:
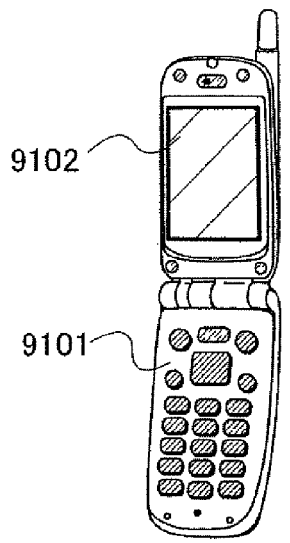

A mobile terminal shown in FIG. 19C includes a main body 9101, a display portion 9102, and the like. The semiconductor device described in Embodiment Modes 7 and 8 are applied to the display portion 9102, whereby a highly-reliable mobile terminal can be provided.

Figure 19D:
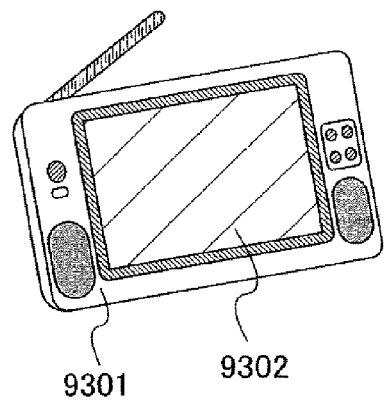

A mobile television device shown in FIG. 19D includes a main body 9301, a display portion 9302, and the like. The semiconductor device described in Embodiment Modes 7 and 8 is applied to the display portion 9302, whereby a mobile television device capable of high-definition display can be provided. Such a television device can be widely applied within the range of a small size which is mounted in a mobile terminal such as a mobile phone to a middle size which is portable, and even applied to a large size (e.g., greater than or equal to 40 inches).

Figure 19E:
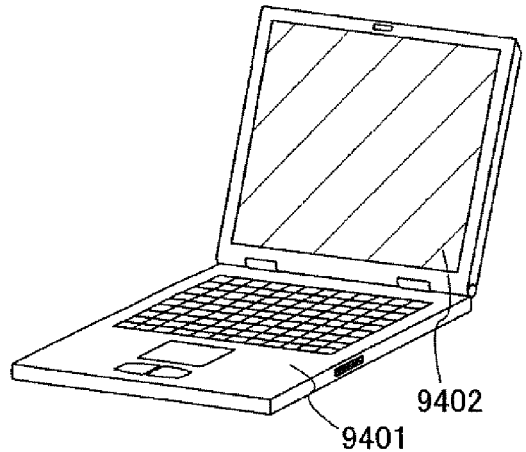

A mobile computer shown in FIG. 19E includes a main body 9401, display portion 9402, and the like. The semiconductor device described in Embodiment Modes 7 and 8 is applied to the display portion 9402, whereby a mobile computer capable of high-definition display can be provided.

Figure 19F:
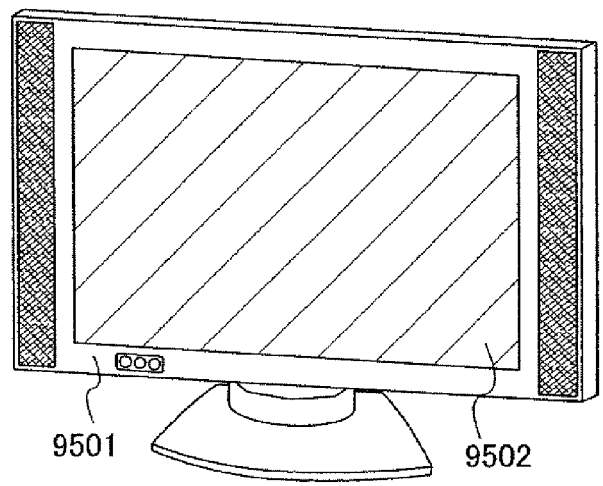

A television device shown in FIG. 19F includes a main body 9501, a display portion 9502, and the like. The semiconductor device described in Embodiment Modes 7 and 8 is applied to the display portion 9502, whereby a television device capable of high-definition display can be provided.

Figure 20:
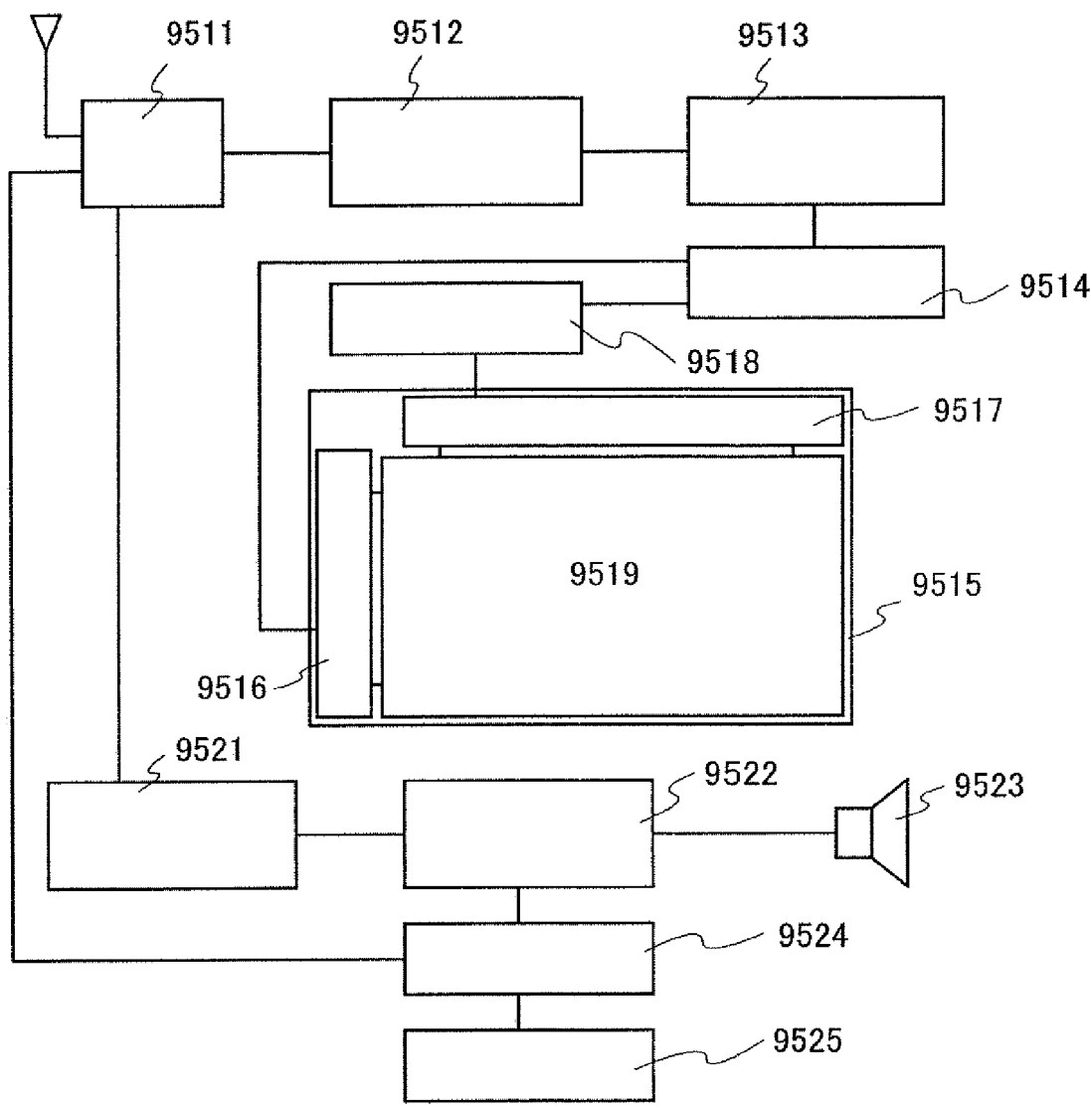
FIG. 20 is a diagram illustrating a structure of an electronic appliance using a semiconductor device of the present invention.

A structure of the television device is described with reference to FIG. 20 in this embodiment mode. FIG. 20 is a block diagram showing a main structure of the television device. A tuner 9511 receives a video signal and an audio signal. The video signal is processed by a video detection circuit 9512, a video signal processing circuit 9513 which converts the signal outputted from the video detection circuit 9512 into a color signal corresponding to red, green, or blue, and a control circuit 9514 for converting the video signal in accordance with input specification of a driver IC.

The control circuit 9514 outputs a signal to each of a scanning line driver circuit 9516 and a signal line driver circuit 9517 of a display panel 9515. In a case of digital driving, a signal driver circuit 9518 may be provided on a signal line side, and the inputted digital signal is divided into m number of signals to be supplied. The scanning line driver circuit 9516 and the signal line driver circuit 9517 are circuits for driving a pixel portion 9519. Among the signals received by the tuner 9511, the audio signal is transmitted to an audio detection circuit 9521 and its output is supplied to a speaker 9523 through an audio signal processing circuit 9522. The control circuit 9524 receives control information such as a receiving station (receiving frequency) and sound volume, and transmits signals to the tuner 9511 and the audio signal processing circuit 9522.

The television device includes the display panel 9515 to be formed; therefore, less power consumption of the television device can be achieved and a television device capable of high-definition display can be manufactured. Note that the present invention is not limited to the television device, and can be applied to various use applications as a large-sized display medium such as an information display board at a train station, an airport, or the like, or an advertisement display board on the street, as well as a monitor of a personal computer.

Figure 21:
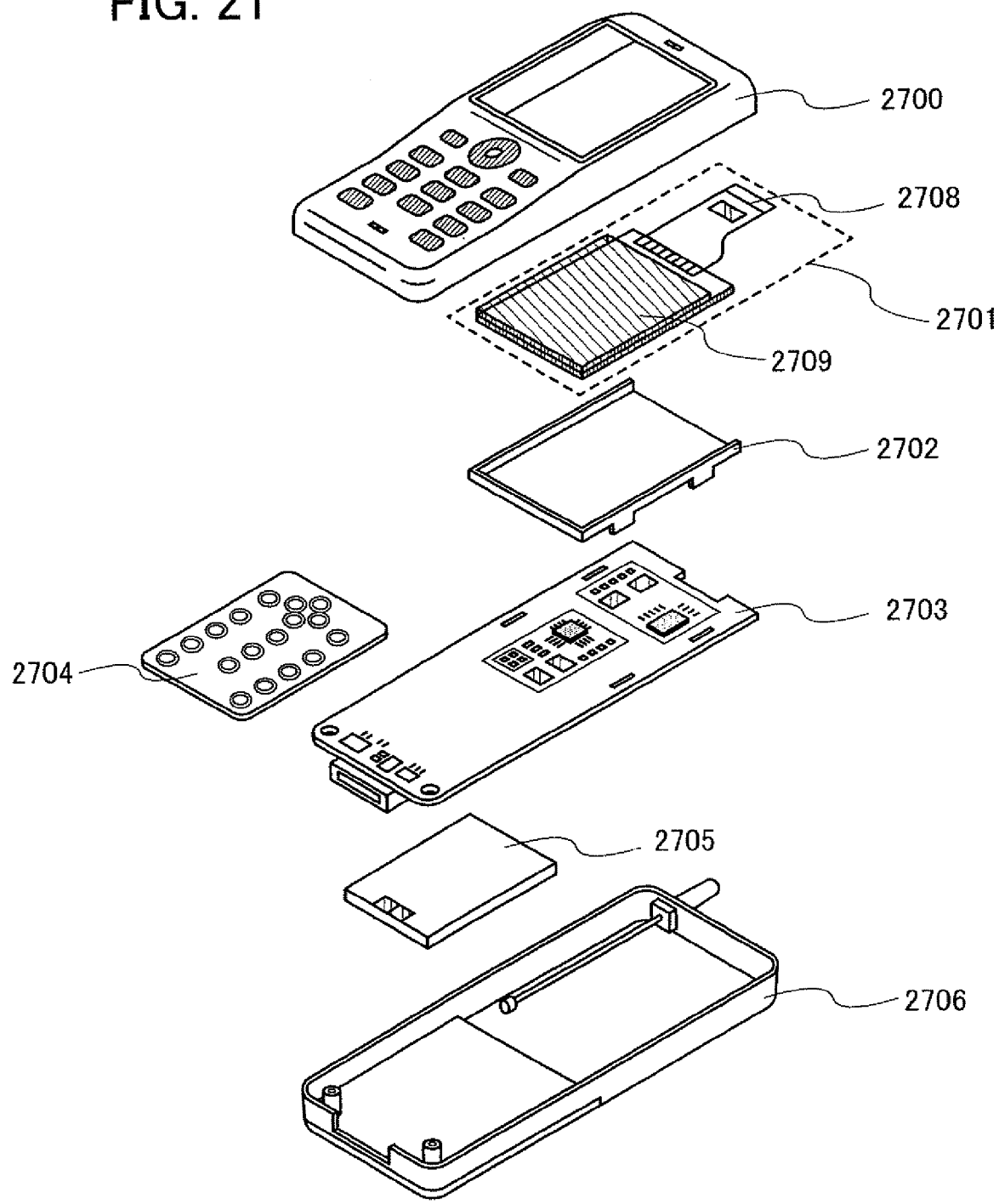
FIG. 21 is a development view illustrating an electronic appliance using a semiconductor device of the present invention.

Next, as one mode of an electronic appliance with the semiconductor device of the present invention mounted, a mobile phone is described with reference to FIG. 21.

The mobile phone appliance includes chassis 2700 and 2706, a panel 2701, a housing 2702, a printed wiring board 2703, operation buttons 2704, and a battery 2705 (see FIG. 21), in which the panel 2701 is detachably incorporated into the housing 2702 and the housing 2702 is fitted into the printed wiring board 2703. The shape and size of the housing 2702 are changed as appropriate in accordance with the electronic appliance to which the panel 2701 is incorporated.

A plurality of semiconductor devices which is packaged is mounted on the printed wiring board 2703. The semiconductor device of the present invention can be used as one of them. The plurality of semiconductor devices mounted on the printed wiring board 2703 have any function of a controller, a central processing unit (CPU), a memory, a power supply circuit, an audio processing circuit, a transmitting/receiving circuit, and the like.

The panel 2701 is connected to the printed wiring board 2703 through a connection film 2708. The panel 2701, the housing 2702, and the printed wiring board 2703 are stored in the chassis 2700 and 2706 together with the operation buttons 2704 and the battery 2705. A pixel region 2709 in the panel 2701 is placed so as to be able to be observed through an opening window provided in the case 2700.

In the panel 2701, a pixel portion and part of a peripheral driver circuit (a driver circuit with low operating frequency among a plurality of driver circuits) may be formed over one substrate with the use of TFTs, whereas the other part of the peripheral driver circuit (a driver circuit with high operating frequency among the plurality of driver circuits) may be formed over an IC chip. The IC chip may be mounted on a panel 2701 by COG (chip on glass), or the IC chip may be connected to a glass substrate with the use of TAB (tape automated bonding) or a printed board.

Figure 22A:
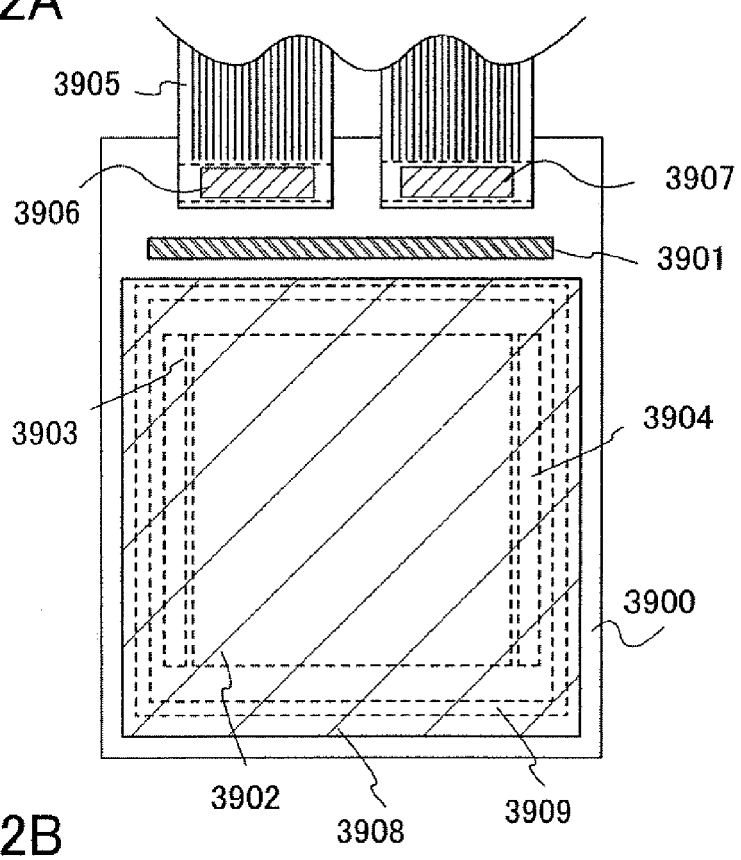
FIGS. 22A and 22B are top views each illustrating a semiconductor device of the present invention.

In FIG. 22A, an example of a structure of a panel in which a pixel portion and part of a peripheral driver circuit are formed over the same substrate and an IC chip including the other part of the peripheral driver circuit is mounted by COG or the like is shown. The panel shown in FIG. 22A includes a substrate 3900, a signal line driver circuit 3901, a pixel portion 3902, a scanning line driver circuit 3903, a scanning line driver circuit 3904, an FPC 3905, an IC chip 3906, an IC chip 3907, a sealing substrate 3908, and a sealant 3909. With such a structure, reduction in power consumption of the display device is achieved, and operating time of the mobile phone per charge can be lengthened. Moreover, cost reduction of the mobile phone can be achieved.

Figure 22B:
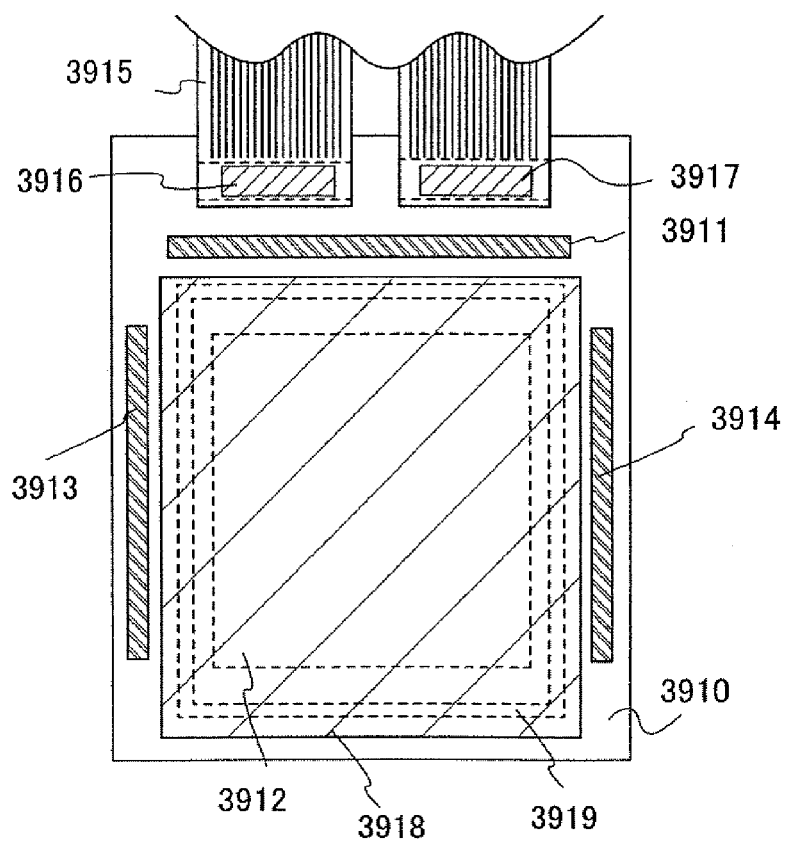

In order to achieve further reduction in power consumption, as shown in FIG. 22B, a pixel portion may be formed over a substrate using TFTs and the entire peripheral driving circuit may be formed over an IC chip, and then the IC chip may be mounted on a display panel by COG (chip on glass) or the like. A display panel in FIG. 22B includes a substrate 3910, a signal line driver circuit 3911, a pixel portion 3912, a scanning line driver circuit 3913, a scanning line driver circuit 3914, an FPC 3915, an IC chip 3916, an IC chip 3917, a sealing substrate 3918, and a sealant 3919.

As described above, the semiconductor device of the present invention is small, thin, and lightweight. With these features, the limited space in the chassis 2700 and 2706 of the electronic appliance can be used effectively. In addition, cost reduction is possible, and an electronic appliance including the semiconductor device with high performance and high reliability can be manufactured.

Embodiment 1

In this embodiment, orientation ratios of crystal planes of a crystalline silicon film in which crystal planes are oriented along {001} for the observation plane A will be described with reference to FIGS. 23A to 23F.

First, a manufacturing method of a crystalline silicon film of Embodiment 1 is described. As described in Embodiment Mode 5 with reference to FIGS. 5A to 5D, a stacked film of a $SiN_xO_y$ (x>y) film and a $SiN_xO_y$ (x<y) film which are insulating films was formed over a substrate by a parallel plate plasma CVD apparatus. As the substrate, a glass substrate with a thickness of 0.7 mm manufactured by Corning, Inc. was used. The film-formation conditions are as follows.
<$SiN_xO_y$ (x>y) Film>
  Thickness: 50 nm
  Type of gas (flow rate): $SiH_4$ (10 sccm), $NH_3$ (100 sccm), $N_2O$ (20 sccm), $H_2$ (400 sccm)
  Substrate temperature: 300° C.
  Pressure: 40 Pa
  RF frequency: 27 MHz
  RF power: 50 W
  Distance between electrodes: 30 mm
  Electrode area: 615.75 cm²
<$SiN_xO_y$ (x<y) Film>
  Thickness: 100 nm
  Type of gas (flow rate): $SiH_4$ (4 sccm), $N_2O$ (800 sccm)
  Substrate temperature: 400° C.
  Pressure: 40 Pa
  RF frequency: 27 MHz
  RF power: 50 W
  Distance between electrodes: 15 mm
  Electrode area: 615.75 cm²

Next, as an amorphous semiconductor film, an amorphous silicon film was formed by a parallel plate plasma CVD apparatus. The film-formation conditions of the amorphous silicon film are as follows.
<Amorphous Silicon Film>
  Thickness: 66 nm
  Type of gas (flow rate): $SiH_4$ (25 sccm), $H_2$ (150 sccm)
  Substrate temperature: 250° C.
  Pressure: 66.7 Pa
  RF frequency: 27 MHz
  RF power: 30 W
  Distance between electrodes: 25 mm
  Electrode area: 615.75 cm²

Next, as a cap film 103, a $SiN_xO_y$ (x<y) film was formed over the amorphous semiconductor film by a parallel plate plasma CVD apparatus. The film-formation conditions are as follows.
<$SiN_xO_y$ (x<y) Film>
  Thickness: 500 nm
  Type of gas (flow rate): $SiH_4$ (4 sccm), $N_2O$ (800 sccm)
  Substrate temperature: 400° C.
  Pressure: 40 Pa
  RF frequency: 60 MHz
  RF power: 150 W
  Distance between electrodes: 28 mm
  Electrode area: 844.53 cm²

The etching rate of the cap film formed under the above-described conditions is greater than or equal to 115 nm/sec and less than or equal to 130 nm/sec when etching is performed with the use of a mixed solution of 7.13% of ammonium hydrogen fluoride and 15.4% of ammonium fluoride. In addition, the etching rate of the cap film is greater than or equal to 90 nm/sec and less than or equal to 100 nm/sec when the etching is performed with the use of 10 to 20 vol % of a hydrofluoric acid aqueous solution. Moreover, the etching rate of the cap film is greater than or equal to 117 nm/sec and less than or equal to 128 nm/sec when dry etching is performed with the use of 35 to 60 sccm of $CHF_3$ and 120 to 190 sccm of He, under the following conditions: bias power of 360 to 540 W, ICP power of 40 to 60 W, pressure of 1 to 10 Pa, and a temperature of 10 to 30° C.

In addition, the density of the cap film at this time is 2.2 g/cm³.

The composition of the obtained cap film 103 is shown in Table 3. The composition of the film shown in Table 3 shows the values of a state before heat treatment and laser irradiation. The composition ratio shown in Table 3 was measured by Rutherford backscattering spectrometry (RBS) and hydrogen forward scattering (HFS). The measurement sensitivity is about ±2%.

TABLE 3

| Composition ratio of cap film (%) | | |
| --- | --- | --- |
| Si | O | H |
| 32.1 | 66.0 | 1.9 |

After the cap film 103 was formed, heating was performed in an electric furnace at 600° C. for 4 hours.

The amorphous silicon film was irradiated with a laser beam through the cap film by a laser irradiation apparatus to be crystallized, whereby a crystalline silicon film was formed. In this embodiment, the movement speed of the substrate was set to 20 cm/sec. An LD excitation $YVO_4$ laser was used as each of two laser oscillators, and its second harmonic (wavelength: 532 nm) was used for the irradiation. The laser beam had an intensity of 9.6 W on an irradiated surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 μm×50 μm and the measurement pitch was 0.5 μm. The analysis results of the orientations of crystal planes of the crystalline silicon film are shown in FIGS. 23A to 23F.

FIG. 23A is an orientation map image showing distribution of orientation of crystal planes of {001} of the observation plane A in the measurement area. FIG. 23B is an orientation map image showing distribution of orientations of crystal planes of {001}, {301}, {201}, and {101} of the observation plane B in the measurement area. FIG. 23C is an orientation map image showing distribution of orientations of crystal planes of {001}, {301}, {201}, and {101} of the observation plane C in the measurement area. In addition, FIGS. 23D to 23F each show the calculation result of the orientation of crystal planes of each observation plane, and each orientation of crystal planes is color-coded to be shown. The orientations of crystal planes at the measurement points in FIGS. 23A to 23C are indicated by the colors corresponding to orientations of crystal planes in FIGS. 23D to 23F, respectively.

Note that distinction of crystals is difficult in FIGS. 23A to 23F because of monochrome and display of only lightness; however, in color display, crystals having the orientation of crystal planes of {001} are formed in a colored portion in FIG. 23A. In FIGS. 23B and 23C, crystals having the orientations of crystal planes of {001}, {301}, {201}, and {101} are formed in colored portions.

FIG. 23D shows the result of the orientation ratio of the crystal in which crystal planes of the observation plane A are oriented along {001}. The colored region is a region which shows an orientation of crystal planes in which the range of angle fluctuation of the orientation of crystal planes of {001} is within ±10°.

FIG. 23E shows the results of the orientation ratios of the crystals in which crystal planes of the observation plane B are oriented along {001}, {301}, {201}, and {101}. FIG. 23F shows the results of the orientation ratios of the crystals in which crystal planes of the observation plane C are oriented along {001}, {301}, {201}, and {101}. In addition, each orientation of crystal planes has a different color, so that regions corresponding to the orientations of crystal planes of {001}, {301}, {201}, and {101} are separated. In this embodiment, a portion where the orientations of crystal planes overlap is excluded.

Table 4 shows the orientation ratio of each orientation of crystal planes for each of the observation planes A to C. Note that the values were rounded to the nearest whole number. As for the observation planes B and C, the orientation ratio of the orientation of crystal planes of {x01} (x=0, 1, 2, 3) is also shown.

TABLE 4

|  | {001} | {301} | {201} | {101} | {x01} |
|---|---|---|---|---|---|
| Observation plane A | 73% | | | | |
| Observation plane B | 2% | 13% | 63% | 1% | 79% |
| Observation plane C | 2% | 13% | 62% | 5% | 82% |

According to Table 4, it is found that, as for the orientations of crystal planes for the observation plane A, the orientation of crystal planes of {001} makes up 73% that is greater than or equal to 40% and less than or equal to 100%, and furthermore greater than or equal to 60% and less than or equal to 100% within the range of angle fluctuation of ±10°. It is also found that, as for the orientations of crystal planes for the observation plane B, the orientation of crystal planes of {201} makes up 63% that is greater than or equal to 40% and less than or equal to 100%, and furthermore greater than or equal to 60% and less than or equal to 100%. It is also found that, as for the orientations of crystal planes for the observation plane C, the orientation of crystal planes of {201} makes up 62% that is greater than or equal to 40% and less than or equal to 100%, and furthermore greater than or equal to 60% and less than or equal to 100%.

As described in this embodiment, the cap film is formed of $SiN_xO_y$ (x<y) and the semiconductor film is irradiated with a laser beam with a scanning rate of 20 cm/sec and laser power of 9.8 W from the cap film side, whereby a crystalline region in which the crystal planes of the observation plane A are oriented along {001} can be formed. In addition, a crystalline region in which the orientation of crystal planes for the observation plane B of {201} makes up greater than or equal to 40% and less than or equal to 100%, and furthermore, greater than or equal to 60% and less than or equal to 100%, and a crystalline region in which the orientation of crystal planes for the observation plane C of {201} makes up greater than or equal to 40% and less than or equal to 100%, and furthermore, greater than or equal to 60% and less than or equal to 100% can be formed.

Embodiment 2

In this embodiment, orientation ratios of orientations of crystal planes of a crystalline silicon film when crystals in which crystal planes are oriented along {001} for the observation plane A were formed in a crystalline semiconductor film which is formed using a laser beam with a scanning rate and power which differ from those of the laser beam in Embodiment 1 will be described with reference to FIGS. 24A to 24F.

First, a manufacturing method of a crystalline silicon film of Embodiment 2 is described. An insulating film, an amorphous semiconductor film, and a cap film were formed over a substrate. The formation steps and formation conditions are similar to those of Embodiment 1.

Next, after heating was performed in an electric furnace at 600° C. for 4 hours, the amorphous silicon film was irradiated with a laser beam through the cap film by a laser irradiation apparatus to be crystallized, whereby a crystalline silicon film was formed. In this embodiment, the movement speed of the substrate was set to 10 cm/sec. An LD excitation $YVO_4$ laser was used as each of two laser oscillators, and its second harmonic (wavelength: 532 nm) was used for the irradiation. The laser beam had an intensity of 6.8 W on an irradiated surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50

μm×50 μm and the measurement pitch was 0.5 μm. The analysis results of the orientations of crystal planes (the orientations of crystal axes which are perpendicular to respective observation planes) of the crystalline silicon film are shown in FIGS. 24A to 24F.

FIGS. 24A to 24C are orientation map images showing distributions of orientations of crystal planes in the measurement areas.

FIG. 24A is an orientation map image showing distribution of orientation of crystal planes of {001} of the observation plane A in the measurement area. FIG. 24B is an orientation map image showing distribution of orientations of crystal planes of {001}, {301}, {201}, and {101} of the observation plane B in the measurement area. FIG. 23C is an orientation map image showing distribution of orientations of crystal planes of {001}, {301}, {201}, and {101} of the observation plane C in the measurement area. In addition, FIGS. 24D to 24F each show the calculation result of the orientation of crystal planes of each observation plane, and each orientation of crystal planes is color-coded to be shown. The orientations of crystal planes at the measurement points in FIGS. 24A to 24C are indicated by the colors corresponding to orientations of crystal planes in FIGS. 24D to 24F, respectively.

Note that distinction of crystals is difficult in FIGS. 24A to 24F because of monochrome and display of only lightness; however, in color display, crystals having the orientation of crystal planes of {001} are formed in a colored portion in FIG. 24A. In each of FIGS. 24B and 24C, crystals having the orientations of crystal planes of {001}, {301}, {201}, and {101} are formed in colored portions.

FIG. 24D shows the result of the orientation ratio of the crystal in which crystal planes of the observation plane A are oriented along {001}. The colored region is a region which shows an orientation of crystal planes in which angle fluctuation of the orientation of crystal planes of {001} is within ±10°.

FIG. 24E shows the results of the orientation ratios of the crystals in which crystal planes of the observation plane B are oriented along {001}, {301}, {201}, and {101}. FIG. 24F shows the results of the orientation ratios of the crystals in which crystal planes of the observation plane C are oriented along {001}, {301}, {201}, and {101}. In addition, each orientation of crystal planes has a different color, so that regions corresponding to the orientations of crystal planes of {001}, {301}, {201}, and {101} are separated. In this embodiment, a portion where the orientations of crystal planes overlap is excluded.

Table 5 shows the orientation ratio of each orientation of crystal planes for each of the observation planes A to C. Note that the values were rounded to the nearest whole number. As for the observation planes B and C, the orientation ratio of the orientation of crystal planes of {x01} (x=0, 1, 2, 3) is also shown.

TABLE 5

|  | {001} | {301} | {201} | {101} | {x01} |
|---|---|---|---|---|---|
| Observation plane A | 65% | | | | |
| Observation plane B | 23% | 18% | 22% | 5% | 68% |
| Observation plane C | 24% | 20% | 22% | 8% | 74% |

According to Table 5, it is found that, as for the orientations of crystal planes for the observation plane A, the orientation of crystal planes of {001} makes up 65% that is greater than or equal to 40% and less than or equal to 100%, and furthermore greater than or equal to 60% and less than or equal to 100% within the range of angle fluctuation of 10°. It is also found that, as for the orientations of crystal planes for the observation plane B, the orientation of crystal planes of {x01} (x=0, 1, 2, 3) makes up 68% that is greater than or equal to 40% and less than or equal to 100%, and furthermore greater than or equal to 60% and less than or equal to 100%. It is also found that, as for the orientations of crystal planes for the observation plane C, the orientation of crystal planes of {x01} (x=0, 1, 2, 3) makes up 74% that is greater than or equal to 40% and less than or equal to 100%, and furthermore greater than or equal to 60% and less than or equal to 100%.

As described in this embodiment, the cap film is formed of $SiN_xO_y$ (x<y) and the semiconductor film is irradiated with a laser beam with a scanning rate of 10 cm/sec and laser power of 6.8 W from the cap film side, whereby a crystalline region in which the crystal planes of the observation plane A are oriented along {001} can be formed. In addition, a crystalline region in which the orientation of crystal planes for the observation plane B of {x01} (x=0, 1, 2, 3) makes up greater than or equal to 40% and less than or equal to 100%, and furthermore, greater than or equal to 60% and less than or equal to 100%, and a crystalline region in which the orientation of crystal planes for the observation plane C of {x01} (x=0, 1, 2, 3) makes up greater than or equal to 40% and less than or equal to 100%, and furthermore, greater than or equal to 60% and less than or equal to 100% can be formed.

Embodiment 3

In this embodiment, orientation ratios of orientations of crystal planes of a crystalline silicon film in which crystal planes are oriented along {001} for the observation plane A will be described with reference to FIGS. 25A to 25F.

First, a manufacturing method of a crystalline silicon film of Embodiment 2 is described. An insulating film and an amorphous semiconductor film were formed over a substrate. The formation steps and formation conditions are similar to those of Embodiment 1.

After that, heating was performed in an electric furnace at 500° C. for 1 hour, and further heating was performed in the electric furnace at 550° C. for 4 hours. Then, an oxide film formed on a surface of the amorphous semiconductor film by heating was removed with hydrofluoric acid. The hydrofluoric acid treatment was performed for 90 seconds. Then, an oxide film was formed over the amorphous semiconductor film with a solution containing ozone, and then the oxide film was removed with hydrofluoric acid. This is performed in order to sufficiently remove impurities on the surface of the amorphous silicon film. The treatment with the solution containing ozone was performed for 40 seconds and the hydrofluoric acid treatment was performed for 90 seconds.

The film-formation conditions are as follows.

<$SiN_xO_y$ (x>y) Film>
thickness: 400 nm
type of gas (flow rate): $SiH_4$ (10 sccm), $NH_3$ (100 sccm), $N_2O$ (20 sccm), $H_2$ (400 sccm)
Substrate temperature: 300° C.
Pressure: 40 Pa
RF frequency: 27 MHz
RF power: 50 W
Distance between electrodes: 30 mm
Electrode area: 615.75 $cm^2$ The etching rate of the cap film formed under the above-described conditions is greater than or equal to 12 nm/sec and less than or equal to 16 nm/sec when etching is performed with the use of a mixed solution of 7.13% of ammonium hydrogen fluoride and 15.4% of ammonium fluoride. In addition, the etching rate of the cap film is greater than or equal to 80 nm/sec and less than or equal to 90 nm/sec when the etching is performed with the use of 10 to 20 vol % of a hydrofluoric acid aqueous solution. Moreover, the etching rate of the cap film is greater than or equal to 118 nm/sec and less than or equal to 119 nm/sec when dry etching is performed with the use of 35 to 60 sccm of $CHF_3$ and 120 to 190 sccm of He, under the following conditions: bias power of 360 to 540 W, ICP power of 40 to 60 W, pressure of 1 to 10 Pa, and a temperature of 10 to 30° C.

In addition, the density of the cap film at this time is 2.1 $g/cm^3$.

The composition of the obtained cap film 103 is shown in Table 6. The composition of the film shown in Table 6 shows the values of a state before heat treatment and laser irradiation. The composition ratio shown in Table 6 was measured by Rutherford backscattering spectrometry (RBS) and hydrogen forward scattering (HFS). The measurement sensitivity is about ±2%.

TABLE 6

| Composition ratio of cap film (%) | | | |
|---|---|---|---|
| Si | N | O | H |
| 32.2 | 45.5 | 5.2 | 17.2 |

After the above-described formation step of the cap film 103, heating was performed in an electric furnace at 600° C. for 4 hours.

The amorphous silicon film was irradiated with a laser beam through the cap film by a laser irradiation apparatus to be crystallized, whereby a crystalline silicon film was formed. In this embodiment, the movement speed of the substrate was set to 10 cm/sec. An LD excitation $YVO_4$ laser was used as each of two laser oscillators, and its second harmonic (wavelength: 532 nm) was used for the irradiation. The laser beam had an intensity of 6.4 W on an irradiated surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 μm×50 μm and the measurement pitch was 0.5 μm. The analysis results of the orientations of crystal planes (the orientations of crystal axes which are perpendicular to respective observation planes) of the crystalline silicon film are shown in FIGS. 25A to 25F.

FIG. 25A is an orientation map image showing distribution of orientation of crystal planes of {001} of the observation plane A in the measurement area. FIG. 25B is an orientation map image showing distribution of orientations of crystal planes of {001}, {301}, {201}, and {101} of the observation plane B in the measurement area. FIG. 25C is an orientation map image showing distribution of orientations of crystal planes of {001}, {301}, {201}, and {101} of the observation plane C in the measurement area. In addition, FIGS. 25D to 25F each show the calculation result of the orientation of crystal planes of each observation plane, and each orientation of crystal planes is color-coded to be shown. The orientations of crystal planes at the measurement points in FIGS. 25A to 25C are indicated by the colors corresponding to orientations of crystal planes in FIGS. 25D to 25F, respectively.

Note that distinction of crystals is difficult in FIGS. 25A to 25F because of monochrome and display of only lightness; however, in color display, crystals having the orientation of crystal planes of {001} are formed in a colored portion in FIG. 25A. In each of FIGS. 25B and 25C, crystals having the orientations of crystal planes of {001}, {301}, {201}, and {101} are formed in colored portions.

FIG. 25D shows the result of the orientation ratio of the crystal in which crystal planes of the observation plane A are oriented along {001}. The colored region is a region which shows an orientation of crystal planes in which angle fluctuation of the orientation of crystal planes of {001} is within ±10°.

FIG. 25E shows the results of the orientation ratios of the crystals in which crystal planes of the observation plane B are oriented along {001}, {301}, {201}, and {101}. FIG. 25F shows the results of the orientation ratios of the crystals in which crystal planes of the observation plane C are oriented along {001}, {301}, {201}, and {101}. In addition, each orientation of crystal planes has a different color, so that regions corresponding to the orientations of crystal planes of {001}, {301}, {201}, and {101} are separated. In this embodiment, a portion where the orientations of crystal planes overlap is excluded.

Table 7 shows the orientation ratio of each orientation of crystal planes for each of the observation planes A to C. Note that the values were rounded to the nearest whole number. As for the observation planes B and C, the orientation ratio of the orientation of crystal planes of {x01} (x=0, 1, 2, 3) is also shown.

TABLE 7

| | {001} | {301} | {201} | {101} | {x01} |
|---|---|---|---|---|---|
| Observation plane A | 76% | | | | |
| Observation plane B | 10% | 46% | 11% | 5% | 72% |
| Observation plane C | 10% | 57% | 10% | 9% | 86% |

According to Table 7, it is found that, as for the orientations of crystal planes for the observation plane A, the orientation of crystal planes of {001} makes up 76% that is greater than or equal to 40% and less than or equal to 100%, and furthermore greater than or equal to 60% and less than or equal to 100% within the range of angle fluctuation of ±10°. It is also found that, as for the orientations of crystal planes for the observation plane B, the orientation of crystal planes of {301} makes up 46% that is greater than or equal to 40% and less than or equal to 100%. It is also found that, as for the orientations of crystal planes for the observation plane C, the orientation of crystal planes of {301} makes up 57% that is greater than or equal to 40% and less than or equal to 100%.

As described in this embodiment, the cap film is formed of $SiN_xO_y$ (x>y) and the semiconductor film is irradiated with a laser beam with a scanning rate of 10 cm/sec and laser power of 6.4 W from the cap film side, whereby a crystalline region in which the crystal planes of the observation plane A are oriented along {001} can be formed. In addition, a crystalline region in which the orientation of crystal planes for the observation plane B of {x01} (x=0, 1, 2, 3) makes up greater than or equal to 40% and less than or equal to 100%, and a crystalline region in which the orientation of crystal planes for the observation plane C of {x01} (x=0, 1, 2, 3) makes up greater than or equal to 40% and less than or equal to 100% can be formed.

Embodiment 4

In this embodiment, orientation ratios of orientations of crystal planes of a crystalline silicon film when crystals in which crystal planes are oriented along {001} for the observation plane A were formed under different conditions from those of Embodiments 1 to 3 will be described with reference to FIGS. 26A to 26F.

First, a manufacturing method of a crystalline silicon film of Embodiment 4 is described. An insulating film and an amorphous semiconductor film were formed over a substrate. The formation steps and formation conditions are similar to those of Embodiment 3.

Next, heating was performed in an electric furnace at 500° C. for 1 hour, and then an oxide film on a surface of the amorphous semiconductor film was removed with hydrofluoric acid. Then, a cap film ($SiN_xO_y$ (x>y)) was formed under the similar conditions to those of Embodiment 3.

The amorphous silicon film was irradiated with a laser beam through the cap film by a laser irradiation apparatus to be crystallized, whereby a crystalline silicon film was formed. In this embodiment, the movement speed of the substrate was set to 20 cm/sec. An LD excitation $YVO_4$ laser was used as each of two laser oscillators, and its second harmonic (wavelength: 532 nm) was used for the irradiation. The laser beam had an intensity of 8.8 W on an irradiated surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 μm×50 μm and the measurement pitch was 0.5 μm. The analysis results of the orientations of crystal planes (the orientations of crystal axes which are perpendicular to respective observation planes) of the crystalline silicon film are shown in FIGS. 26A to 26F.

FIGS. 26A to 26C are orientation map images showing distributions of orientations of crystal planes in the measurement areas.

FIG. 26A is an orientation map image showing distribution of orientation of crystal planes of {001} of the observation plane A in the measurement area. FIG. 26B is an orientation map image showing distribution of orientations of crystal planes of {001}, {301}, {201} and {101} of the observation plane B in the measurement area. FIG. 26C is an orientation map image showing distribution of orientations of crystal planes of {001}, {301}, {201}, and {101} of the observation plane C in the measurement area. In addition, FIGS. 26D to 26F each show the calculation result of the orientation of crystal planes of each observation plane, and each orientation of crystal planes is color-coded to be shown. The orientations of crystal planes at the measurement points in FIGS. 26A to 26C are indicated by the colors corresponding to orientations of crystal planes in FIGS. 26D to 26F, respectively.

Note that distinction of crystals is difficult in FIGS. 26A to 26F because of monochrome and display of only lightness; however, in color display, crystals having the orientation of crystal planes of {001} are formed in a colored portion in FIG. 26A. In each of FIGS. 26B and 26C, crystals having the orientations of crystal planes of {001}, {301}, {201}, and {101} are formed in colored portions.

FIG. 26D shows the result of the orientation ratio of the crystal in which crystal planes of the observation plane A are oriented along {001}. The colored region is a region which shows an orientation of crystal planes in which angle fluctuation of the orientation of the crystal planes of {001} is within ±10°.

FIG. 26E shows the results of the orientation ratios of the crystals in which crystal planes of the observation plane B are oriented along {001}, {301}, {201}, and {101}. FIG. 26F shows the results of the orientation ratios of the crystals in which crystal planes of the observation plane C are oriented along {001}, {301}, {201}, and {101}. In addition, each orientation of crystal planes has a different color, so that regions corresponding to the orientations of crystal planes of {001}, {301}, {201}, and {101} are separated. In this embodiment, a portion where the orientations of crystal planes overlap is excluded.

Table 8 shows the orientation ratio of each orientation of crystal planes for each of the observation planes A to C. Note that the values were rounded to the nearest whole number. As for the observation planes B and C, the orientation ratio of the orientation of crystal planes of {x01} (x=0, 1, 2, 3) is also shown.

TABLE 8

|  | {001} | {301} | {201} | {101} | {x01} |
|---|---|---|---|---|---|
| Observation plane A | 83% | | | | |
| Observation plane B | 0% | 65% | 20% | 1% | 86% |
| Observation plane C | 0% | 71% | 21% | 0% | 92% |

According to Table 8, it is found that, as for the orientations of crystal planes for the observation plane A, the orientation of crystal planes of {001} makes up 83% that is greater than or equal to 40% and less than or equal to 100%, and furthermore greater than or equal to 60% and less than or equal to 100% within the range of angle fluctuation of ±10°. It is also found that, as for the orientations of crystal planes for the observation plane B, the orientation of crystal planes of {301} makes up 65% that is greater than or equal to 40% and less than or equal to 100%, and furthermore greater than or equal to 60% and less than or equal to 100%. It is also found that, as for the orientations of crystal planes for the observation plane C, the orientation of crystal planes of {301} makes up 71% that is greater than or equal to 40% and less than or equal to 100%, and furthermore greater than or equal to 60% and less than or equal to 100%.

As described in this embodiment, the cap film is formed of $SiN_xO_y$ (x>y) and the semiconductor film is irradiated with a laser beam with a scanning rate of 20 cm/sec and laser power of 8.8 W from the cap film side, whereby a crystalline region in which the crystal planes of the observation plane A are oriented along {001} can be formed. In addition, a crystalline region in which the orientation of crystal planes for the observation plane B of {301} makes up greater than or equal to 40% and less than or equal to 100%, and furthermore, greater than or equal to 60% and less than or equal to 100%, and a crystalline region in which the orientation of crystal planes for the observation plane C of {301} makes up greater than or equal to 40% and less than or equal to 100%, and furthermore, greater than or equal to 60% and less than or equal to 100% can be formed.

Embodiment 5

In this embodiment, orientation ratios of orientations of crystal planes of a crystalline silicon film when crystals in which crystal planes are oriented along {211} for the observation plane A were formed will be described with reference to FIGS. 27A to 27F.

First, a manufacturing method of a crystalline silicon film of Embodiment 5 is described. An insulating film, an amorphous semiconductor film, and a cap film ($SiN_xO_y$, (x<y)) were formed over a substrate. The formation steps and formation conditions are similar to those of Embodiment 1.

Next, heating was performed in an electric furnace at 600° C. for 4 hours, and then the amorphous silicon film was irradiated with a laser beam through the cap film by a laser irradiation apparatus to be crystallized, whereby a crystalline silicon film was formed. In this embodiment, the movement speed of the substrate was set to 10 cm/sec. An LD excitation $YVO_4$ laser was used as each of two laser oscillators, and its second harmonic (wavelength: 532 nm) was used for the irradiation. The laser beam had an intensity of 8 W on an irradiated surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 μm×50 μm and the measurement pitch was 0.5 μm. The analysis results of the orientations of crystal planes (the orientations of crystal axes which are perpendicular to respective observation planes) of the crystalline silicon film are shown in FIGS. 27A to 27F.

FIGS. 27A to 27C are orientation map images showing distributions of orientations of crystal planes in the measurement areas. In addition, FIGS. 27D to 27F each show the calculation result of the orientation of crystal planes of each observation plane, and each orientation of crystal planes is color-coded to be shown. The orientations of crystal planes at the measurement points in FIGS. 27A to 27C are indicated by the colors corresponding to orientations of crystal planes in FIGS. 27D to 27F, respectively.

Note that distinction of crystals is difficult in FIGS. 27A to 27F because of monochrome and display of only lightness; however, in color display, crystals having the orientations of crystal planes of {211}, {111}, and {101} are formed in colored portions in FIGS. 27A to 27C, respectively.

FIGS. 27D to 27F show the results of the orientation ratios of the crystals in which crystal planes of the observation planes A to C, respectively, are oriented along {211}, {111}, and {101}. In FIG. 27D, the whole colored region is a region which shows an orientation of crystal planes in which angle fluctuation of orientation of crystal planes of {211} is within ±10°. In FIG. 27E, the whole colored region is a region which shows an orientation of crystal planes in which angle fluctuation of orientation of crystal planes of {111} is within ±10. In FIG. 27F, the whole colored region is a region which shows an orientation of crystal planes in which angle fluctuation of orientation of crystal planes of {101} is within ±10°. In addition, each orientation of crystal planes has a different color, so that regions corresponding to the orientations of crystal planes of {101}, {111}, and {211} are separated.

Table 9 shows the orientation ratio of each orientation of crystal planes for each of the observation planes A to C. Note that the values were rounded to the nearest whole number.

TABLE 9

| Observation plane A | {211} 47% |
|---|---|
| Observation plane B | {111} 45% |
| Observation plane C | {101} 55% |

According to Table 9, it is found that, as for the orientations of crystal planes for the observation plane A, the orientation of crystal planes of {211} makes up 47% that is greater than or equal to 40% within the range of angle fluctuation of ±10°. In addition, it is found that, as for the orientations of crystal planes for the observation plane B, the orientation of crystal planes of {111} makes up 45% that is greater than or equal to 40%. Moreover, it is found that, as for the orientations of crystal planes for the observation plane C, the orientation of crystal planes of {101} makes up 55% that is greater than or equal to 40%.

As described in this embodiment, the cap film is formed of $SiN_xO_y$ (x<y) and the semiconductor film is irradiated with a laser beam with a scanning rate of 10 cm/sec and laser power of 8.0 W from the cap film side, whereby a crystalline region in which the crystal planes for the observation plane A of {211} makes up greater than or equal to 40% and less than or equal to 100% can be formed. In addition, a crystalline region in which the orientation of crystal planes for the observation plane B of {111} makes up greater than or equal to 40% and less than or equal to 100%, and a crystalline region in which the orientation of crystal planes for the observation plane C of {101} makes up greater than or equal to 40% and less than or equal to 100% can be formed.

Embodiment 6

In this embodiment, orientation ratios of orientations of crystal planes of a crystalline silicon film when a crystal in which crystal planes are oriented along {211} for the observation plane A was formed under different conditions from those of Embodiment 5 will be described with reference to FIGS. 28A to 28F.

First, a manufacturing method of a crystalline silicon film of Embodiment 6 is described. An insulating film, an amorphous semiconductor film, and a cap film ($SiN_xO_y$, (x<y)) were formed over a substrate. The formation steps and formation conditions are similar to those of Embodiment 1.

Next, heating was performed in an electric furnace at 600° C. for 4 hours, and then the amorphous silicon film was irradiated with a laser beam through the cap film by a laser irradiation apparatus to be crystallized, whereby a crystalline silicon film was formed. In this embodiment, the movement speed of the substrate was set to 20 cm/sec. An LD excitation $YVO_4$ laser was used as each of two laser oscillators, and its second harmonic (wavelength: 532 nm) was used for the irradiation. The laser beam had an intensity of 10.4 W on an irradiated surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the condition that the measurement area was 50 μm×50 μm and the measurement pitch was 0.5 μm. The analysis results of the orientations of crystal planes (the orientations of crystal axes which are perpendicular to respective observation planes) of the crystalline silicon film are shown in FIGS. 28A to 28F.

FIGS. 28A to 28C are orientation map images showing distributions of orientations of crystal planes in the measurement areas. The length of one side of each map image is 50 μm. In addition, FIGS. 28D to 28F each show the calculation result of the orientation of crystal planes of each observation plane, and each orientation of crystal planes is color-coded to be shown. The orientations of crystal planes at the measurement points in FIGS. 28A to 28C are indicated by the colors corresponding to orientations of crystal planes in FIGS. 28D to 28F, respectively.

Note that distinction of crystals is difficult in FIGS. 28A to 28F because of monochrome and display of only lightness; however, in color display, crystals having the orientations of crystal planes of {211}, {111}, and {101} are formed in colored portions in FIGS. 28A to 28C, respectively.

FIGS. 28D to 28F show the results of the orientation ratios of the crystals in which crystal planes of the observation planes A to C, respectively, are oriented along {211}, {111}, and {101}. In FIG. 28D, the whole colored region is a region which shows an orientation of crystal planes in which angle fluctuation of orientation of crystal planes of {211} is within ±10°. In FIG. 28E, the whole colored region is a region which shows an orientation of crystal planes in which angle fluctuation of orientation of crystal planes of {111} is within ±10°. In FIG. 28F, the whole colored region is a region which shows an orientation of crystal planes in which angle fluctuation of orientation of crystal planes of {101} is within ±10°. In addition, each orientation of crystal planes has a different color, so that regions corresponding to the orientations of crystal planes of {211}, {111}, and {101} are separated.

Table 10 shows the orientation ratio of the orientation of crystal planes for each of the observation planes A to C. Note that the values were rounded to the nearest whole number.

TABLE 10

| Observation plane A | {211} 49% |
|---|---|
| Observation plane B | {111} 48% |
| Observation plane C | {101} 57% |

According to Table 10, it is found that, as for the orientations of crystal planes for the observation plane A, the orientation of crystal planes of {211} makes up 49% that is greater than or equal to 40% and less than or equal to 100% within the range of angle fluctuation of ±10°. It is also found that, as for the orientations of crystal planes for the observation plane B, the orientation of crystal planes of {111} makes up 48% that is greater than or equal to 40% and less than or equal to 100%. It is also found that, as for the orientations of crystal planes for the observation plane C, the orientation of crystal planes of {101} makes up 57% that is greater than or equal to 40% and less than or equal to 100%.

As described in this embodiment, the cap film is formed of $SiN_xO_y$ (x<y) and the semiconductor film is irradiated with a laser beam with a scanning rate of 20 cm/sec and laser power of 10.4 W from the cap film side, whereby a crystalline region in which the crystal planes of the observation plane A are oriented along {211} can be formed. In addition, a crystalline region in which the orientation of crystal planes for the observation plane B of {111} makes up 48% that is greater than or equal to 40% and less than or equal to 100%, and a crystalline region in which the orientation of crystal planes for the observation plane C of {101} makes up 57% that is greater than or equal to 40% and less than or equal to 100% can be formed.

Embodiment 7

In this embodiment, orientation ratios of orientations of crystal planes of a crystalline silicon film when crystals in which crystal planes are oriented along {211} for the observation plane A were formed under different conditions from those of Embodiments 5 and 6 will be described with reference to FIGS. 29A to 29F.

First, a manufacturing method of a crystalline silicon film of Embodiment 7 is described. An insulating film and an amorphous semiconductor film were formed over a substrate. The formation steps and formation conditions are similar to those of Embodiment 1.

Next, heating was performed in an electric furnace at 500° C. for 1 hour and then at 550° C. for 4 hours, and then a cap film ($SiN_xO_y$ (x>y)) was formed under the similar conditions to those of Embodiment 1. Then, the amorphous silicon film was irradiated with a laser beam through the cap film by a laser irradiation apparatus to be crystallized, whereby a crystalline silicon film was formed. In this embodiment, the movement speed of the substrate was set to 35 cm/sec. An LD excitation $YVO_4$ laser was used as each of two laser oscillators, and its second harmonic (wavelength: 532 nm) was used for the irradiation. The laser beam had an intensity of 15 W on an irradiated surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 μm×50 μm and the measurement pitch was 0.5 μm. The analysis results of the orientations of crystal planes (the orientations of crystal axes which are perpendicular to respective observation planes) of the crystalline silicon film are shown in FIGS. 29A to 29F.

FIGS. 29A to 29C are orientation map images showing distributions of orientations of crystal planes in the measurement areas. The length of one side of each map image is 50 μm. In addition, FIGS. 29D to 29F each show the calculation result of the orientation of crystal planes of each observation plane, and each orientation of crystal planes is color-coded to be shown. The orientations of crystal planes at the measurement points in FIGS. 29A to 29C are indicated by the colors corresponding to orientations of crystal planes in FIGS. 29D to 29F, respectively.

Note that distinction of crystals is difficult in FIGS. 29A to 29F because of monochrome and display of only lightness; however, in color display, crystals having the orientations of crystal planes of {001}, {111}, and {101} are formed in colored portions in FIGS. 29A to 29C, respectively.

FIGS. 29D to 29F show the results of orientation ratios of the crystals in which crystal planes of the observation planes A to C, respectively, are oriented along {211}, {111}, and {101}. In FIG. 29D, the colored region is a region which shows an orientation of crystal planes in which angle fluctuation of orientation of crystal planes of {211} is within ±10°. In FIG. 29E, the colored region is a region which shows an orientation of crystal planes in which angle fluctuation of orientation of crystal planes of {211} is within ±10°. In FIG. 29F, the colored region is a region which shows an orientation of crystal planes in which angle fluctuation of orientation of crystal planes of {211} is within ±10°. In addition, each orientation of crystal planes has a different color, so that regions corresponding to the orientations of crystal planes of {211}, {1 µl}, and {101} are separated.

Table 11 shows the orientation ratio of the orientation of crystal planes for each of the observation planes A to C. Note that the values were rounded to the nearest whole number.

TABLE 11

| Observation plane A | {211} 42% |
|---|---|
| Observation plane B | {111} 41% |
| Observation plane C | {101} 52% |

According to Table 11, it is found that, as for the orientations of crystal planes for the observation plane A, the orientation of crystal planes of {211} makes up 42% that is greater than or equal to 40% and less than or equal to 100% within the range of angle fluctuation of ±10°. It is also found that, as for the orientations of crystal planes for the observation plane B, the orientation of crystal planes of {111} makes up 41% that is greater than or equal to 40% and less than or equal to 100%. It is also found that, as for the orientations of crystal planes for the observation plane C, the orientation of crystal planes of {101} makes up 52% that is greater than or equal to 40% and less than or equal to 100%.

As described in this embodiment, the cap film is formed of $SiN_xO_y$ (x<y) and the semiconductor film is irradiated with a laser beam with a scanning rate of 35 cm/sec and laser power of 15 W from the cap film side, whereby a crystalline region in which the crystal planes of the observation plane A are oriented along {211} can be formed. In addition, a crystalline region in which the orientation of crystal planes for the observation plane B of {111} makes up 41% that is greater than or equal to 40% and less than or equal to 100%, and a crystalline region in which the orientation of crystal planes for the observation plane C of {101} makes up 52% that is greater than or equal to 40% and less than or equal to 100% can be formed.

Embodiment 8

In this embodiment, orientation ratios of orientations of crystal planes of a crystalline silicon film when crystals in which crystal planes are oriented along {211} for the observation plane A were formed under different conditions from those of Embodiments 5 to 7 will be described with reference to FIGS. 30A to 30F.

First, a manufacturing method of a crystalline silicon film of Embodiment 8 is described. An insulating film, an amorphous semiconductor film, and a cap film ($SiN_xO_y$ (x>y)) were formed over a substrate. The formation steps and formation conditions are similar to those of Embodiment 3.

Next, heating was performed in an electric furnace at 600° C. for 4 hours, and then the amorphous silicon film was irradiated with a laser beam through the cap film by a laser irradiation apparatus to be crystallized, whereby a crystalline silicon film was formed. In this embodiment, the movement speed of the substrate was set to 10 cm/sec. An LD excitation $YVO_4$ laser was used as each of two laser oscillators, and its second harmonic (wavelength: 532 nm) was used for the irradiation. The laser beam had an intensity of 7.2 W on an irradiated surface. Portions of the laser beam, which had nonuniform energy distribution in the Gaussian distribution, were removed by slits, whereby the laser beam on the irradiated surface had a linear shape with a length of about 500 µm and a width of about 20 µm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 µm×50 µm and the measurement pitch was 0.5 µm. The analysis results of the orientations of crystal planes (the orientations of crystal axes which are perpendicular to respective observation planes) of the crystalline silicon film are shown in FIGS. 30A to 30F.

FIGS. 30A to 30C are orientation map images showing distributions of orientations of crystal planes in the measurement areas. In addition, FIGS. 30D to 30F each show the calculation result of the orientation of crystal planes of each observation plane, and each orientation of crystal planes is color-coded to be shown. The orientations of crystal planes at the measurement points in FIGS. 30A to 30C are indicated by the colors corresponding to orientations of crystal planes in FIGS. 30D to 30F, respectively.

Note that distinction of crystals is difficult in FIGS. 30A to 30F because of monochrome and display of only lightness; however, in color display, crystals having the orientations of crystal planes of {211}, {111}, and {101} are formed in colored portions in FIGS. 30A to 30C, respectively.

FIGS. 30D to 30F show the results of the orientation ratios of the crystals in which crystal planes of the observation planes A to C, respectively, are oriented along {211}, {111}, and {101}. In FIG. 30D, the colored region is a region which shows an orientation of crystal planes in which angle fluctuation of orientation of crystal planes of {211} is within ±10°. In FIG. 30E, the colored region is a region which shows an orientation of crystal planes in which angle fluctuation of orientation of crystal planes of {111} is within ±10°. In FIG. 30F, the colored region is a region which shows an orientation of crystal planes in which angle fluctuation of orientation of crystal planes of {101} is within ±10°. In addition, each orientation of crystal planes has a different color, so that regions corresponding to the orientations of crystal planes of {211}, {111}, and {101} are separated.

Table 12 shows the orientation ratio of the orientation of crystal planes for each of the observation planes A to C. Note that the values were rounded to the nearest whole number.

TABLE 12

| Observation plane A | {211} 49% |
|---|---|
| Observation plane B | {111} 48% |
| Observation plane C | {101} 58% |

According to Table 12, it is found that, as for the orientations of crystal planes for the observation plane A, the orientation of crystal planes of {211} makes up 49% that is greater than or equal to 40% within the range of angle fluctuation of ±10°. It is also found that, as for the orientations of crystal planes for the observation plane B, the orientation of crystal planes of {111} makes up 48% that is greater than or equal to 40%. It is also found that, as for the orientations of crystal planes for the observation plane C, the orientation of crystal planes of {101} makes up 58% that is greater than or equal to 40%.

As described in this embodiment, the cap film is formed of $SiN_xO_y$ (x>y) and the semiconductor film is irradiated with a laser beam with a scanning rate of 10 cm/sec and laser power of 7.2 W from the cap film side, whereby a crystalline region in which the crystal planes of the observation plane A are oriented along {211} can be formed. In addition, a crystalline region in which the orientation of crystal planes for the observation plane B of {111} makes up 48% that is greater than or equal to 40% and less than or equal to 100%, and a crystalline region in which the orientation of crystal planes for the observation plane C of {101} makes up 58% that is greater than or equal to 40% and less than or equal to 100% can be formed.

Embodiment 9

In this embodiment, orientation ratios of orientations of crystal planes of a crystalline silicon film when crystals in which crystal planes are oriented along {211} for the observation plane A were formed under different conditions from those of Embodiments 5 to 8 will be described with reference to FIGS. 31A to 31F.

First, a manufacturing method of a crystalline silicon film of Embodiment 9 is described. An insulating film and an amorphous semiconductor film were formed over a substrate. The formation steps and formation conditions are similar to those of Embodiment 1.

Next, heating was performed in an electric furnace at 500° C. for 1 hour, and then a cap film ($SiN_xO_y$ (x>y)) was formed under the similar conditions to those of Embodiment 3. Then, the amorphous silicon film was irradiated with a laser beam through the cap film by a laser irradiation apparatus to be crystallized, whereby a crystalline silicon film was formed. In this embodiment, the movement speed of the substrate was set to 20 cm/sec. An LD excitation $YVO_4$ laser was used as each of two laser oscillators, and its second harmonic (wavelength: 532 nm) was used for the irradiation. The laser beam had an intensity of 10.8 W on an irradiated surface. Portions of the laser beam, which had nonuniform energy distribution in the Gaussian distribution, were removed by slits, whereby the laser beam on the irradiated surface had a linear shape with a length of about 500 µm and a width of about 20 µm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 µm×50 µm and the measurement pitch was 0.5 µm. The analysis results of the orientations of crystal planes (the orientations of crystal axes which are perpendicular to respective observation planes) of the crystalline silicon film are shown in FIGS. 31A to 31F.

FIGS. 31A to 31C are orientation map images showing distributions of orientations of crystal planes in the measurement areas. In addition, FIGS. 31D to 31F each show the calculation result of the orientation of crystal planes of each observation plane, and each orientation of crystal planes is color-coded to be shown. The orientations of crystal planes at the measurement points in FIGS. 31A to 31C are indicated by the colors corresponding to orientations of crystal planes in FIGS. 31D to 31F, respectively.

Note that distinction of crystals is difficult in FIGS. 31A to 31F because of monochrome and display of only lightness; however, in color display, a crystalline silicon film in which crystal planes are oriented along {211} in a colored portion in FIG. 31A is formed, a crystalline silicon film in which crystal planes are oriented along {111} in a colored portion in FIG. 31B is formed, and a crystalline silicon film in which crystal planes are oriented along {101} in a colored region in FIG. 31C is formed.

FIG. 31D shows the result of orientation ratio of a crystal in which crystal planes of the observation plane A are oriented along {211}. FIG. 31E shows the result of orientation ratio of a crystal in which crystal planes of the observation plane B are oriented along {111}. FIG. 31F shows the result of orientation ratio of a crystal in which crystal planes of the observation plane C are oriented along {101}. In FIG. 31D, the whole colored region is a region which shows an orientation of crystal planes in which angle fluctuation of orientation of crystal planes of {211} is within ±10°. In FIG. 30E, the whole colored region is a region which shows an orientation of crystal planes in which angle fluctuation of orientation of crystal planes of {111} is within ±10°. In FIG. 30F, the whole colored region is a region which shows an orientation of crystal planes in which angle fluctuation of orientation of crystal planes of {101} is within ±10°. In addition, each orientation of crystal planes has a different color, so that regions corresponding to the orientations of crystal planes of {211}, {111}, and {101} are separated Table 13 shows the orientation ratio of the orientation of crystal planes for each of the observation planes A to C. Note that the values were rounded to the nearest whole number.

TABLE 13

| Observation plane A | {211} 49% |
|---|---|
| Observation plane B | {111} 47% |
| Observation plane C | {101} 60% |

According to Table 4, it is found that, as for the orientations of crystal planes for the observation plane A, the orientation of crystal planes of {211} makes up 49% that is greater than or equal to 40% within the range of angle fluctuation of ±10°. It is also found that, as for the orientations of crystal planes for the observation plane B, the orientation of crystal planes of {111} makes up 47% that is greater than or equal to 40%. It is also found that, as for the orientations of crystal planes for the observation plane C, the orientation of crystal planes of {101} makes up 60% that is greater than or equal to 40%.

As described in this embodiment, the cap film is formed of $SiN_xO_y$ (x>y) and the semiconductor film is irradiated with a laser beam with a scanning rate of 20 cm/sec and laser power of 10.8 W from the cap film side, whereby a crystalline region in which the crystal planes of the observation plane A are oriented along {211} can be formed. In addition, a crystalline region in which the orientation of crystal planes for the observation plane B of {111} makes up 47% that is greater than or equal to 40% and less than or equal to 100%, and a crystalline region in which the orientation of crystal planes for the observation plane C of {101} makes up 60% that is greater than or equal to 40% and less than or equal to 100% can be formed.

Embodiment 10

In this embodiment, orientation ratios of orientations of crystal planes of a crystalline silicon film when crystals in which crystal planes are oriented along {101} for the observation plane A were formed will be described with reference to FIGS. 32A to 32F.

First, a manufacturing method of a crystalline silicon film of Embodiment 10 is described. An insulating film, an amorphous semiconductor film, and a cap film ($SiN_xO_y$ (x<y)) were formed over a substrate. The formation steps and formation conditions are similar to those of Embodiment 1.

Next, heating was performed in an electric furnace at 600° C. for 4 hours, and then the amorphous silicon film was irradiated with a laser beam through the cap film by a laser irradiation apparatus to be crystallized, whereby a crystalline silicon film was formed. In this embodiment, the movement speed of the substrate was set to 70 cm/sec. An LD excitation $YVO_4$ laser was used as each of two laser oscillators, and its second harmonic (wavelength: 532 nm) was used for the irradiation. The laser beam had an intensity of 28 W on the irradiation surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 μm×50 μm and the measurement pitch was 0.5 μm. The analysis results of the orientations of crystal planes (the orientations of crystal axes which are perpendicular to respective observation planes) of the crystalline silicon film are shown in FIGS. 32A to 32F.

FIGS. 32A to 32C are orientation map images showing distributions of orientations of crystal planes in the measurement areas. In addition, FIGS. 32D to 32F each show the calculation result of the orientation of crystal planes of each observation plane, and each orientation of crystal planes is color-coded to be shown. The orientations of crystal planes at the measurement points in FIGS. 32A to 32C are indicated by the colors corresponding to orientations of crystal planes in FIGS. 32D to 32F, respectively.

Note that distinction of crystals is difficult in FIGS. 32A to 32F because of monochrome and display of only lightness; however, in color display, crystals having the orientation of crystal planes of {101} are formed in colored portions in FIGS. 32A and 32B. Crystals having the orientation of crystal planes of {001} are formed in a colored portion in FIG. 32C.

FIGS. 32D and 32E show the results of orientation ratios of the crystals in which crystal planes for the observation planes A and B are oriented along {101}. FIG. 32F shows the result of orientation ratio of the crystal in which crystal planes for the observation plane C are oriented along {001}. In each of FIGS. 32D and 32E, the whole colored region is a region which shows an orientation of crystal planes in which angle fluctuation of orientation of crystal planes of {101} is within ±20°. In FIG. 32F, the whole colored region is a region which shows an orientation of crystal planes in which angle fluctuation of orientation of crystal planes of {001} is within ±20°.

Table 14 shows the orientation ratio of the orientation of crystal planes for each of the observation planes A to C. Note that the values were rounded to the nearest whole number.

TABLE 14

| Observation plane A | {101} 54% |
|---|---|
| Observation plane B | {101} 45% |
| Observation plane C | {001} 51% |

According to Table 14, it is found that, as for the orientations of crystal planes for the observation plane A, the orientation of crystal planes of {101} makes up 54% that is greater than or equal to 40% within the range of angle fluctuation of ±20°. It is also found that, as for the orientations of crystal planes for the observation plane B, the orientation of crystal planes of {101} makes up 45% that is greater than or equal to 40%. It is also found that, as for the orientations of crystal planes for the observation plane C, the orientation of crystal planes of {001} makes up 51% that is greater than or equal to 40%.

As described in this embodiment, the cap film is formed of $SiN_xO_y$ (x<y) and the semiconductor film is irradiated with a laser beam with a scanning rate of 70 cm/sec and laser power of 28 W from the cap film side, whereby a crystalline region in which the crystal planes of the observation plane A are oriented along {101} can be formed. In addition, a crystalline region in which the orientation of crystal planes for the observation plane B of {101} makes up 45% that is greater than or equal to 40% and less than or equal to 100%, and a crystalline region in which the orientation of crystal planes for the observation plane C of {001} makes up 51% that is greater than or equal to 40% and less than or equal to 100% can be formed.

Embodiment 11

In this embodiment, orientation ratios of orientations of crystal planes of a crystalline silicon film when crystals in which crystal planes are oriented along {101} for the observation plane A were formed under different conditions from those of Embodiment 10 will be described with reference to FIGS. 33A to 33F.

First, a manufacturing method of a crystalline silicon film of Embodiment 11 is described. An insulating films an amorphous semiconductor film, and a cap film ($SiN_xO_y$ (x<y)) were formed over a substrate. The formation steps and formation conditions are similar to those of Embodiment 1.

Next, heating was performed in an electric furnace at 600° C. for 4 hours, and then the amorphous silicon film is irradiated with a laser beam through the cap film by a laser irradiation apparatus to be crystallized, whereby a crystalline silicon film was formed. In this embodiment, the movement speed of the substrate was set to 90 cm/sec. An LD excitation $YVO_4$ laser was used as each of two laser oscillators, and its second harmonic (wavelength: 532 nm) was used for the irradiation. The laser beam had an intensity of 28 W on an irradiated surface. Portions of the laser beam, which had nonuniform energy distribution in the Gaussian distribution, were removed by slits, whereby the laser beam on the irradiated surface had a linear shape with a length of about 500 µm and a width of about 20 µm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 µm×50 µm and the measurement pitch was 0.5 µm. The analysis results of the orientations of crystal planes (the orientations of crystal axes which are perpendicular to respective observation planes) of the crystalline silicon film are shown in FIGS. 33A to 33F.

FIGS. 33A to 33C are orientation map images showing distributions of orientations of crystal planes in the measurement areas. In addition, FIGS. 33D to 33F each show the calculation result of the orientation of crystal planes of each observation plane, and each orientation of crystal planes is color-coded to be shown. The orientations of crystal planes at the measurement points in FIGS. 33A to 33C are indicated by the colors corresponding to orientations of crystal planes in FIGS. 33D to 33F, respectively.

Note that distinction of crystals is difficult in FIGS. 33A to 33F because of monochrome and display of only lightness; however, in color display, crystals having the orientation of crystal planes of {101} are formed in colored portions in FIGS. 32A and 32B. Crystals having the orientation of crystal planes of {001} are formed in a colored portion in FIG. 32C.

FIGS. 33D and 33E show the results of orientation ratios of the crystals in which crystal planes for the observation planes A and B are oriented along {101}. FIG. 33F shows the result of orientation ratio of the crystal in which crystal planes for the observation plane C are oriented along {001}. In each of FIGS. 33D and 33E, the whole colored region is a region which shows an orientation of crystal planes in which angle fluctuation of orientation of crystal planes of {101} is within ±20°. In FIG. 33F, the whole colored region is a region which shows an orientation of crystal planes in which angle fluctuation of orientation of crystal planes of {001} is within ±20°.

Table 15 shows the orientation ratio of the orientation of crystal planes for each of the observation planes A to C. Note that the values were rounded to the nearest whole number.

TABLE 15

| Observation plane A | {101} 50% |
|---|---|
| Observation plane B | {101} 42% |
| Observation plane C | {001} 48% |

According to Table 15, it is found that, as for the orientations of crystal planes for the observation plane A, the orientation of crystal planes of {101} makes up 50% that is greater than or equal to 40% within the range of angle fluctuation of ±20°. It is also found that, as for the orientations of crystal planes for the observation plane B, the orientation of crystal planes of {101} makes up 42% that is greater than or equal to 40%. It is also found that, as for the orientations of crystal planes for the observation plane C, the orientation of crystal planes of {001} makes up 48% that is greater than or equal to 40%.

As described in this embodiment, the cap film is formed of $SiN_xO_y$ (x<y) and the semiconductor film is irradiated with a laser beam with a scanning rate of 90 cm/sec and laser power of 28 W from the cap film side, whereby a crystalline region in which the crystal planes of the observation plane A are oriented along {101} can be formed. In addition, a crystalline region in which the orientation of crystal planes for the observation plane B of {101} makes up 42% that is greater than or equal to 40% and less than or equal to 100%, and a crystalline region in which the orientation of crystal planes for the observation plane C of {001} makes up 48% that is greater than or equal to 48% and less than or equal to 100% can be formed.

Embodiment 12

In this embodiment, orientation ratios of orientations of crystal planes of a crystalline silicon film when crystals in which crystal planes are oriented along {101} for the observation plane A were formed under different conditions from those of Embodiments 10 and 11 will be described with reference to FIGS. 34A to 34F.

First, a manufacturing method of a crystalline silicon film of Embodiment 12 is described. An insulating film and an amorphous semiconductor film were formed over a substrate. The formation steps and formation conditions are similar to those of Embodiment 1.

Next, heating was performed in an electric furnace at 500° C. for 1 hour and then at 550° C. for 4 hours, and then an oxide film on a surface of the amorphous semiconductor film was removed with hydrofluoric acid. Next, a cap film ($SiN_xO_y$ (x>y)) was formed under the similar conditions to those of Embodiment 3, and heating was performed at 500° C. for 1 hour, and then the amorphous silicon film was irradiated with a laser beam through the cap film by a laser irradiation apparatus to be crystallized, whereby a crystalline silicon film was formed. In this embodiment, the movement speed of the substrate was set to 70 cm/sec. An LD excitation $YVO_4$ laser was used as each of two laser oscillators, and its second harmonic (wavelength: 532 nm) was used for the irradiation. The laser beam had an intensity of 20 W on an irradiated surface. Portions of the laser beam, which had nonuniform energy distribution in the Gaussian distribution, were removed by slits, whereby the laser beam on the irradiated surface had a linear shape with a length of about 500 µm and a width of about 20 µm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 µm×50 µm and the measurement pitch was 0.5 µm. The analysis results of the orientations of crystal planes (the orientations of crystal axes which are perpendicular to respective observation planes) of the crystalline silicon film are shown in FIGS. 34A to 34F.

FIGS. 34A to 34C are orientation map images showing distributions of orientations of crystal planes in the measurement areas. In addition, FIGS. 34D to 34F each show the calculation result of the orientation of crystal planes of each observation plane, and each orientation of crystal planes is color-coded to be shown. The orientations of crystal planes at the measurement points in FIGS. 34A to 34C are indicated by the colors corresponding to orientations of crystal planes in FIGS. 34D to 34F, respectively.

Note that distinction of crystals is difficult in FIGS. 34A to 34F because of monochrome and display of only lightness; however, in color display, crystals having the orientation of crystal planes of {101} are formed in colored portions in FIGS. 34A and 34B. Crystals having the orientation of crystal planes of {001} are formed in a colored portion in FIG. 34C.

FIGS. 34D and 34E show the results of orientation ratios of the crystals in which crystal planes for the observation planes A and B are oriented along {101}. FIG. 34F shows the result of orientation ratio of the crystal in which crystal planes for the observation plane C are oriented along {001}. In each of FIGS. 34D and 34E, the whole colored region is a region which shows an orientation of crystal planes in which angle fluctuation of orientation of crystal planes of {101} is within ±20°. In FIG. 34F, the whole colored region is a region which shows an orientation of crystal planes in which angle fluctuation of orientation of crystal planes of {001} is within ±20°.

Table 16 shows the orientation ratio of the orientation of crystal planes for each of the observation planes A to C. Note that the values were rounded to the nearest whole number.

TABLE 16

| Observation plane A | {101} 49% |
|---|---|
| Observation plane B | {101} 47% |
| Observation plane C | {001} 55% |

According to Table 16, it is found that, as for the orientations of crystal planes for the observation plane A, the orientation of crystal planes of {101} makes up 49% that is greater than or equal to 40% within the range of angle fluctuation of ±20°. It is also found that, as for the orientations of crystal planes for the observation plane B, the orientation of crystal planes of {101} makes up 47% that is greater than or equal to 40%. It is also found that, as for the orientations of crystal planes for the observation plane C, the orientation of crystal planes of {001} makes up 55% that is greater than or equal to 40%.

As described in this embodiment, the cap film is formed of $SiN_xO_y$ (x>y) and the semiconductor film is irradiated with a laser beam with a scanning rate of 70 cm/sec and laser power of 20 W from the cap film side, whereby a crystalline region in which the crystal planes of the observation plane A are oriented along {101} can be formed. In addition, a crystalline region in which the orientation of crystal planes for the observation plane B of {101} makes up 47% that is greater than or equal to 40% and less than or equal to 100%, and a crystalline region in which the orientation of crystal planes for the observation plane C of {001} makes up 55% that is greater than or equal to 40% and less than or equal to 100% can be formed.

Embodiment 13

In this embodiment, orientation ratios of orientations of crystal planes of a crystalline silicon film when a crystal in which crystal planes are oriented along {101} for the observation plane A was formed under different conditions from those of Embodiments 10 to 12 will be described with reference to FIGS. 35A to 35F.

First, a manufacturing method of a crystalline silicon film of Embodiment 13 is described. An insulating film and an amorphous semiconductor film were formed over a substrate. The formation steps and formation conditions are similar to those of Embodiment 1.

Next, heating was performed in an electric furnace at 500° C. for 1 hour, and then an oxide film on a surface of the amorphous semiconductor film was removed with hydrofluoric acid, and then an oxide film was formed over the amorphous semiconductor film with a solution containing ozone. Next, a cap film ($SiN_xO_y$ (x>y)) was formed under the similar conditions to those of Embodiment 3, and heating was performed at 500° C. for 1 hour and then at 550° C. for 4 hours, and then the amorphous silicon film was irradiated with a laser beam through the cap film 103 by a laser irradiation apparatus to be crystallized, whereby a crystalline silicon film was formed. In this embodiment, the movement speed of the substrate was set to 90 cm/sec. An LD excitation $YVO_4$ laser was used as each of two laser oscillators, and its second harmonic (wavelength: 532 nm) was used for the irradiation. The laser beam had an intensity of 28 W on an irradiated surface. Portions of the laser beam, which had nonuniform energy distribution in the Gaussian distribution, were removed by slits, whereby the laser beam on the irradiated surface had a linear shape with a length of about 500 μm and a width of about 20 μm.

After the cap film was etched, EBSP measurement was performed under the similar conditions to those of Embodiment 1 in order to check the position and size of crystal grains of the crystalline silicon film and the orientation of crystal planes.

EBSP images on three observation planes A to C which are orthogonal to one another as shown in FIG. 8 were measured under the conditions that the measurement area was 50 μm×50 μm and the measurement pitch was 0.5 μm. The analysis results of the orientations of crystal planes (the orientations of crystal axes which are perpendicular to respective observation planes) of the crystalline silicon film are shown in FIGS. 35A to 35F.

FIGS. 35A to 35C are orientation map images showing distributions of orientations of crystal planes in the measurement areas. In addition, FIGS. 35D to 35F each show the calculation result of the orientation of crystal planes of each observation plane, and each orientation of crystal planes is color-coded to be shown. The orientations of crystal planes at the measurement points in FIGS. 35A to 35C are indicated by the colors corresponding to orientations of crystal planes in FIGS. 35D to 35F, respectively.

Note that distinction of crystals is difficult in FIGS. 35A to 35F because of monochrome and display of only lightness; however, in color display, crystals having the orientation of crystal planes of {101} are formed in colored portions in FIGS. 35A and 35B. Crystals having the orientation of crystal planes of {001} are formed in a colored portion in FIG. 35C.

FIGS. 35D and 35E show the results of orientation ratios of the crystals in which crystal planes for the observation planes A and B are oriented along {101}. FIG. 35F shows the result of orientation ratio of the crystal in which crystal planes for the observation plane C are oriented along {001}. In each of FIGS. 35D and 35E, the whole colored region is a region which shows an orientation of crystal planes in which angle fluctuation of orientation of crystal planes of {101} is within ±20°. In FIG. 35F, the whole colored region is a region which shows an orientation of crystal planes in which angle fluctuation of orientation of crystal planes of {001} is within ±20°.

Table 17 shows the orientation ratio of the orientation of crystal planes for each of the observation planes A to C. Note that the values were rounded to the nearest whole number.

TABLE 17

| | |
|---|---|
| Observation plane A | {101} 58% |
| Observation plane B | {101} 56% |
| Observation plane C | {001} 66% |

According to Table 17, it is found that, as for the orientations of crystal planes for the observation plane A, the orientation of crystal planes of {101} makes up 58% that is greater than or equal to 40% within the range of angle fluctuation of ±20°. It is also found that, as for the orientations of crystal planes for the observation plane B, the orientation of crystal planes of {101} makes up 56% that is greater than or equal to 40%. It is also found that, as for the orientations of crystal planes for the observation plane C, the orientation of crystal planes of {001} makes up 66% that is greater than or equal to 40%.

As described in this embodiment, the cap film is formed of $SiN_xO_y$ (x>y) and the semiconductor film is irradiated with a laser beam with a scanning rate of 90 cm/sec and laser power of 28 W from the cap film side, whereby a crystalline region in which the crystal planes of the observation plane A are oriented along {101} can be formed. In addition, a crystalline region in which the orientation of crystal planes for the observation plane B of {001} makes up 56% that is greater than or equal to 40% and less than or equal to 100%, and a crystalline region in which the orientation of crystal planes for the observation plane C of {001} makes up 66% that is greater than or equal to 40% and less than or equal to 100% can be formed.

This application is based on Japanese Patent Application serial no. 2007-052230 filed with Japan Patent Office on Mar. 2, 2007, the entire contents of which are hereby incorporated by reference.

What is claimed is:

1. A method for manufacturing a semiconductor device, comprising the steps of:
    forming an amorphous semiconductor film over an insulating substrate;
    forming a cap film over a first amorphous region and a second amorphous region in the amorphous semiconductor film;
    forming a first crystalline region after the step of forming the cap film, by irradiating a first continuous-wave laser beam or a first pulsed laser beam with a repetition rate of greater than or equal to 10 MHz to the first amorphous region; and
    forming a second crystalline region after the step of forming the cap film, by irradiating a second continuous-wave laser beam or a second pulsed laser beam with a repetition rate of greater than or equal to 10 MHz to the second amorphous region,
    wherein a first orientation of crystal planes parallel to a surface of the first crystalline region is oriented along {001} in greater than or equal to 40% and less than or equal to 100% of first crystal grains in the first crystalline region, and
    wherein a second orientation of crystal planes parallel to a surface of the second crystalline region is oriented along {211} or {101} in greater than or equal to 40% and less than or equal to 100% of second crystal grains in the second crystalline region.

2. The method for manufacturing a semiconductor device according to claim 1,
    wherein the cap film is formed of $SiN_xO_y$ (0≦x≦1.5, 0≦y≦2, 0≦4x+3y≦6).

3. The method for manufacturing a semiconductor device according to claim 1,
    wherein a thickness of the cap film is greater than or equal to 200 nm and less than or equal to 1000 nm.

4. The method for manufacturing a semiconductor device according to claim 1, further comprising the step of:
    heating the amorphous semiconductor film before the step of forming the cap film.

5. The method for manufacturing a semiconductor device according to claim 1, further comprising the step of:
    adding an element to the amorphous semiconductor film before the step of forming the cap film;
    wherein the element is one selected from the group consisted of nickel, palladium, germanium, iron, tin, lead, cobalt, platinum, copper, and gold.

6. A method for manufacturing a semiconductor device, comprising the steps of:
    forming an amorphous semiconductor film over an insulating substrate;
    forming a first cap film over a first amorphous region in the amorphous semiconductor film;
    forming a second cap film over a second amorphous region in the amorphous semiconductor film;
    forming a first crystalline region after the step of forming the first cap film, by irradiating a first continuous-wave laser beam or a first pulsed laser beam with a repetition rate of greater than or equal to 10 MHz to the first amorphous region; and
    forming a second crystalline region after the step of forming the second cap film, by irradiating a second continuous-wave laser beam or a second pulsed laser beam with a repetition rate of greater than or equal to 10 MHz to the second amorphous region,
    wherein a first orientation of crystal planes parallel to a surface of the first crystalline region is oriented along {001} in greater than or equal to 40% and less than or equal to 100% of first crystal grains in the first crystalline region, and
    wherein a second orientation of crystal planes parallel to a surface of the second crystalline region is oriented along {211} or {101} in greater than or equal to 40% and less than or equal to 100% of second crystal grains in the second crystalline region.

7. The method for manufacturing a semiconductor device according to claim 6,
    wherein at least one of the first cap film and the second cap film is formed of $SiN_xO_y$ (0≦x≦1.5, 0≦y≦2, 0≦4x+3y≦6).

8. The method for manufacturing a semiconductor device according to claim 6,
    wherein a thickness of at least one of the first cap film and the second cap film is greater than or equal to 200 nm and less than or equal to 1000 nm.

9. The method for manufacturing a semiconductor device according to claim 6, further comprising the step of:
    heating the amorphous semiconductor film before the step of forming at least one of the first cap film and the second cap film.

10. The method for manufacturing a semiconductor device according to claim 6, further comprising the step of:
    adding an element to the amorphous semiconductor film before the step of forming at least one of the first cap film and the second cap film;

wherein the element is one selected from the group consisted of nickel, palladium, germanium, iron, tin, lead, cobalt, platinum, copper, and gold.

11. A method for manufacturing a semiconductor device, comprising the steps of:
forming an amorphous semiconductor film over an insulating substrate;
forming a cap film over a first amorphous region and a second amorphous region in the amorphous semiconductor film;
forming a first crystalline region after the step of forming the cap film, by irradiating a first continuous-wave laser beam or a first pulsed laser beam with a repetition rate of greater than or equal to 10 MHz to the first amorphous region;
forming a second crystalline region after the step of forming the cap film, by irradiating a second continuous-wave laser beam or a second pulsed laser beam with a repetition rate of greater than or equal to 10 MHz t-o the second amorphous region,
forming an n-channel thin film transistor by using the first crystalline region as a first channel region of the n-channel thin film transistor, and
forming an p-channel thin film transistor by using the second crystalline region as a second channel region of the p-channel thin film transistor,
wherein a first orientation of crystal planes parallel to a surface of the first crystalline region is oriented along {001} in greater than or equal to 40% and less than or equal to 100% of first crystal grains in the first crystalline region, and
wherein a second orientation of crystal planes parallel to a surface of the second crystalline region is oriented along {211} or {101} in greater than or equal to 40% and less than or equal to 100% of second crystal grains in the second crystalline region.

12. The method for manufacturing a semiconductor device according to claim 11,
wherein the cap film is formed of $SiN_xO_y$ ($0 \leq x \leq 1.5$, $0 \leq y \leq 2$, $0 \leq 4x+3y \leq 6$).

13. The method for manufacturing a semiconductor device according to claim 11,
wherein a thickness of the cap film is greater than or equal to 200 nm and less than or equal to 1000 nm.

14. The method for manufacturing a semiconductor device according to claim 11, further comprising the step of:
heating the amorphous semiconductor film before the step of forming the cap film.

15. The method for manufacturing a semiconductor device according to claim 11, further comprising the step of:
adding an element to the amorphous semiconductor film before the step of forming the cap film;
wherein the element is one selected from the group consisted of nickel, palladium, germanium, iron, tin, lead, cobalt, platinum, copper, and gold.

16. A method for manufacturing a semiconductor device, comprising the steps of:
forming an amorphous semiconductor film over an insulating substrate;
forming a first cap film over a first amorphous region in the amorphous semiconductor film;
forming a second cap film over a second amorphous region in the amorphous semiconductor film;
forming a first crystalline region after the step of forming the first cap film, by irradiating a first continuous-wave laser beam or a first pulsed laser beam with a repetition rate of greater than or equal to 10 MHz to the first amorphous region;
forming a second crystalline region after the step of forming the second cap film, by irradiating a second continuous-wave laser beam or a second pulsed laser beam with a repetition rate of greater than or equal to 10 MHz to the second amorphous region,
forming an n-channel thin film transistor by using the first crystalline region as a first channel region of the n-channel thin film transistor, and
forming an p-channel thin film transistor by using the second crystalline region as a second channel region of the p-channel thin film transistor,
wherein a first orientation of crystal planes parallel to a surface of the first crystalline region is oriented along {001} in greater than or equal to 40% and less than or equal to 100% of first crystal grains in the first crystalline region, and
wherein a second orientation of crystal planes parallel to a surface of the second crystalline region is oriented along {211} or {101} in greater than or equal to 40% and less than or equal to 100% of second crystal grains in the second crystalline region.

17. The method for manufacturing a semiconductor device according to claim 16,
wherein at least one of the first cap film and the second cap film is formed of $SiN_xO_y$ ($0 \leq x \leq 1.5$, $0 \leq y \leq 2$, $0 \leq 4x+3y \leq 6$).

18. The method for manufacturing a semiconductor device according to claim 16,
wherein a thickness of at least one of the first cap film and the second cap film is greater than or equal to 200 nm and less than or equal to 1000 nm.

19. The method for manufacturing a semiconductor device according to claim 16, further comprising the step of:
heating the amorphous semiconductor film before the step of forming at least one of the first cap film and the second cap film.

20. The method for manufacturing a semiconductor device according to claim 16, further comprising the step of:
adding an element to the amorphous semiconductor film before the step of forming at least one of the first cap film and the second cap film;
wherein the element is one selected from the group consisted of nickel, palladium, germanium, iron, tin, lead, cobalt, platinum, copper, and gold.

21. A method for manufacturing a semiconductor device, comprising the steps of:
forming an amorphous semiconductor film over an insulating substrate;
forming a first cap film over a first amorphous region in the amorphous semiconductor film;
forming a second cap film over a second amorphous region in the amorphous semiconductor film;
forming a first crystalline region after the step of forming the first cap film, by irradiating a first continuous-wave laser beam or a first pulsed laser beam with a repetition rate of greater than or equal to 10 MHz to the first amorphous region;
forming a second crystalline region after the step of forming the second cap film, by irradiating a second continuous-wave laser beam or a second pulsed laser beam with a repetition rate of greater than or equal to 10 MHz to the second amorphous region, forming an n-channel thin film transistor by using the first crystalline region as a first channel region of the n-channel thin film transistor, and forming an p-channel thin film transistor by using the second crystalline region as a second channel region of the p-channel thin film transistor, wherein the first cap film is formed of $SiN_xO_y$ (x>y), wherein the second cap film is formed of $SiN_xO_y$ (x<y), wherein a first orientation of crystal planes parallel to a surface of the first crystalline region is oriented along {001} in greater than or equal to 40% and less than or equal to 100% of first crystal grains in the first crystalline region, and wherein a second orientation of crystal planes parallel to a surface of the second crystalline region is oriented along {211} or {101} in greater than or equal to 40% and less than or equal to 100% of second crystal grains in the second crystalline region.

22. The method for manufacturing a semiconductor device according to claim 21, wherein at least one of the first cap film and the second cap film is formed of $SiN_xO_y$ ($0 \leq x \leq 1.5$, $0 \leq y \leq 2$, $0 \leq 4x+3y \leq 6$).

23. The method for manufacturing a semiconductor device according to claim 21, wherein a thickness of at least one of the first cap film and the second cap film is greater than or equal to 200 nm and less than or equal to 1000 nm.

24. The method for manufacturing a semiconductor device according to claim 21, further comprising the step of:

heating the amorphous semiconductor film before the step of forming at least one of the first cap film and the second cap film.

25. The method for manufacturing a semiconductor device according to claim 21, further comprising the step of:

adding an element to the amorphous semiconductor film before the step of forming at least one of the first cap film and the second cap film;

wherein the element is one selected from the group consisted of nickel, palladium, germanium, iron, tin, lead, cobalt, platinum, copper, and gold.

\* \* \* \* \*

UNITED STATES PATENT AND TRADEMARK OFFICE
CERTIFICATE OF CORRECTION

PATENT NO. : 7,972,943 B2  
APPLICATION NO. : 12/034677  
DATED : July 5, 2011  
INVENTOR(S) : Tomoaki Moriwaka Page 1 of 1

It is certified that error appears in the above-identified patent and that said Letters Patent is hereby corrected as shown below:

column 3, line 67, "{101}" should read "{001}"

column 6, line 57, "$0 \leq x \leq 0.1$" should read "$0 < x < 0.1$"

column 9, lines 26, "an JO" should read "an"

column 18, line 20, "Surface" should read "surface"

column 73, line 20, claim 11, "t-o" should read "to"

Signed and Sealed this  
Twentieth Day of September, 2011

David J. Kappos  
*Director of the United States Patent and Trademark Office*